US011177325B2

(12) United States Patent
Watabe et al.

(10) Patent No.: US 11,177,325 B2
(45) Date of Patent: *Nov. 16, 2021

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Atsugi (JP)

(72) Inventors: Takeyoshi Watabe, Kanagawa (JP); Satomi Mitsumori, Kanagawa (JP); Nobuharu Ohsawa, Kanagawa (JP); Harue Osaka, Kanagawa (JP); Kunihiko Suzuki, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 306 days.

This patent is subject to a terminal disclaimer.

(21) Appl. No.: 16/139,126

(22) Filed: Sep. 24, 2018

(65) Prior Publication Data

US 2019/0027542 A1 Jan. 24, 2019

Related U.S. Application Data

(63) Continuation of application No. 15/483,049, filed on Apr. 10, 2017, now Pat. No. 10,096,658.

(30) Foreign Application Priority Data

Apr. 22, 2016 (JP) .................................. 2016-086542

(51) Int. Cl.
*H01L 51/50* (2006.01)
*H01L 27/32* (2006.01)
*H01L 51/00* (2006.01)

(52) U.S. Cl.
CPC ........ *H01L 27/3213* (2013.01); *H01L 27/322* (2013.01); *H01L 51/5004* (2013.01);
(Continued)

(58) Field of Classification Search
CPC ..... H01L 27/32; H01L 27/321; H01L 27/322; H01L 27/3213; H01L 51/50; H01L 51/5004; H01L 51/5016
(Continued)

(56) References Cited

U.S. PATENT DOCUMENTS 6,863,997 B2 3/2005 Thompson et al.
6,869,695 B2 3/2005 Thompson et al.
(Continued)

FOREIGN PATENT DOCUMENTS

CN 103518268 A 1/2014
CN 103764650 A 4/2014
(Continued)

OTHER PUBLICATIONS

Su.S et al., "A host material with a small singlet-triplet exchange energy for phosphorescent organic light-emitting diodes: Guest, host, and exciplex emission", Organic Electronics, Jun. 21, 2012, vol. 13, No. 10, pp. 1937-1947.

(Continued)

*Primary Examiner* — Fazli Erdem
(74) *Attorney, Agent, or Firm* — Fish & Richardson P.C.

(57) ABSTRACT

Providing a light-emitting element emitting light in a broad emission spectrum. A combination of a first organic compound and a second organic compound forms an exciplex. The first organic compound has a function of converting triplet-excitation energy into light emission. The lowest triplet excitation level of the second organic compound is higher than or equal to the lowest triplet excitation level of the first organic compound, and the lowest triplet excitation (Continued)

level of the first organic compound is higher than or equal to the lowest triplet excitation level of the exciplex. Light emission from a light-emitting layer includes light emission from the first organic compound and light emission from the exciplex.

20 Claims, 45 Drawing Sheets

(52) U.S. Cl.
CPC ........ *H01L 51/5016* (2013.01); *H01L 27/323* (2013.01); *H01L 27/3244* (2013.01); *H01L 27/3281* (2013.01); *H01L 51/0085* (2013.01); *H01L 51/5056* (2013.01); *H01L 51/5072* (2013.01); *H01L 51/5088* (2013.01); *H01L 51/5092* (2013.01)

(58) Field of Classification Search
USPC ........................................................ 257/40
See application file for complete search history.

(56) References Cited

U.S. PATENT DOCUMENTS

| | | | |
|---|---|---|---|
| 6,951,694 | B2 | 10/2005 | Thompson et al. |
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,553,557 | B2 | 6/2009 | Thompson et al. |
| 7,597,967 | B2 | 10/2009 | Kondakova et al. |
| 7,993,760 | B2 | 8/2011 | Komori et al. |
| 8,034,465 | B2 | 10/2011 | Liao et al. |
| 8,143,613 | B2 | 3/2012 | Forrest |
| 8,274,214 | B2 | 9/2012 | Ikeda et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,082,994 | B2 | 7/2015 | Watabe et al. |
| 9,159,942 | B2 | 10/2015 | Seo et al. |
| 9,175,213 | B2 | 11/2015 | Seo et al. |
| 9,269,920 | B2 | 2/2016 | Yamazaki et al. |
| 9,356,250 | B2 | 5/2016 | Ohsawa et al. |
| 9,391,290 | B2 | 7/2016 | Watabe et al. |
| 9,461,259 | B2 | 10/2016 | Watabe et al. |
| 9,538,607 | B2 | 1/2017 | Shitagaki et al. |
| 9,604,928 | B2 | 3/2017 | Shitagaki et al. |
| 9,604,972 | B2 | 3/2017 | Yoshida et al. |
| 9,640,774 | B2 | 5/2017 | Lee et al. |
| 9,911,936 | B2* | 3/2018 | Seo ................. H01L 51/5016 |
| 10,096,658 | B2* | 10/2018 | Watabe ........... H01L 51/5016 |
| 10,439,156 | B2 | 10/2019 | Shitagaki et al. |
| 2003/0175553 | A1 | 9/2003 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2007/0087219 | A1 | 4/2007 | Ren et al. |
| 2007/0090756 | A1 | 4/2007 | Okada et al. |
| 2008/0261075 | A1 | 10/2008 | Seo et al. |
| 2012/0217487 | A1 | 8/2012 | Yamazaki et al. |
| 2013/0062597 | A1* | 3/2013 | Yoshida ............ H01L 51/0073 257/40 |
| 2014/0034932 | A1 | 2/2014 | Seo et al. |
| 2015/0069352 | A1 | 3/2015 | Kim et al. |
| 2016/0049607 | A1 | 2/2016 | Seo et al. |
| 2016/0064684 | A1 | 3/2016 | Seo et al. |
| 2016/0093823 | A1 | 3/2016 | Seo et al. |
| 2016/0322589 | A1 | 11/2016 | Watabe et al. |
| 2016/0372688 | A1* | 12/2016 | Seo ..................... C09K 11/06 |
| 2017/0018727 | A1 | 1/2017 | Watabe et al. |
| 2017/0047537 | A1 | 2/2017 | Shitagaki et al. |
| 2017/0338436 | A1 | 11/2017 | Mitsumori et al. |
| 2019/0173037 | A1 | 6/2019 | Seo et al. |
| 2020/0035940 | A1 | 1/2020 | Shitagaki et al. |

FOREIGN PATENT DOCUMENTS

| | | |
|---|---|---|
| CN | 105390619 A | 3/2016 |
| EP | 1202608 A | 5/2002 |
| EP | 2754661 A | 7/2014 |
| JP | 2005-514754 | 5/2005 |
| JP | 2008-288344 A | 11/2008 |
| JP | 2011-518405 | 6/2011 |
| JP | 2014-045184 A | 3/2014 |
| JP | 2014-241408 A | 12/2014 |
| JP | 2015-053476 A | 3/2015 |
| KR | 2014-0068847 A | 6/2014 |
| WO | WO-2009/070382 | 6/2009 |
| WO | WO-2012/132809 | 10/2012 |
| WO | WO-2016/051309 | 4/2016 |

OTHER PUBLICATIONS

Chinese Office Action (Application No. 201710263394.3) dated Mar. 24, 2020.

Yersin.H et al., Highly Efficient OLEDs with Phosphorescent Materials, 2008, pp. 1-97, 283-309.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter lr(4,6-dFppy)2(pic)(Flrpic):lnvestigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, p. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, p. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, p. 083302-1-083302-3.

(56) References Cited

OTHER PUBLICATIONS

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, p. 153306-1-153306-5.

* cited by examiner

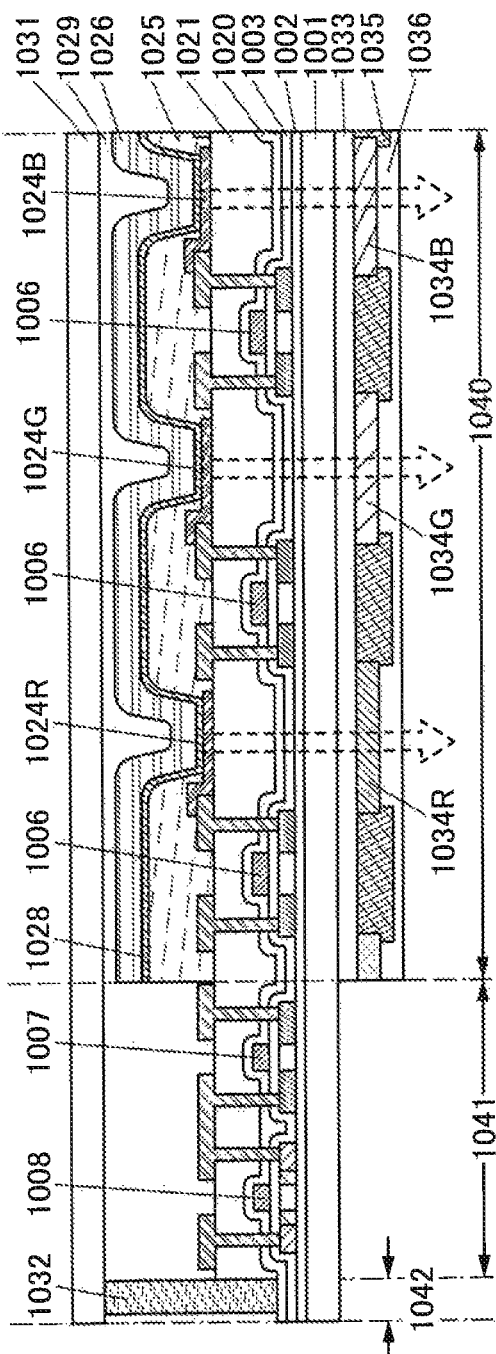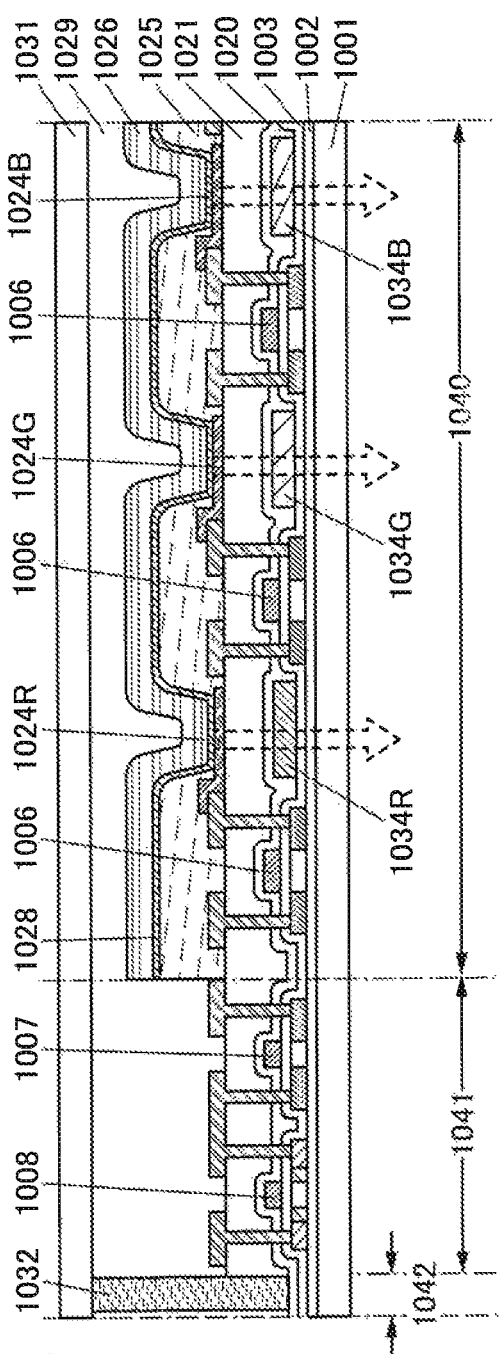

LIGHT-EMITTING ELEMENT, DISPLAY DEVICE, ELECTRONIC DEVICE, AND LIGHTING DEVICE

CROSS-REFERENCE TO RELATED APPLICATIONS

This application is a continuation of U.S. application Ser. No. 15/483,049, filed Apr. 10, 2017, now allowed, which claims the benefit of a foreign priority application filed in Japan as Serial No. 2016-086542 on Apr. 22, 2016, both of which are incorporated by reference.

BACKGROUND OF THE INVENTION

1. Field of the Invention

One embodiment of the present invention relates to a light-emitting element, a display device including the light-emitting element, an electronic device including the light-emitting element, or a lighting device including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development have been extensively conducted on light-emitting elements utilizing electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be formed to be thin and lightweight, and that response time is high.

In a light-emitting element (e.g., an organic EL element) whose EL layer contains an organic compound as a light-emitting substance and is provided between a pair of electrodes, application of a voltage between the pair of electrodes causes injection of electrons from a cathode and holes from an anode into the EL layer having a light-emitting property and thus a current flows. By recombination of the injected electrons and holes, the organic compound having a light-emitting property is put in an excited state to obtain light emission from the excited organic compound having a light-emitting property.

Note that an excited state formed by an organic compound can be a singlet excited state ($S^*$) or a triplet excited state ($T^*$). Light emission from the singlet excited state is referred to as fluorescence, and light emission from the triplet excited state is referred to as phosphorescence. The statistical generation ratio of $S^*$ to $T^*$ in the light-emitting element is 1:3. In other words, a light-emitting element containing a compound emitting phosphorescence (phosphorescent compound) has higher emission efficiency than a light-emitting element containing a compound emitting fluorescence (fluorescent compound). Therefore, light-emitting elements containing phosphorescent compounds capable of converting energy of a triplet excited state into light emission has been actively developed in recent years.

As a material capable of converting part of the energy of a triplet excited state into light emission, a thermally activated delayed fluorescence (TADF) material is known in addition to a phosphorescent compound. In a thermally activated delayed fluorescent material, a singlet excited state is generated from a triplet excited state by reverse intersystem crossing, and the singlet excited state is converted into light emission.

For example, a method is disclosed, in which an exciplex formed by two organic compounds, which has a small energy difference between a singlet excited state and a triplet excited state, is used as a thermally activated delayed fluorescent material (for example, see Patent Document 1).

REFERENCE

Patent Document

[Patent Document 1] Japanese Published Patent Application No. 2014-45184

SUMMARY OF THE INVENTION

In order to increase the emission efficiency of a light-emitting element including a thermally activated delayed fluorescent material, efficient generation of a singlet excited state from a triplet excited state is preferable. As for a light-emitting element in which an exciplex is used as a thermally activated delayed fluorescent material, the development of a method for further increasing emission efficiency has been required.

In order to obtain multi-color light emission such as white from a light-emitting element, it is necessary to make light-emitting substances exhibiting different colors efficiently emit light at the same time. However, it is difficult to control the light emission so that a desired emission color is obtained.

In view of the above, an object of one embodiment of the present invention is to provide a light-emitting element that has high emission efficiency. Another object of one embodiment of the present invention is to provide a light-emitting element emitting light in a broad emission spectrum. Another object of one embodiment of the present invention is to provide a light-emitting element with low power consumption. Another object of one embodiment of the present invention is to provide a novel light-emitting element. Another object of one embodiment of the present invention is to provide a novel light-emitting device. Another object of one embodiment of the present invention is to provide a novel display device.

Note that the description of the above objects does not disturb the existence of other objects. In one embodiment of the present invention, there is no need to achieve all the objects. Other objects are apparent from and can be derived from the description of the specification and the like.

One embodiment of the present invention is a light-emitting element including a combination of two kinds of organic compounds which form an exciplex. One of the organic compounds has a function of converting triplet-excitation energy into light emission.

Another embodiment of the present invention is a light-emitting element including a light-emitting layer. The light-emitting layer includes a first organic compound and a second organic compound. One of the first organic compound and the second organic compound has a LUMO level higher than or equal to the LUMO level of the other of the first organic compound and the second organic compound, and a HOMO level higher than or equal to the HOMO level of the other of the first organic compound and the second organic compound. A combination of the first organic compound and the second organic compound forms an exciplex. The first organic compound has a function of converting triplet-excitation energy into light emission. The lowest triplet excitation level of the second organic compound is higher than or equal to the lowest triplet excitation level of the first organic compound, and the lowest triplet excitation level of the first organic compound is higher than or equal to the lowest triplet excitation level of the exciplex. Light emission from the light-emitting layer includes light emission from the first organic compound and light emission from the exciplex.

Another embodiment of the present invention is a light-emitting element including a light-emitting layer. The light-emitting layer includes a first organic compound and a second organic compound. The LUMO level of the first organic compound is higher than or equal to the LUMO level of the second organic compound. The HOMO level of the first organic compound is higher than or equal to the HOMO level of the second organic compound. A combination of the first organic compound and the second organic compound forms an exciplex. The first organic compound is an organometallic complex having an absorption band which is based on triplet MLCT transition. The lowest triplet excitation level of the second organic compound is higher than or equal to the lowest triplet excitation level of the first organic compound. The lowest triplet excitation level of the first organic compound is higher than or equal to the lowest triplet excitation level of the exciplex. Light emission from the light-emitting layer includes light emission from the first organic compound and light emission from the exciplex.

In each of the above structures, the intensity ratio of the light emission from the exciplex to the light emission from the first organic compound preferably ranges from 1:9 to 9:1. The light emission from the exciplex preferably has a higher intensity than the light emission from the first organic compound.

Preferably, the light-emitting element with each of the above structures further includes a third organic compound. The HOMO level of the third organic compound is preferably higher than or equal to the HOMO level of the second organic compound. Additionally, the third organic compound preferably has a function of transporting a hole. Moreover, the third organic compound preferably includes at least one of a π-electron rich heteroaromatic skeleton and an aromatic amine skeleton.

Furthermore, in each of the above structures, the second organic compound preferably has a function of transporting an electron. The second organic compound preferably includes a π-electron deficient heteroaromatic skeleton.

In each of the above structures, it is preferable that the first organic compound include iridium. Furthermore, it is preferable that the first organic compound include a ligand coordinated to the iridium, and that the ligand include a nitrogen-containing five-membered heterocyclic skeleton.

Another embodiment of the present invention is a display device including the light-emitting element having any of the above-described structures and at least one of a color filter and a transistor. Another embodiment of the present invention is an electronic device including the display device and at least one of a housing and a touch sensor. Another embodiment of the present invention is a lighting device including the light-emitting element having any of the above-described structures and at least one of a housing and a touch sensor. The category of one embodiment of the present invention includes not only a light-emitting device including a light-emitting element but also an electronic device including a light-emitting device. Accordingly, a light-emitting device in this specification refers to an image display device or a light source (including a lighting device). The light-emitting device may include, in its category, a display module in which a connector such as a flexible printed circuit (FPC) or a tape carrier package (TCP) is connected to a light-emitting element, a display module in which a printed wiring board is provided on the tip of a TCP, or a display module in which an integrated circuit (IC) is directly mounted on a light-emitting element by a chip on glass (COG) method.

With one embodiment of the present invention, a light-emitting element with high emission efficiency can be provided. With one embodiment of the present invention, a light-emitting element emitting light in a broad emission spectrum can be provided. With one embodiment of the present invention, a light-emitting element with low power consumption can be provided. With one embodiment of the present invention, a novel light-emitting element can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 9A and 9B are schematic cross-sectional views each illustrating a display device of one embodiment of the present invention.

DETAILED DESCRIPTION OF THE INVENTION

Figure 1:
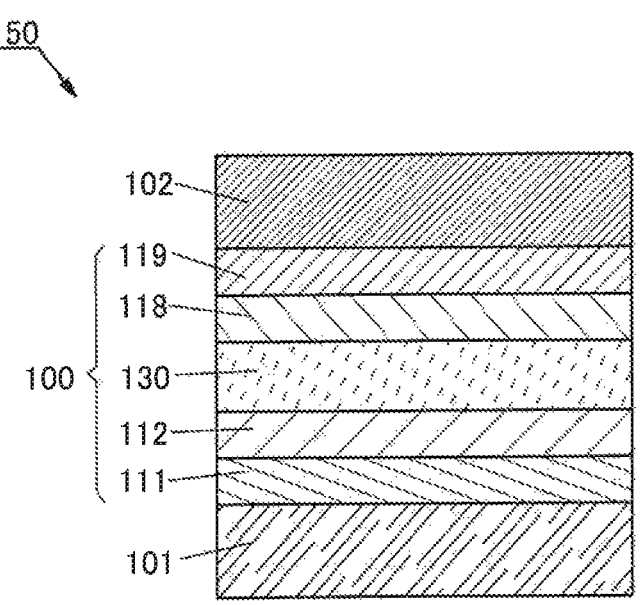
FIG. 1 is a schematic cross-sectional view of a light-emitting element of one embodiment of the present invention.

Embodiments of the present invention will be described in detail below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like is not accurately represented in some cases for easy understanding. Therefore, the disclosed invention is not necessarily limited to the position, size, range, or the like as disclosed in the drawings and the like.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of structures of the invention in this specification and the like with reference to the drawings, the same components in different diagrams are commonly denoted by the same reference numeral in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet-excitation energy level, that is, the excitation energy level of the lowest singlet excited state (S1 state). A triplet excited state (T*) refers to a triplet state having excitation energy. A T1 level means the lowest level of the triplet-excitation energy level, that is, the excitation energy level of the lowest triplet excited state (T1 state). Note that in this specification and the like, simple expressions such as "singlet excited state" and "singlet-excitation energy level" mean the S1 state and the S1 level, respectively, in some cases. In addition, expressions such as "triplet excited state" and "triplet-excitation energy level" mean the T1 state and the T1 level, respectively, in some cases.

In this specification and the like, a fluorescent compound refers to a compound that emits light in the visible light region when the relaxation from the singlet excited state to the ground state occurs. A phosphorescent compound refers to a compound that emits light in the visible light region at room temperature when the relaxation from the triplet excited state to the ground state occurs. That is, a phosphorescent compound refers to a compound that can convert triplet-excitation energy into visible light.

Note that in this specification and the like, "room temperature" refers to a temperature in the range of higher than or equal to 0° C. and lower than or equal to 40° C.

In this specification and the like, a wavelength range of blue refers to a wavelength range which is greater than or equal to 400 nm and less than 490 nm, and blue light has at least one peak in that wavelength range in an emission spectrum. A wavelength range of green refers to a wavelength range which is greater than or equal to 490 nm and less than 580 nm, and green light has at least one peak in that wavelength range in an emission spectrum. A wavelength range of red refers to a wavelength range which is greater than or equal to 580 nm and less than or equal to 680 nm, and red light has at least one peak in that wavelength range in an emission spectrum.

Embodiment 1

In this embodiment, a light-emitting element according to one embodiment of the present invention will be described below with reference to FIG. 1, FIGS. 2A to 2C, FIGS. 3A to 3C, and FIGS. 4A and 4B.

<Structure Example 1 of Light-Emitting Element>

First, a structure of a light-emitting element of one embodiment of the present invention will be described below with reference to FIG. 1.

FIG. 1 is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1 includes functional layers such as a hole-injection layer 111, a hole-transport layer 112, an electron-transport layer 118, and an electron-injection layer 119, in addition to the light-emitting layer 130.

Although description is given assuming that the electrode 101 and the electrode 102 of the pair of electrodes serve as an anode and a cathode, respectively in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

<Light Emission Mechanism 1 of Light-Emitting Element>

Next, the light emission mechanism of the light-emitting layer 130 will be described below.

Figure 2A:
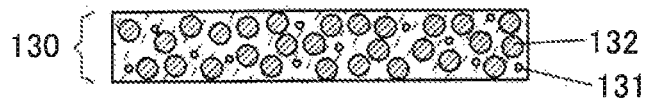
FIG. 2A is a schematic cross-sectional view of a light-emitting layer of a light-emitting element of one embodiment of the present invention.

FIG. 2A is a schematic cross-sectional view illustrating an example of the light-emitting layer 130 in FIG. 1. The light-emitting layer 130 illustrated in FIG. 2A includes a guest material 131 and a host material 132.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. In other words, the probability of generation of singlet excitons is 25%, and the probability of generation of triplet excitons is 75%; thus, making triplet excitons contribute to the light emission is important for increasing the emission efficiency of the light-emitting element.

Therefore, a material having a function of converting triplet-excitation energy into light emission is preferably used for the light-emitting material used in the light-emitting layer 130. Among compounds having a light-emitting property, a compound capable of exhibiting phosphorescence (hereinafter also referred to as phosphorescent compound) has a function of converting triplet-excitation energy into light emission. Accordingly, it is preferable to use a phosphorescent compound for the light-emitting material of the light-emitting element 150.

In the case of using a phosphorescent compound for the light-emitting material in the light-emitting layer 130, the T1 level of the phosphorescent compound is preferably lower than the T1 level of another material (host material 132 or the like) included in the light-emitting layer 130. Thus, quenching of the triplet-excitation energy of the phosphorescent compound is less likely to occur, whereby light emission from the phosphorescent compound can be obtained efficiently.

As the material having a function of converting triplet-excitation energy into light emission, a thermally activated delayed fluorescent (TADF) material can be given in addition to the phosphorescent compound. Note that the thermally activated delayed fluorescent material is a material having a small difference between the S1 level and the T1 level and a function of converting triplet-excitation energy into singlet-excitation energy by reverse intersystem crossing. Thus, the TADF material can up-convert triplet excitation energy into singlet excitation energy (i.e., reverse intersystem crossing is possible) using a little thermal energy and efficiently exhibit light emission (fluorescence) from the singlet excited state. The exciplex which forms an excited state from two kinds of substances functions as a thermally activated delayed fluorescent material capable of converting part of triplet-excitation energy into light emission. Therefore, it is preferable to use an exciplex as the light-emitting material of the light-emitting element 150.

In the case of using an exciplex as the light-emitting material in the light-emitting layer 130, the T1 level of the exciplex is preferably lower than the T1 level of another material (host material 132 or the like) included in the light-emitting layer 130. Thus, quenching of the triplet-excitation energy of the exciplex is less likely to occur, whereby reverse intersystem crossing of triplet-excitation energy due to the exciplex and the following light emission from the singlet-excitation energy can be obtained efficiently.

According to the above relation between energy levels, it is difficult to use a phosphorescent compound and an exciplex as light-emitting materials in the light-emitting layer 130 and efficiently obtain light emission from both the phosphorescent compound and the exciplex. However, the present inventors have found out that light can be efficiently extracted from both the exciplex and the guest material 131 when a phosphorescent compound is used as the guest material 131 and an exciplex is formed by the guest material 131 and the host material 132.

<Energy Transfer Mechanism>

Here, factors controlling the processes of the intermolecular energy transfer will be described. As mechanisms of the intermolecular energy transfer, two mechanisms, i.e., Förster mechanism (dipole-dipole interaction) and Dexter mechanism (electron exchange interaction), have been proposed. Here, an energy transfer process between molecules of the first material in an excited state and the second material in a ground state is described; the same can be applied to the case where one of them is an exciplex.

<<Förster Mechanism>>

In Föster mechanism, energy transfer does not require direct contact between molecules and energy is transferred through a resonant phenomenon of dipolar oscillation between a first material and a second material. By the resonant phenomenon of dipolar oscillation, the first material provides energy to the second material, and thus, the first material in an excited state is brought to a ground state and the second material in a ground state is brought to an excited state. Note that the rate constant $k_{h^* \to g}$ of Förster mechanism is expressed by Formula (1).

$$k_{h^* \to g} = \frac{9000 c^4 K^2 \phi \ln 10}{128 \pi^5 n^4 N \tau R^6} \int \frac{f'_h(v) \varepsilon_g(v)}{v^4} dv \quad (1)$$

In Formula (1), v denotes a frequency, $f_h(v)$ denotes a normalized emission spectrum of the first material (a fluorescent spectrum in the case where energy transfer from a singlet excited state is discussed, and a phosphorescent spectrum in the case where energy transfer from a triplet excited state is discussed), $\varepsilon_g(v)$ denotes a molar absorption coefficient of the second material, N denotes Avogadro's number, n denotes a refractive index of a medium, R denotes an intermolecular distance between the first material and the second material, τ denotes a measured lifetime of an excited state (fluorescence lifetime or phosphorescence lifetime), c denotes the speed of light, φ denotes an emission quantum yield (a fluorescence quantum yield in the case where energy transfer from a singlet excited state is discussed, and a phosphorescence quantum yield in the case where energy transfer from a triplet excited state is discussed), and $K^2$ denotes a coefficient (0 to 4) of orientation of a transition dipole moment between the first material and the second material. Note that $K^2=2/3$ in random orientation.

<<Dexter Mechanism>>

In Dexter mechanism, the first material and the second material are close to a contact effective range where their orbitals overlap, and the first material in an excited state and the second material in a ground state exchange their electrons, which leads to energy transfer. Note that the rate constant $k_{h^* \to g}$ of Dexter mechanism is expressed by Formula (2).

$$k_{h^* \to g} = \left(\frac{2\pi}{h}\right) K^2 \exp\left(-\frac{2R}{L}\right) \int f'_h(v) \varepsilon'_g(v) dv \quad (2)$$

In Formula (2), h denotes a Planck constant, K denotes a constant having an energy dimension, v denotes a frequency, $f_h(v)$ denotes a normalized emission spectrum of the first material (the fluorescent spectrum in the case where energy transfer from a singlet excited state is discussed, and the phosphorescent spectrum in the case where energy transfer from a triplet excited state is discussed), $\varepsilon'_g(v)$ denotes a normalized absorption spectrum of the second material, L denotes an effective molecular radius, and R denotes an intermolecular distance between the first material and the second material.

Here, the efficiency of energy transfer from the first material to the second material (energy transfer efficiency φET) is expressed by Formula (3). In the formula, $k_r$ denotes a rate constant of a light-emission process (fluorescence in the case where energy transfer from a singlet excited state is discussed, and phosphorescence in the case where energy transfer from a triplet excited state is discussed) of the first material, $k_n$ denotes a rate constant of a non-light-emission process (thermal deactivation or intersystem crossing) of the first material, and τ denotes a measured lifetime of an excited state of the first material.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency φET can be increased by increasing the rate constant $k_{h^* \to g}$ of energy transfer so that another competing rate constant $k_r+k_n(=1/\tau)$ becomes relatively small.

<<Excitation Energy Transfer to Exciplex>>

First, energy transfer by Förster mechanism is considered. When Formula (1) is substituted into Formula (3), τ can be eliminated. Thus, in Förster mechanism, the energy transfer efficiency φET does not depend on the lifetime r of the excited state of the first material. Furthermore, it can be said that high energy transfer efficiency φET is obtained when emission quantum yield φ (the fluorescence quantum yield in the case where energy transfer from a singlet excited state is discussed, and the phosphorescence quantum yield in the case where energy transfer from a triplet excited state is discussed) is high.

Furthermore, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with the absorption spectrum of the second material (absorption corresponding to the transition from the singlet ground state to the singlet excited state). Moreover, it is preferable that the molar absorption coefficient of the second material be also high. This means that the emission spectrum of the first material overlaps with the absorption band of the second material which is on the longest wavelength side. Note that in case of using an exciplex as the second material, the molar absorption coefficient of the second material can be ignored, since direct transition from a singlet ground state to a singlet excited state as well as direct transition from a singlet ground state to a triplet excited state is forbidden. Thus, the excitation energy transfer process from the first material to the second material by the Förster mechanism can be ignored.

Next, energy transfer by Dexter mechanism is considered. According to Formula (2), in order to increase the rate constant $k_{h^*\to g}$, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the second material which is on the longest wavelength side. Also in this case, when an exciplex is used for the second material, the absorption spectrum of the second material can be ignored, since direct transition from a singlet ground state to a singlet excited state as well as direct transition from a singlet ground state to a triplet excited state is forbidden. Thus, the excitation energy transfer process from the first material to the second material by the Dexter mechanism can be ignored.

Thus, in the case of using an exciplex as the second material, energy transfer does neither occur due to the Förster mechanism nor due to the Dexter mechanism in the energy transfer process from the first material to the second material.

<<Correlation of Energy Levels>>

In one embodiment of the present invention, the guest material 131 is preferably a phosphorescent compound. A structure in which a phosphorescent compound is used as the guest material 131 will be described below. The guest material 131 may be rephrased as the phosphorescent compound.

Furthermore, the combination of the guest material 131 and the host material 132 included in the light-emitting layer 130 preferably forms an exciplex.

Although it is acceptable as long as the combination of the guest material 131 and the host material 132 can form an exciplex, it is preferable that one of them be a compound having a function of transporting holes (a hole-transport property) and the other be a compound having a function of transporting electrons (an electron-transport property). In that case, a donor-acceptor exciplex is formed easily; thus, efficient formation of an exciplex is possible. In the case where the combination of the guest material 131 and the host material 132 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

In order to efficiently form an exciplex, the combination of the guest material and the host material preferably satisfies the following: the highest occupied molecular orbital (also referred to as HOMO) level of one of the guest material 131 and the host material 132 is higher than the HOMO level of the other of the guest material 131 and the host material 132, and the lowest unoccupied molecular orbital (also referred to as LUMO) level of one of the guest material 131 and the host material 132 is higher than the LUMO level of the other of the guest material 131 and the host material 132.

Note that the LUMO levels and the HOMO levels of the compounds can be derived from the electrochemical characteristics (the reduction potentials and the oxidation potentials) of the compounds that are measured by cyclic voltammetry (CV).

Figure 2B:
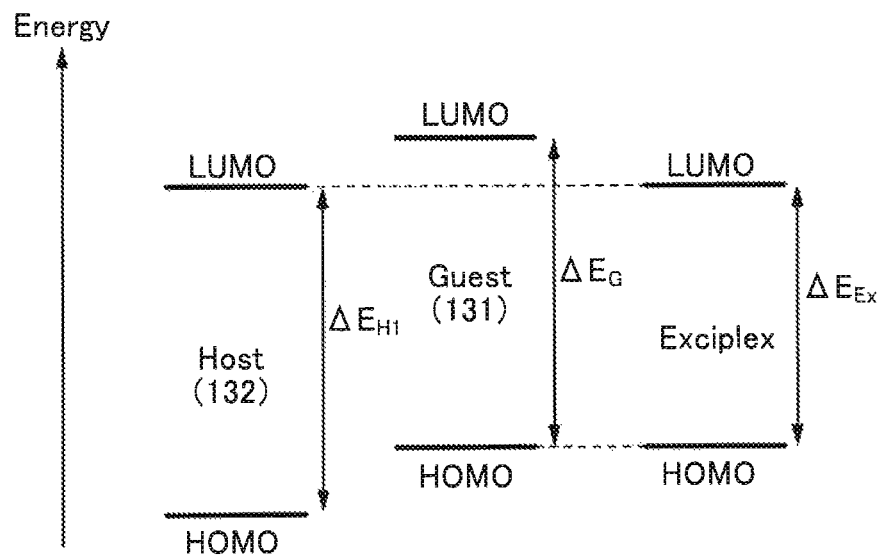
FIGS. 2B and 2C are diagrams each illustrating the correlation of energy levels.

In the case where, for example, the guest material 131 has a hole-transport property and the host material 132 has an electron-transport property, the HOMO level of the guest material 131 is preferably higher than the HOMO level of the host material 132, and the LUMO level of the guest material 131 is preferably higher than the LUMO level of the host material 132, as shown in the energy band diagram in FIG. 2B. Specifically, the energy difference between the HOMO level of the guest material 131 and the HOMO level of the host material 132 is preferably 0.1 eV or more, more preferably 0.2 eV or more, or much more preferably 0.3 eV or more. Furthermore, the energy difference between the LUMO level of the guest material 131 and the LUMO level of the host material 132 is preferably 0.1 eV or more, more preferably 0.2 eV or more, or much more preferably 0.3 eV or more. Such an energy difference is suitable because electrons and holes injected from the pair of electrodes (the electrode 101 and the electrode 102) are easily injected into the guest material 131 and the host material 132.

Note that in FIG. 2B, "Guest (131)" represents the guest material 131, "Host (132)" represents the host material 132, $\Delta E_G$ represents the energy difference between the LUMO level and the HOMO level of the guest material 131, $\Delta E_{H1}$ represents the energy difference between the LUMO level and the HOMO level of the host material 132, and $\Delta E_{Ex}$ represents the energy difference between the LUMO level of the host material 132 and the HOMO level of the guest material 131.

Furthermore, in that case, an exciplex formed by the guest material 131 and the host material 132 has the HOMO in the guest material 131 and the LUMO in the host material 132. The excitation energy of the exciplex substantially corresponds to the energy difference between the LUMO level of the host material 132 and the HOMO level of the guest material 131 ($\Delta E_{Ex}$) and is smaller than the energy difference between the LUMO level and the HOMO level of the guest material 131 ($\Delta E_G$) and the energy difference between the LUMO level and the HOMO level of the host material 132 ($\Delta E_{H1}$). Thus, when the guest material 131 and the host material 132 form an exciplex, an excited state can be formed with lower excitation energy. Furthermore, since the exciplex has an energy corresponding to the lower excitation energy, a stable excited state can be formed.

Figure 2C:
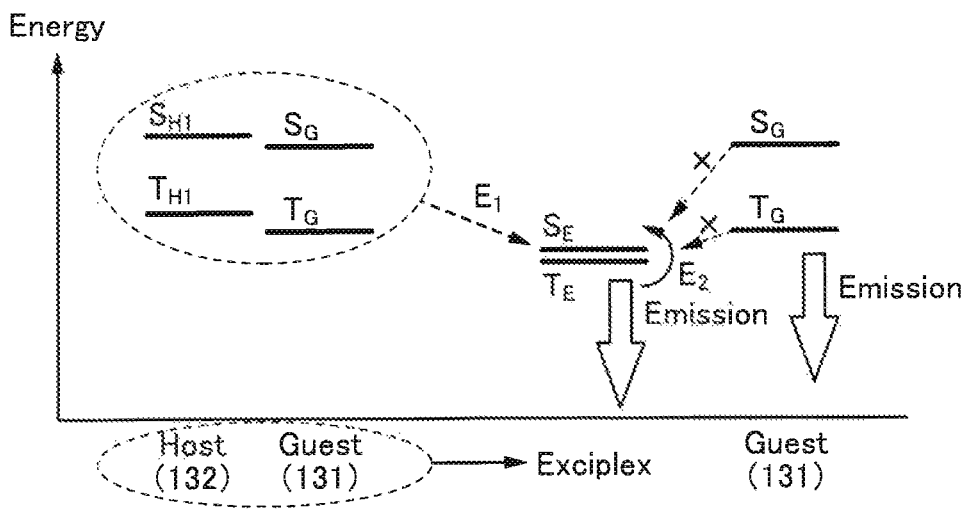

FIG. 2C shows a correlation of energy levels of the guest material 131 and the host material 132 in the light-emitting layer 130. The following explains what terms and signs in FIG. 2C represent:

Guest (131): the guest material 131 (phosphorescent compound);
Host (132): the host material 132;
$S_G$: an S1 level of the guest material 131;
$T_G$: a T1 level of the guest material 131;
$S_{H1}$: an S1 level of the host material 132;
$T_{H1}$: a T1 level of the host material 132;
$S_E$: an S1 level of the exciplex; and
$T_E$: a T1 level of the exciplex.

In the light-emitting element of one embodiment of the present invention, an exciplex is formed by the guest material 131 and the host material 132 included in the light-emitting layer 130. The S1 level of the exciplex ($S_E$) and the T1 level of the exciplex ($T_E$) are close to each other (see Route $E_1$ in FIG. 2C).

An exciplex is an excited state formed by two kinds of substances. In photoexcitation, the exciplex is formed by interaction between one substance in an excited state and another substance in a ground state which are close to each other. The two kinds of substances that have formed the exciplex return to a ground state by emitting light and then serve as the original two kinds of substances. In electrical excitation, when one substance is brought into an excited state, the one immediately interacts with the other close substance to form an exciplex. Alternatively, one substance receives a hole and the other substance receives an electron, and they interact with each other to readily form an exciplex. Because the excitation energy levels ($S_E$ and $T_E$) of the exciplex are lower than the S1 levels ($S_G$ and $S_{H1}$) of the substances (the guest material 131 and the host material 132) that form the exciplex, the excited state can be formed with lower excitation energy. Accordingly, the driving voltage of the light-emitting element 150 can be reduced.

Since the S1 level and the T1 level of the exciplex ($S_E$ and $T_E$) are adjacent to each other, the exciplex has a function of exhibiting thermally activated delayed fluorescence. In other words, the exciplex has a function of converting triplet-excitation energy into singlet-excitation energy by reverse intersystem crossing (upconversion) (see Route $E_2$ in FIG. 2C). Thus, part of the triplet-excitation energy generated in the light-emitting layer 130 is converted into singlet-excitation energy by the exciplex. In order to cause this conversion, the energy difference between the S1 level and the T1 level of the exciplex ($S_E$ and $T_E$) is preferably greater than 0 eV and less than or equal to 0.2 eV, more preferably greater than 0 eV and less than or equal to 0.1 eV. Note that in order to efficiently make reverse intersystem crossing occur, the T1 level of the exciplex ($T_E$) is preferably lower than the T1 levels of the substances that form an exciplex (the guest material 131 and the host material 132) ($T_G$ and $T_{H1}$). Thus, quenching of the triplet-excitation energy of the exciplex due to the guest material 131 and the host material 132 is less likely to occur, which causes reverse intersystem crossing efficiently.

Furthermore, the exciplex only exists in an excited state, and the excitation energy levels ($S_E$ and $T_E$) of the exciplex are only present in a state in which an exciplex is formed; thus, direct transfer from the ground state of the substances (guest material 131 and host material 132) forming the exciplex to the excited state of the exciplex does not occur. Therefore, excitation energy transfer from the excitation energy levels ($S_G$ and $T_G$) of the guest material 131 alone or the excitation energy levels ($S_{H1}$ and $T_{H1}$) of the host material 132 alone to the excitation energy levels ($S_E$ and $T_E$) of the exciplex does not occur. Thus, by adequately controlling the generation probability of the exciplex formed by the guest material 131 and the host material 132, light can be efficiently extracted from both the exciplex and the guest material 131.

Therefore, the T1 level ($T_{H1}$) of the host material 132 is preferably higher than or equal to the T1 level ($T_G$) of the guest material 131. Furthermore, the T1 level ($T_G$) of the guest material 131 is preferably higher than or equal to the T1 level ($T_E$) of the exciplex which is formed by the guest material 131 and the host material 132. Thus, quenching of the excitation energy of the exciplex formed by the guest material 131 and the host material 132 is less likely to occur, whereby reverse intersystem crossing from the triplet-excitation energy to the singlet-excitation energy due to the exciplex and the following light emission from the singlet-excitation energy can be obtained efficiently. Additionally, since quenching of the excitation energy of the guest material 131 is also less likely to occur, as described above, efficient light emission from the guest material 131 can be obtained.

Furthermore, when the direct carrier recombination process becomes dominant in the guest material 131, a process for forming the exciplex by the guest material 131 and the host material 132 is less likely to occur. Thus, it is preferable that the process in which carriers directly recombine and the process in which energy is transferred through the exciplex generation process (Routes $E_1$ and $E_2$ in FIG. 2C) occur with a desired probability in the guest material 131. In addition, the weight ratio of the guest material 131 to the host material 132 is preferably low, specifically, preferably greater than or equal to 0.01 and less than or equal to 0.5, more preferably greater than or equal to 0.05 and less than or equal to 0.3.

By extracting light from the guest material 131 and light from the exciplex formed by the guest material 131 and the host material 132 in a desired ratio, the color of light emitted from the light-emitting element can be controlled. For example, the ratio of light emission from the guest material 131 to light emission from the exciplex formed by the guest material 131 and the host material 132 may be adjusted so that the color of light emitted from the light-emitting element is white or mostly white; specifically, the ratio of light emission from the guest material 131 to light emission from the exciplex formed by the guest material 131 and the host material 132 is preferably 1:9 to 9:1, and more preferably 1:5 to 5:1. Note that the light emission from the light-emitting element may include another light emission.

Note that a structure may be used in which the guest material 131 has an electron-transport property and the host material 132 has a hole-transport property. In this case, the HOMO level of the host material 132 is preferably higher than the HOMO level of the guest material 131, and the LUMO level of the host material 132 is preferably higher than the LUMO level of the guest material 131, as shown in the energy band diagram in FIG. 4A.

<Light Emission Mechanism 2 of Light-Emitting Element>

Next, a structural example different from that of the light-emitting layer illustrated in FIG. 2A will be described below with reference to FIG. 3A.

Figure 3A:
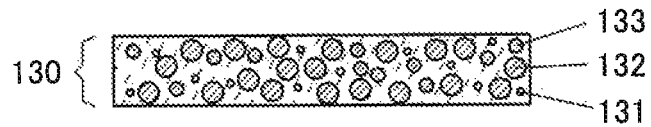
FIG. 3A is a schematic cross-sectional view of a light-emitting layer of a light-emitting element of one embodiment of the present invention.

FIG. 3A is a schematic cross-sectional view illustrating an example of the light-emitting layer 130 in FIG. 1. The light-emitting layer 130 in FIG. 3A includes the guest material 131, the host material 132, and a host material 133.

In the light-emitting layer 130, the host material 132 or the host material 133 is present in the highest proportion by weight, and the guest material 131 is dispersed in the host material 132 or the host material 133. Here, the guest material 131 is preferably a phosphorescent compound. Furthermore, the combination of the guest material 131 and the host material 132 preferably forms an exciplex.

In order to efficiently form an exciplex, the combination of host materials preferably satisfies the following: the HOMO level of one of the guest material 131 and the host material 132 is the highest of the materials in the light-emitting layer 130, and the LUMO level of the other is the lowest in the light-emitting layer 130. In other words, the HOMO level of one of the guest material 131 and the host material 132 is preferably higher than the HOMO level of the other of the guest material 131 and the host material 132 and the HOMO level of the host material 133, and the LUMO level of the other of the guest material 131 and the host material 132 is preferably lower than the LUMO level of the one of the guest material 131 and the host material 132 and the LUMO level of the host material 133. Thus, the reaction for forming an exciplex by the host material 132 and the host material 133 can be inhibited.

Figure 3B:
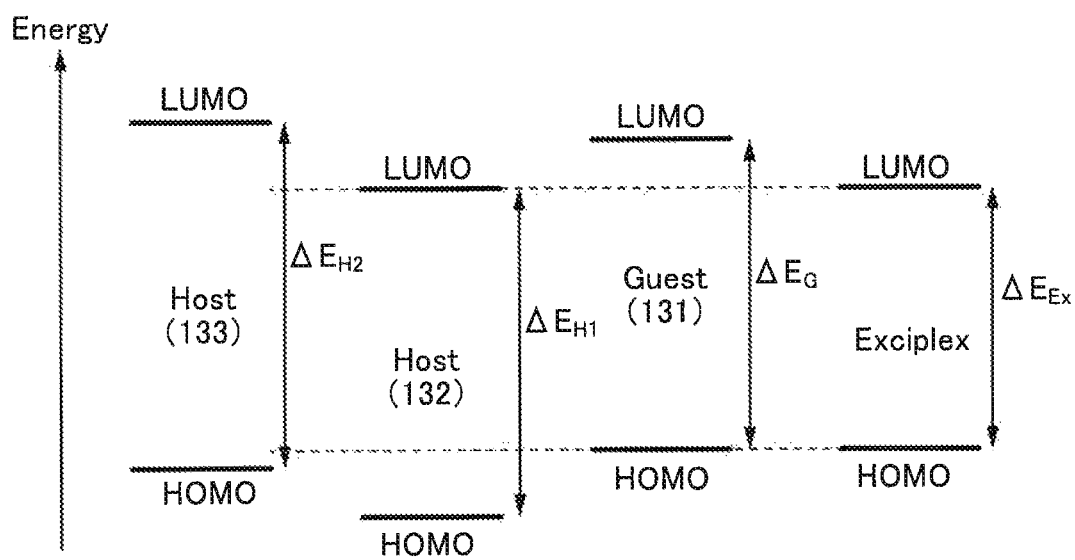
FIGS. 3B and 3C are diagrams each illustrating the correlation of energy levels.

In the case where, for example, the guest material 131 has a hole-transport property and the host material 132 has an electron-transport property, the HOMO level of the guest material 131 is preferably higher than the HOMO level of the host material 132 and the HOMO level of the host material 133, and the LUMO level of the host material 132 is preferably lower than the LUMO level of the guest material 131 and the LUMO level of the host material 133, as shown in the energy band diagram in FIG. 3B. In this case, the LUMO level of the host material 133 may be higher or lower than the LUMO level of the guest material 131. Furthermore, the HOMO level of the host material 133 may be higher or lower than the HOMO level of the host material 132.

Note that in FIG. 3B, "Guest (131)" represents the guest material 131, "Host (132)" represents the host material 132, "Host (133)" represents the host material 133, $\Delta E_G$ represents the energy difference between the LUMO level and the HOMO level of the guest material 131, $\Delta F_{H1}$ represents the energy difference between the LUMO level and the HOMO level of the host material 132, $\Delta E_{H2}$ represents the energy difference between the LUMO level and the HOMO level of the host material 133, and $\Delta E_{Ex}$ represents the energy difference between the LUMO level of the host material 132 and the HOMO level of the guest material 131.

Furthermore, in that case, excitation energy of the exciplex formed by the guest material 131 and the host material 132 substantially corresponds to the energy difference between the LUMO level of the host material 132 and the HOMO level of the guest material 131 ($\Delta E_{Ex}$) and is preferably smaller than the energy difference between the LUMO level and the HOMO level of the host material 133 ($\Delta E_{H2}$).

Figure 3C:
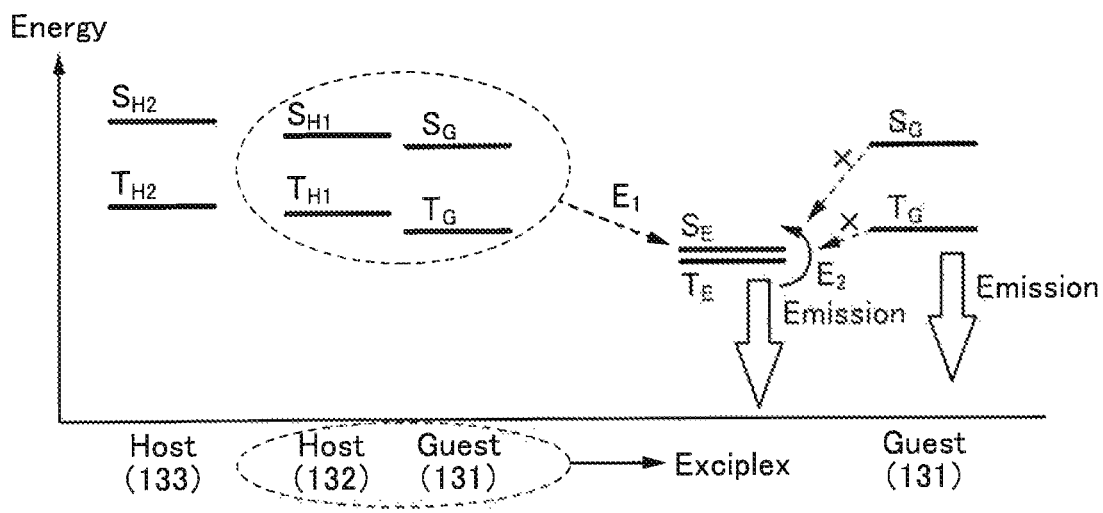
Figure 4A:
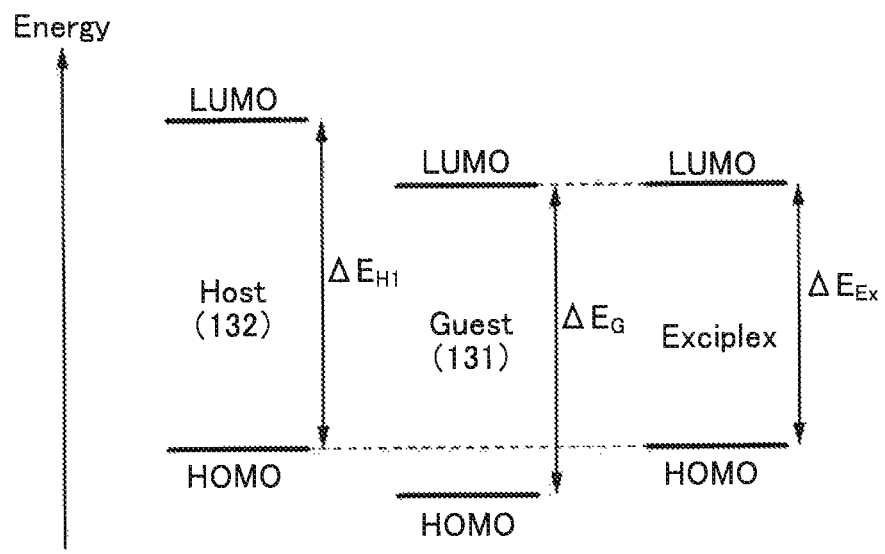
FIGS. 4A and 4B are diagrams each illustrating the correlation of energy levels of a light-emitting layer of a light-emitting element of one embodiment of the present invention.
Figure 4B:
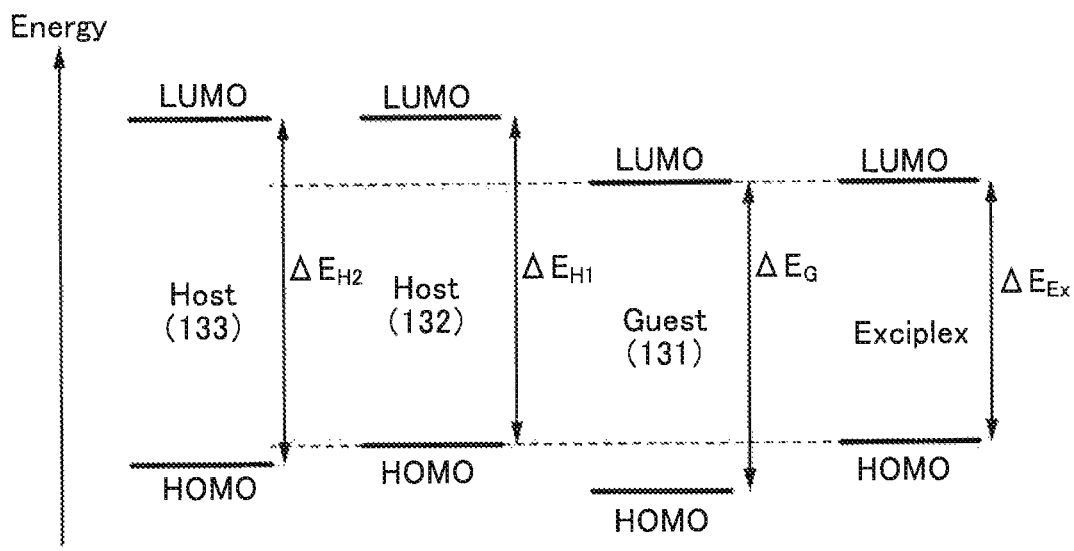

FIG. 3C shows the correlation between energy levels of the guest material 131, the host material 132, and the host material 133 in the light-emitting layer 130 illustrated in FIG. 3A. The following explains what terms and signs in FIG. 3C represent:

Guest (131): the guest material 131 (phosphorescent compound);
Host (132): the host material 132;
Host (133): the host material 133;
$S_G$: an S1 level of the guest material 131;
$T_G$: a T1 level of the guest material 131;
$S_{H1}$: an S1 level of the host material 132;
$T_{H1}$: a T1 level of the host material 132;
$S_{H2}$: an S1 level of the host material 133;
$T_{H2}$: a T1 level of the host material 133;
$S_E$: an S1 level of the exciplex; and
$T_E$: a T1 level of the exciplex.

In the light-emitting element of one embodiment of the present invention, an exciplex is formed by the guest material 131 and the host material 132 included in the light-emitting layer 130. The S1 level of the exciplex ($S_E$) and the T1 level of the exciplex ($T_E$) are close to each other (see Route $E_1$ in FIG. 3C).

The T1 level ($T_{H1}$) of the host material 132 and the T1 level ($T_{H2}$) of the host material 133 are preferably higher than or equal to the T1 level ($T_G$) of the guest material 131. Furthermore, the T1 level ($T_G$) of the guest material 131 is preferably higher than or equal to the T1 level ($T_E$) of the exciplex formed by the guest material 131 and the host material 132. Thus, quenching of the excitation energy of the exciplex formed by the guest material 131 and the host material 132 is less likely to occur, whereby reverse inter-system crossing from the triplet-excitation energy to the singlet-excitation energy due to the exciplex and the following light emission from the singlet-excitation energy can be obtained efficiently. Additionally, since quenching of the excitation energy of the guest material 131 is also less likely to occur, efficient light emission from the guest material 131 can be obtained.

Note that when the direct carrier recombination process becomes dominant in the guest material 131, a process for forming the exciplex by the guest material 131 and the host material 132 is less likely to occur. Thus, it is preferable that the process in which carriers directly recombine and the process in which energy is transferred through the exciplex generation process (Routes $E_1$ and $E_2$ in FIG. 3C) occur with a desired probability in the guest material 131. Therefore, it is preferable to add a material other than the guest material 131 and the host material 132 to the light-emitting layer 130. In other words, by using the host material 133 in addition to the guest material 131 and the host material 132 in the light-emitting layer 130, the generation probability of the exciplex formed by the guest material 131 and the host material 132 can be adequately controlled. In addition, the weight of the guest material 131 to the total of the host material 132 and the host material 133 is preferably low, specifically, preferably greater than or equal to 0.01 and less than or equal to 0.5, more preferably greater than or equal to 0.05 and less than or equal to 0.3.

Note that a structure may be used in which the guest material 131 has an electron-transport property and the host material 132 has a hole-transport property. In that case, the HOMO level of the host material 132 is preferably higher than the HOMO level of the guest material 131 and the HOMO level of the host material 133, and the LUMO level of the guest material 131 is preferably lower than the LUMO level of the host material 132 and the LUMO level of the host material 133, as shown in the energy band diagram in FIG. 4B. In this case, the LUMO level of the host material 133 may be higher or lower than the LUMO level of the host material 132. Furthermore, the HOMO level of the host material 133 may be higher or lower than the HOMO level of the guest material 131.

<Material>

Next, components of a light-emitting element of one embodiment of the present invention are described below in detail.

<<Light-Emitting Layer>>

Materials that can be used for the light-emitting layer 130 will be described below.

Although there is no particular limitation as long as the combination of the guest material 131 and the host material 132 can form an exciplex, it is preferable that one of them have a function of transporting electrons and the other have a function of transporting holes.

When the host material 132 has a function of transporting holes, the host material 132 preferably includes at least one of a π-electron rich heteroaromatic skeleton and an aromatic amine skeleton.

As the π-electron rich heteroaromatic skeleton included in the host material 132, one or more of a furan skeleton, a thiophene skeleton, and a pyrrole skeleton are preferable because of their high stability and reliability. As a furan skeleton, a dibenzofuran skeleton is preferable. As a thiophene skeleton, a dibenzothiophene skeleton is preferable. Note that as a pyrrole skeleton, an indole skeleton or a carbazole skeleton, in particular, a 3-(9-phenyl-9H-carbazol- 3-yl)-9H-carbazole skeleton is preferable. Each of these skeletons may further have a substituent.

As the aromatic amine skeleton included in the host material 132, tertiary amine not including an NH bond, in particular, a triarylamine skeleton is preferably used. As an aryl group of a triarylamine skeleton, a substituted or unsubstituted aryl group having 6 to 13 carbon atoms included in a ring is preferably used and examples thereof include a phenyl group, a naphthyl group, a fluorenyl group, a phenanthrenyl group, a triphenylenyl group, and the like.

A structure including a π-electron rich heteroaromatic skeleton and an aromatic amine skeleton, which has an excellent hole-transport property and thus is stable and highly reliable, is particularly preferred. An example of such a structure is a structure including a carbazole skeleton and an arylamine skeleton.

As examples of the above-described π-electron rich heteroaromatic skeleton and aromatic amine skeleton, skeletons represented by the following General Formulae (101) to (117) are given. Note that X in the General Formulae (115) to (117) represents an oxygen atom or a sulfur atom.

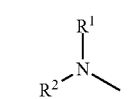 (101)

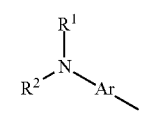 (102)

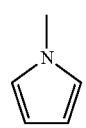 (103)

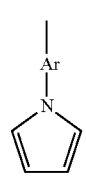 (104)

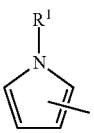 (105)

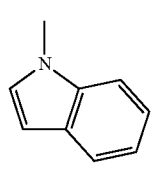 (106)

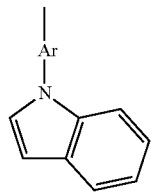 (107)

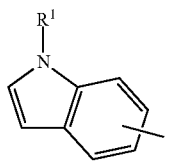 (108)

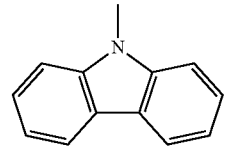 (109)

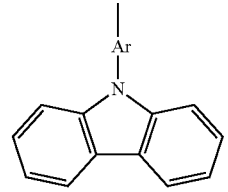 (110)

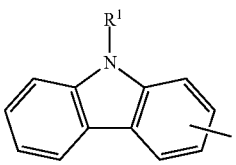 (111)

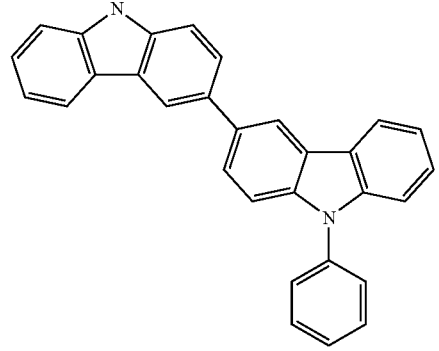 (112)

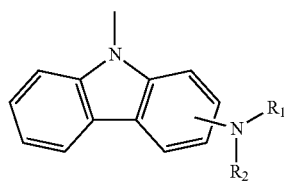 (113)

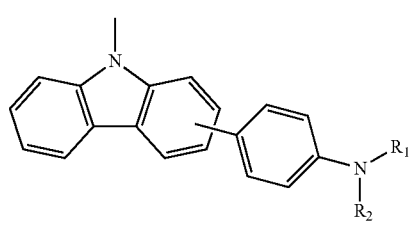 (114)

 (115)

(116)
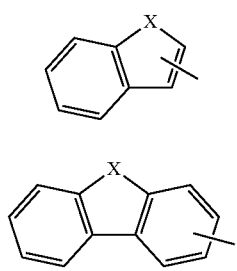

(117)

Furthermore, when the host material 132 has a function of transporting electrons, the host material 132 preferably includes a π-electron deficient heteroaromatic skeleton. As the π-electron deficient heteroaromatic skeleton, a pyridine skeleton, a diazine skeleton (a pyrimidine skeleton, a pyrazine skeleton, or a pyridazine skeleton), or a triazine skeleton is preferable; in particular, the diazine skeleton or the triazine skeleton is preferable because of its high stability and reliability.

As examples of the above-described π-electron deficient heteroaromatic skeleton, skeletons represented by the following General Formulae (201) to (218) are given. Note that X in the General Formulae (209) to (211) represents an oxygen atom or a sulfur atom.

(201)
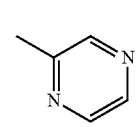

(202)
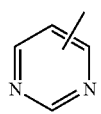

(203)
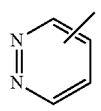

(204)
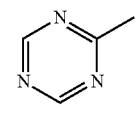

(205)
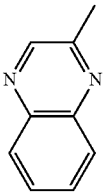

(206)
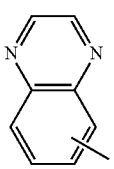

(207)
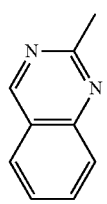

(208)
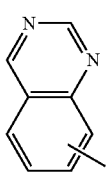

(209)
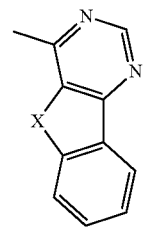

(210)
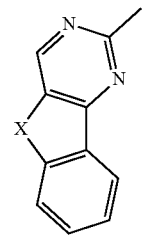

(211)
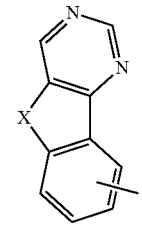

(212)
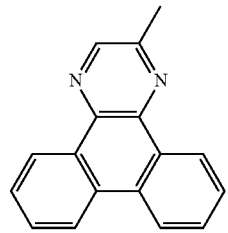

(213)

(214)

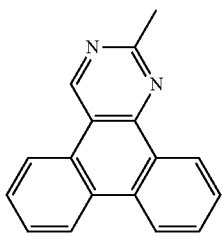

(215)

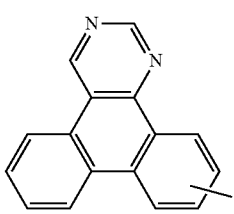

(216)

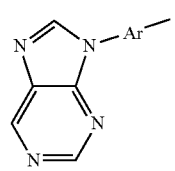

(217)

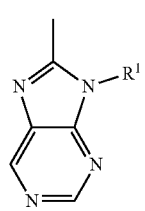

(218)

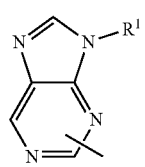

Alternatively, a compound may be used in which a skeleton having a hole-transport property (e.g., at least one of a π-electron rich heteroaromatic skeleton and an aromatic amine skeleton) and a skeleton having an electron-transport property (e.g., a π-electron deficient heteroaromatic skeleton) are bonded to each other directly or through an arylene group. Examples of the arylene group include a phenylene group, a biphenyldiyl group, a naphthalenediyl group, a fluorenediyl group and the like.

As examples of a bonding group which bonds the above skeleton having a hole-transport property and the above skeleton having an electron-transport property, skeletons represented by the following General Formulae (301) to (315) are given.

(301)

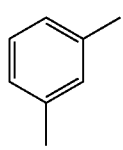

(302)

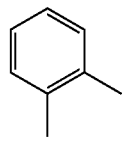

(303)

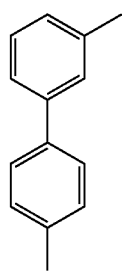

(304)

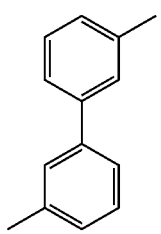

(305)

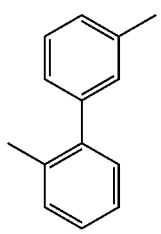

(306)

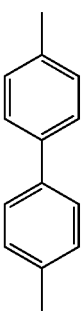

(307)

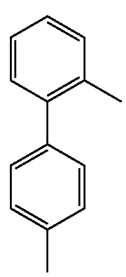

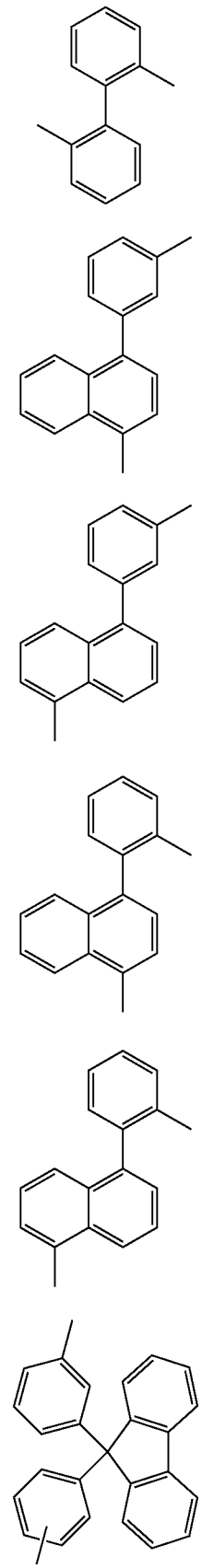

(308)
(309)
(310)
(311)
(312)
(313)

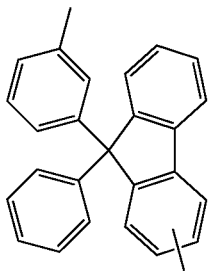
(314)

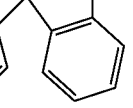
(315)

The above aromatic amine skeleton (e.g., the triarylamine skeleton), the above π-electron rich heteroaromatic skeleton (e.g., a ring including the furan skeleton, the thiophene skeleton, or the pyrrole skeleton), the above π-electron deficient heteroaromatic skeleton (e.g., a ring including the diazine skeleton or the triazine skeleton) or the above General Formulae (101) to (117), (201) to (218), and (301) to (315) may each have a substituent. As the substituent, an alkyl group having 1 to 6 carbon atoms, a cycloalkyl group having 3 to 6 carbon atoms, or a substituted or unsubstituted aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a substituted or unsubstituted phenyl group, a substituted or unsubstituted naphthyl group, a substituted or unsubstituted biphenyl group, and the like. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

Furthermore, Ar represents a single-bond arylene group or an arylene group having 6 to 13 carbon atoms. The arylene group may include one or more substituents and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 13 carbon atoms are a phenylene group, a naphthalenediyl group, a biphenyldiyl group, a fluorenediyl group, and the like. In the case where the arylene group has a substituent, an alkyl group having 1 to 6 carbon atoms, a cycloalkyl group having 3 to 6 carbon atoms, or an aryl group having 6 to 12 carbon atoms can also be selected as the substituent. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like.

As the arylene group represented by Ar, for example, groups represented by Structural Formulae (Ar-1) to (Ar-18) below can be used. Note that the group that can be used as Ar is not limited to these.

(Ar-1)
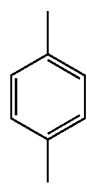

(Ar-2)
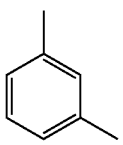

(Ar-3)
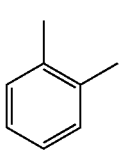

(Ar-4)
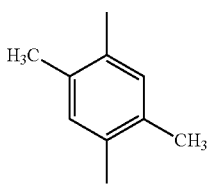

(Ar-5)
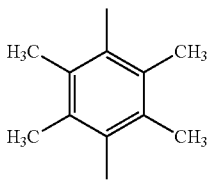

(Ar-6)
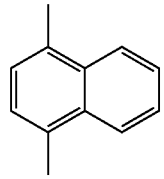

(Ar-7)
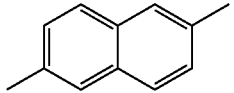

-continued (Ar-8)
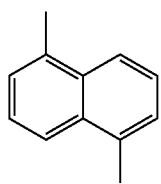

(Ar-9)
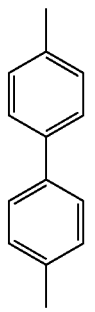

(Ar-10)
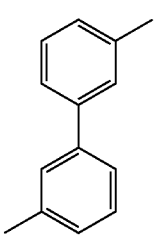

(Ar-11)
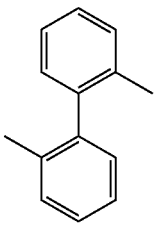

(Ar-12)
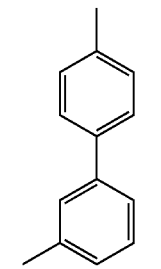

(Ar-13)
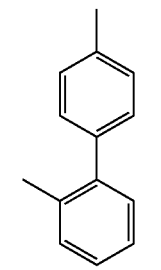

(Ar-14)
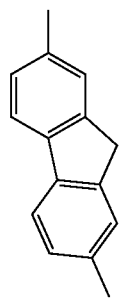

(Ar-15)
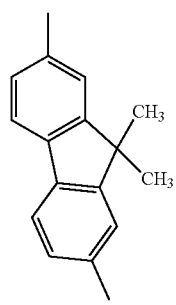

(Ar-16)
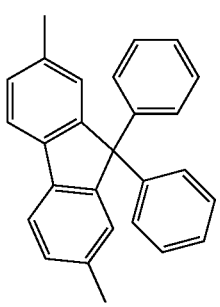

(Ar-17)
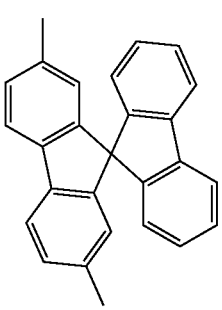

(Ar-18)
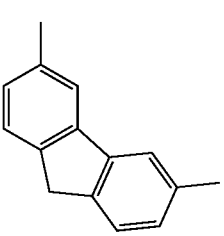

Furthermore, $R^1$ and $R^2$ each independently represent any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms are a phenyl group, a naphthyl group, a biphenyl group, a fluorenyl group, and the like. The above aryl group or phenyl group may include one or more substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like.

For example, groups represented by Structural Formulae (R-1) to (R-29) below can be used as the alkyl group or aryl group represented by $R^1$ and $R^2$. Note that the group which can be used as an alkyl group or an aryl group is not limited thereto.

(R-1)

(R-2)
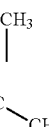

(R-3)
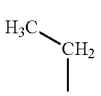

(R-4)
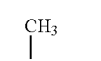

(R-5)
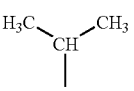

(R-6)
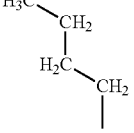

(R-7)
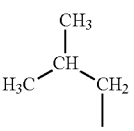

(R-8)
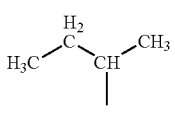

(R-9) 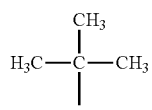
(R-10) 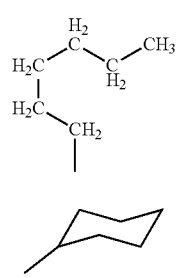
(R-11) 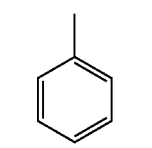
(R-12) 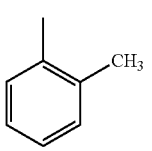
(R-13) 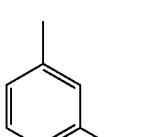
(R-14) 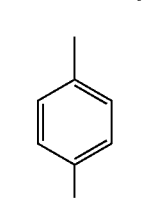
(R-15) 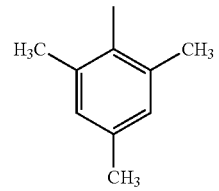
(R-16) 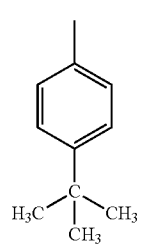
(R-17)
(R-18) 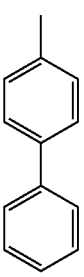
(R-19) 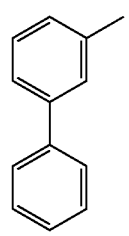
(R-20) 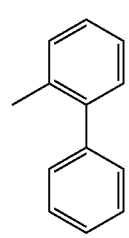
(R-21) 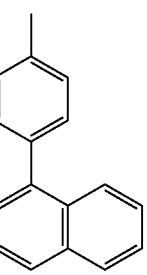
(R-22) 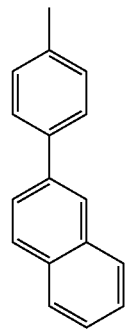
(R-23) 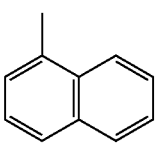

-continued (R-24)
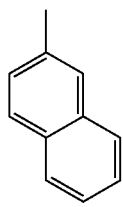

(R-25)
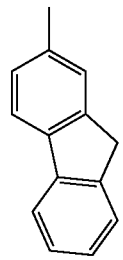

(R-26)
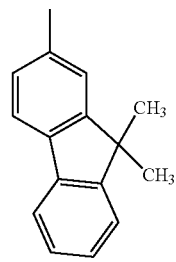

(R-27)
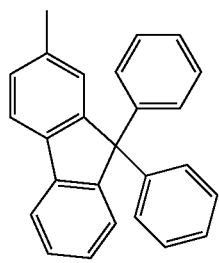

(R-28)
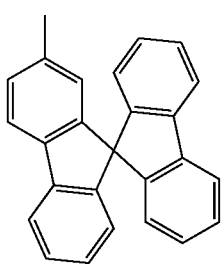

(R-29)
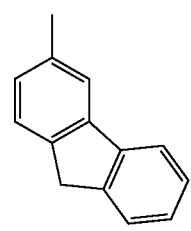

As a substituent that can be included in the General Formulae (101) to (117), (201) to (218), and (301) to (315), Ar, $R^1$, and $R^2$, the alkyl group or aryl group represented by the above Structural Formulae (R-1) to (R-24) can be used, for example. Note that the group which can be used as an alkyl group or an aryl group is not limited thereto.

As the host material 132, any of the following hole-transport materials and electron-transport materials can be used, for example.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, or the like can be used. Furthermore, the hole-transport material may be a high molecular compound.

Examples of the material having a high hole-transport property are aromatic amine compounds such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 1,4-bis[4-(N-carbazolyl)phenyl]-2,3,5,6-tetraphenylbenzene, and the like.

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N, N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances listed here are mainly ones that have a hole mobility of $1 \times 10^{-6}$ cm$^2$/Vs or higher. Note that other than these substances, any substance that has a property of transporting more holes than electrons may be used.

A material having a property of transporting more electrons than holes can be used as an electron-transport material, and a material having an electron mobility of $1 \times 10^{-6}$ cm$^2$/Vs or higher is preferable. A π-electron deficient heteroaromatic compound such as a nitrogen-containing heteroaromatic compound, or a zinc- or aluminum-based metal complex can be used as the material which easily accepts electrons (the material having an electron-transport property). Examples of the metal complex include a metal complex having a quinoline ligand, a benzoquinoline ligand, an oxazole ligand, and a thiazole ligand. Furthermore, an oxadiazole derivative, a triazole derivative, a phenanthroline derivative, a pyridine derivative, a bipyridine derivative, a pyrimidine derivative, a triazine derivative, and the like can be given as the π-electron deficient heteroaromatic compound.

Examples include metal complexes having a quinoline or benzoquinoline skeleton, such as tris(8-quinolinolato)aluminum(III) (abbreviation: Alq), tris(4-methyl-8-quinolinolato) aluminum(III) (abbreviation: Almq$_3$), bis(10-hydroxybenzo [h]quinolinato)beryllium(II) (abbreviation: BeBq$_2$), bis(2-methyl-8-quinolinolato) (4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tent-butylphenyl)-1,3,4-oxadiazole (abbreviation: PBD), 1,3-bis[5-(p-tent-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tent-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), bathocuproine (abbreviation: BCP), and 2,9-bis(naphthalen-2-yl)-4,7-diphenyl-1,10-phenanthroline (abbreviation: NBPhen); heterocyclic compounds having a diazine skeleton such as 2-[3-(dibenzothiophen-4-yl)phenyl]dibenzon[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq-II), 2-[4-(3,6-diphenyl-9H-carbazol-9-yl)phenyl]dibenzo[f,h]quinoxaline (abbreviation: 2CzPDBq-III), 743-(dibenzothiophen-4-yl)phenyl]dibenzo[f,h]quinoxaline (abbreviation: 7mDBTPDBq-II), 6[3-(dibenzothiophen-4-yl)phenyl]dibenzo[f,h]quinoxaline (abbreviation: 6mDBTPDBq-II), 4,6-bis[3-(phenanthren-9-yl) phenyl]pyrimidine (abbreviation: 4,6mPnP2Pm), 4,6-bis[3-(4-dibenzothienyl)phenyl]pyrimidine (abbreviation: 4,6mDBT2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy) and 1,3,5-tris[3-(3-pyridyl)-phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances listed here are mainly ones that have an electron mobility of $1 \times 10^{-6}$ cm$^2$/Vs or higher. However, any substance other than the above-described substances may be used as long as it is a substance whose electron-transport property is higher than the hole-transport property.

The guest material 131 preferably has a function of converting triplet-excitation energy into light emission. In the case where the guest material 131 includes a heavy metal, intersystem crossing between a singlet state and a triplet state is promoted by spin-orbit interaction (interaction between spin angular momentum and orbital angular momentum of an electron), and transition between a singlet ground state and a triplet excited state of the guest material 131 is allowed. Therefore, the emission efficiency and the absorption probability which relate to the transition between the singlet ground state and the triplet excited state of the guest material 131 can be increased. Accordingly, the guest material 131 preferably includes a metal element with large spin-orbit interaction, specifically a platinum group element (ruthenium (Ru), rhodium (Rh), palladium (Pd), osmium (Os), iridium (Ir), or platinum (Pt)). In particular, iridium is preferred because the transition probability that relates to direct transition between a singlet ground state and a triplet excited state can be increased.

As the guest material 131 (phosphorescent compound), an iridium-, rhodium-, or platinum-based organometallic complex or metal complex can be used. Furthermore, a platinum complex having a porphyrin ligand, an organoiridium complex, and the like can be given; specifically, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. In this case, the guest material 131 (phosphorescent compound) has an absorption band based on triplet MLCT (metal to ligand charge transfer) transition.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organic metal iridium complexes including a nitrogen-containing five-membered heterocyclic skeleton, such as a 4H-triazole skeleton, a 1H-triazole skeleton, or an imidazole skeleton have high triplet-excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir (bzq)$_3$), tris(2-phenylquinolinato-N,C$^{2'}$)iridium(III) (abbreviation: Ir(pq)$_3$), and bis(2-phenylquinolinato-N,C$^{2'}$)iridium (III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$) iridium(III) acetylacetonate (abbreviation: Ir(bt)$_2$(acac)); and a rare earth metal complex such as tris(acetylacetonato) (monophenanthroline)terbium(III) (abbreviation: Tb(acac)$_3$ (Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato] (dipivaloylmethanato)iridium(III) (abbreviation: Ir(5mdppm)$_2$(dpm)), and bis [4,6-di(naphthalen-1-yl)pyrimidinato] (dipivaloylmethanato)iridium(III) (abbreviation: Ir(dlnpm)$_2$ (dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato) iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato] (monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Further, the organometallic iridium complexes having a pyrazine skeleton can provide red light emission with favorable chromaticity.

Although there is no particular limitation on a material that can be used as the host material 133 in the light-emitting layer 130, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq₂), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl) phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tent-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetramine (abbreviation: DBC 1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tent-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), and the like. One or more substances having a wider energy gap than the guest material 131 is preferably selected from these substances and known substances.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

The light-emitting layer 130 may contain a material other than the guest material 131, the host material 132, and the host material 133.

Furthermore, a fluorescent compound may be used in the light-emitting layer 130. The fluorescent compound is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBuFLPAPrn), N,N'bis[4-(9-phenyl-9H-fluoren-9-yl)phenyl]-N,N'-diphenyl-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitril e (abbreviation: DCM1), 2-{2-methyl-6-[2-(2,3,6,7-tetrahydro-1H,5H-benzo[i,j] quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro- 1H,5H-benzo[ij]quinolizin-9-yl)ethenyl]-4H-pyran-4-ylidene}propanedinitrile (abbreviation: BisDCJTM), 5,10,15,20-tetraphenylbisbenzo[5,6]indeno[1,2,3-cd:1',2',3'-lm]perylene, and the like.

Furthermore, as the guest material 131, any material having a function of converting triplet-excitation energy into singlet-excitation energy may be used. As the material having a function of converting triplet-excitation energy into singlet-excitation energy, a thermally activated delayed fluorescent material can be given in addition to the phosphorescent compound. Therefore, it is acceptable that the "phosphorescent compound" in the description is replaced with the "thermally activated delayed fluorescent material". Thermally activated delayed fluorescence is efficiently obtained under the condition where the difference between the S1 level and the T1 level is more than 0 eV and less than or equal to 0.2 eV, preferably more than 0 eV and less than or equal to 0.1 eV.

The material that exhibits thermally activated delayed fluorescence may be a material that can form a singlet excited state by itself from a triplet excited state by reverse intersystem crossing. In the case where the thermally activated delayed fluorescent material is composed of one kind of material, any of the following materials can be used, for example.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2$OEP), and the like.

As the thermally activated delayed fluorescent material composed of one kind of material, a heterocyclic compound including a π-electron rich heteroaromatic skeleton and a π-electron deficient heteroaromatic skeleton can also be used. Specifically, 2-(biphenyl-4-yl)-4,6-bis(12-phenylindolo[2,3-α]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heterocyclic compound is preferable because of having the π-electron rich heteroaromatic skeleton and the π-electron deficient heteroaromatic skeleton, for which the electron-transport property and the hole-transport property are high. Note that a substance in which the π-electron rich heteroaromatic skeleton is directly bonded to the π-electron deficient heteroaromatic skeleton is particularly preferable because the donor property of the π-electron rich heteroaromatic skeleton and the acceptor property of the π-electron deficient heteroaromatic skeleton are both increased and the difference between the S1 level and the T1 level becomes small.

<<Pair of Electrodes>>

The electrode 101 and the electrode 102 have functions of injecting holes and electrons into the light-emitting layer 130. The electrodes 101 and 102 can be formed using a metal, an alloy, or a conductive compound, or a mixture or a stack thereof, for example. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium zinc oxide, indium oxide containing tungsten and zinc, and the like. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

In this specification and the like, as the electrode transmitting light, a material that transmits visible light and has conductivity is used. Examples of the material include, in addition to the above-described oxide conductor layer typified by an ITO, an oxide semiconductor layer and an organic conductive layer containing an organic substance. Examples of the organic conductive layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1\times10^5$ Ω·cm, more preferably lower than or equal to $1\times10^4$ Ω·cm.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2/Vs$ or higher is preferable. Specifically, any of the above aromatic amines, carbazole derivatives, aromatic hydrocarbons, stilbene derivatives, and the like can be used as the hole-transport material that can be used in the light-emitting layer 130. Furthermore, the hole-transport material may be a high molecular compound.

Examples of the aromatic hydrocarbon are 2-tent-butyl-9,10-di(2-naphthyl)anthracene (abbreviation: t-BuDNA), 2-tent-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ $cm^2/Vs$ or higher and having 14 to 42 carbon atoms is particularly preferable.

The aromatic hydrocarbon may have a vinyl skeleton. As the aromatic hydrocarbon having a vinyl group, the following are given, for example: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, any of the materials given as examples of the material of the hole-injection layer 111 can be used. In addition, a substance having a hole mobility of $1\times10^{-6}$ $cm^2/Vs$ or higher is preferably used. Note that other than these substances, any substance that has a property of transporting more holes than electrons may be used. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as an electron-transport material, and a material having an electron mobility of $1\times10^{-6}$ $cm^2/Vs$ or higher is preferable. As a compound which easily accepts electrons (a material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, which is described as the electron-transport material that can be used in the light-emitting layer 130, can be given. In addition, an oxadiazole derivative, a triazole derivative, a phenanthroline derivative, a pyridine derivative, a bipyridine derivative, a pyrimidine derivative, and the like can be given. A substance having an electron mobility of $1\times10^{-6}$ $cm^2/Vs$ or higher is preferable. Note that a substance other than the above substances may be used as long as it has a higher electron-transport property than a hole-transport property. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. This is a layer formed by addition of a small amount of a substance having a high electron-trapping property to a material having a high electron-transport property as described above, and the layer is capable of adjusting the carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron donating property, a Group 1 metal, a Group 2 metal, an oxide of the metal, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. A rare earth metal compound like erbium fluoride (ErF$_3$) can also be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Further, an alkali metal oxide and an alkaline earth metal oxide are preferable, and a lithium oxide, a calcium oxide, a barium oxide, and the like can be given. Alternatively, Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle-printing method, a gravure printing method, or the like. Besides the above-mentioned materials, an inorganic compound such as a quantum dot or a high molecular compound (e.g., an oligomer, a dendrimer, or a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

An example of a liquid medium used for a wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a phenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); a polyphenylene derivative; or the like. These high molecular compounds or a high molecular compound such as poly(9-vinylcarbazole) (abbreviation: PVK), poly(2-vinylnaphthalene), poly[bis(4-phenyl) (2,4,6-trimethylphenyl)amine] (abbreviation: PTAA) may be doped with a compound having a light-emitting property and used for the light-emitting layer. As the compound having a light-emitting property, any of the above-described compounds having a light-emitting property can be used.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic vapor deposition film, or the like can also be used. Another material may be used as long as the substrate functions as a support in a manufacturing process of the light-emitting elements or optical elements. Another material having a function of protecting the light-emitting elements or optical elements may be used.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic vapor deposition film, paper, or the like can be used.

Alternatively, a flexible substrate may be used as the substrate, and the light-emitting element may be provided directly over the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over any of the above-described substrates. Accordingly, an active matrix display device in which the FET controls the driving of the light-emitting element can be manufactured.

The structure described above in this embodiment can be combined with any of the other embodiments as appropriate.

Embodiment 2

Figure 5:
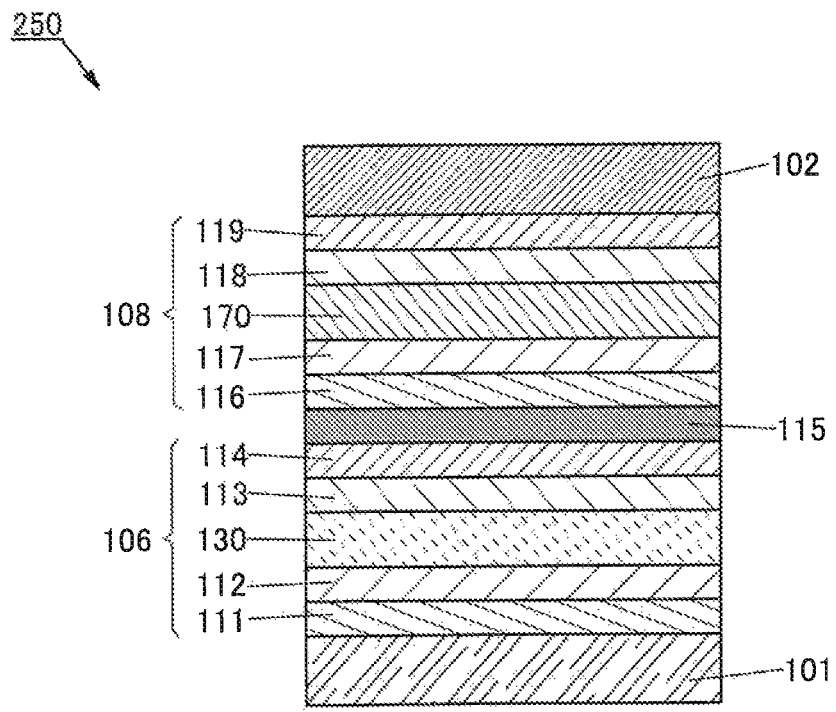
FIG. 5 is a schematic cross-sectional view of a light-emitting element of one embodiment of the present invention.

In this embodiment, a light-emitting element having a structure different from that described in Embodiment 1 and light emission mechanisms of the light-emitting element will be described below with reference to FIG. 5. In FIG. 5, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

<Structure Example of Light-Emitting Element>

FIG. 5 is a schematic cross-sectional view of a light-emitting element 250.

The light-emitting element 250 illustrated in FIG. 5 includes a plurality of light-emitting units (a light-emitting unit 106 and a light-emitting unit 108 in FIG. 5) between a pair of electrodes (the electrode 101 and the electrode 102). One light-emitting unit has the same structure as the EL layer 100 illustrated in FIG. 1. That is, the light-emitting element 150 illustrated in FIG. 1 includes one light-emitting unit while the light-emitting element 250 includes a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 5, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that the structure of the EL layer 100 illustrated in FIG. 1 be used for the light-emitting unit 106.

The light-emitting element 250 includes the light-emitting layer 130 and a light-emitting layer 170. The light-emitting unit 106 includes the hole-injection layer 111, the hole-transport layer 112, the electron-transport layer 113, and the electron-injection layer 114 in addition to the light-emitting layer 130. The light-emitting unit 108 includes a hole-injection layer 116, a hole-transport layer 117, an electron-transport layer 118, and an electron-injection layer 119 in addition to the light-emitting layer 170.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1 \times 10^{-6}$ cm$^2$/Vs or higher is preferably used as the organic compound. Note that any other substance may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115 like the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer including a transparent conductive material.

The charge-generation layer 115 provided between the light-emitting unit 106 and the light-emitting unit 108 may have any structure as long as electrons can be injected into the light-emitting unit on one side and holes can be injected into the light-emitting unit on the other side when a voltage is applied between the electrode 101 and the electrode 102. For example, in FIG. 5, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance higher than or equal to 40%). The charge-generation layer 115 functions even if it has lower conductivity than the pair of electrodes (the electrodes 101 and 102). In the case where the conductivity of the charge-generation layer 115 is as high as those of the pair of electrodes, carriers generated in the charge-generation layer 115 flow toward the film surface direction, so that light is emitted in a region where the electrode 101 and the electrode 102 do not overlap, in some cases. To suppress such a defect, the charge-generation layer 115 is preferably formed using a material whose conductivity is lower than those of the pair of electrodes.

Forming the charge-generation layer 115 by using any of the above materials can suppress an increase in driving voltage caused by the stack of the light-emitting layers.

The light-emitting element having two light-emitting units has been described with reference to FIG. 5; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. In addition, a light-emitting element with low power consumption can be realized.

When the structure of the EL layer 100 shown in FIG. 1 is applied to at least one of the plurality of units, a light-emitting element with high emission efficiency can be provided.

It is preferable that the light-emitting layer 130 included in the light-emitting unit 106 have the structure described in Embodiment 1. In that case, the light-emitting element 250 has high emission efficiency.

Note that the guest materials used in the light-emitting unit 106 and the light-emitting unit 108 may be the same or different. In the case where the same guest material is used for the light-emitting unit 106 and the light-emitting unit 108, the light-emitting element 250 can exhibit high emission luminance at a small current value, which is preferable. In the case where different guest materials are used for the light-emitting unit 106 and the light-emitting unit 108, the light-emitting element 250 can exhibit multi-color light emission, which is preferable. It is particularly favorable to select the guest materials so that white light emission with high color rendering properties or light emission of at least red, green, and blue can be obtained.

Note that the light-emitting units 106 and 108 and the charge-generation layer 115 can be formed by an evaporation method (including a vacuum evaporation method), an ink-jet method, a coating method, gravure printing, or the like.

Note that the structure described in this embodiment can be used in appropriate combination with any of the structures described in the other embodiments.

Embodiment 3

In this embodiment, examples of light-emitting elements having structures different from those described in Embodiments 1 and 2 are described below with reference to FIG. 6 and FIGS. 7A and 7B.

<Structure Example 1 of Light-Emitting Element>

Figure 6:
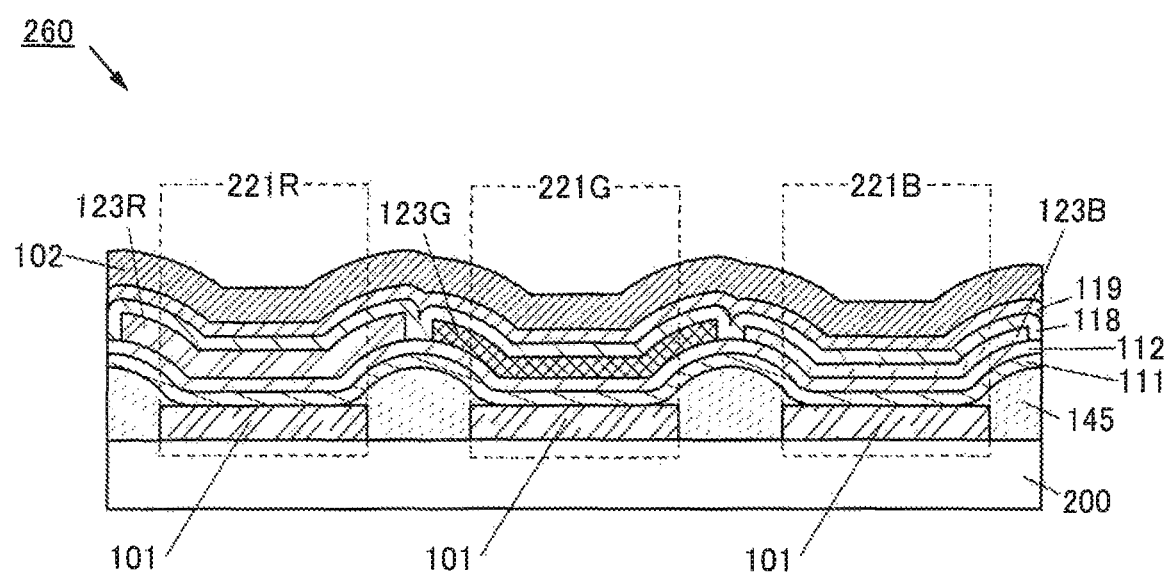
FIG. 6 is a schematic cross-sectional view of a light-emitting element of one embodiment of the present invention.

FIG. 6 is a cross-sectional view of a light-emitting element of one embodiment of the present invention. In FIG. 6, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

A light-emitting element 260 in FIG. 6 may have a bottom-emission structure in which light is extracted through a substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting element 260 has a bottom-emission structure, the electrode 101 preferably has a function of transmitting light. In addition, it is preferable that the electrode 102 have a function of reflecting light. In the case where the light-emitting element 260 has a top-emission structure, the electrode 101 preferably has a function of reflecting light. In addition, it is preferable that the electrode 102 have a function of transmitting light.

The light-emitting element 260 includes the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

Furthermore, the electrode 101 may be formed of a plurality of conductive layers. In this case, a structure in which a conductive layer having a function of reflecting light and a conductive layer having a function of transmitting light are stacked is preferable.

For the electrode 101, the structure and materials of the electrode 101 or 102 described in Embodiment 1 can be used.

In FIG. 6, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, aluminum nitride, and the like. Examples of the organic material include photosensitive resin materials such as an acrylic resin and a polyimide resin.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. By using the light-emitting element 260 having this structure in a pixel of a display device, a full-color display device can be fabricated. The thicknesses of the light-emitting layers may be the same or different.

One or more of the light-emitting layer 123B, the light-emitting layer 123G, and the light-emitting layer 123R preferably have the structure of the light-emitting layer 130 described in Embodiment 1. In that case, a light-emitting element with high emission efficiency can be fabricated.

One or more of the light-emitting layers 123B, 123G, and 123R may include two or more stacked layers.

When at least one light-emitting layer includes the light-emitting layer described in Embodiment 1 as described above and the light-emitting element 260 including the light-emitting layer is used in a pixel in a display device, a display device with high emission efficiency can be fabricated. Accordingly, the display device including the light-emitting element 260 can have low power consumption.

By providing a color filter over the electrode through which light is extracted, the color purity of the light-emitting element 260 can be improved. Therefore, the color purity of a display device including the light-emitting element 260 can be improved.

By providing a polarizing plate over the electrode through which light is extracted, the reflection of external light by the light-emitting element 260 can be reduced. Therefore, the contrast ratio of a display device including the light-emitting element 260 can be improved.

Note that for the other components of the light-emitting element 260, the components of the light-emitting elements in Embodiment 1 may be referred to.

<Structure Example 2 of Light-Emitting Element>

Next, a structure example different from the light-emitting element illustrated in FIG. 6 will be described below with reference to FIGS. 7A and 7B.

Figure 7A:
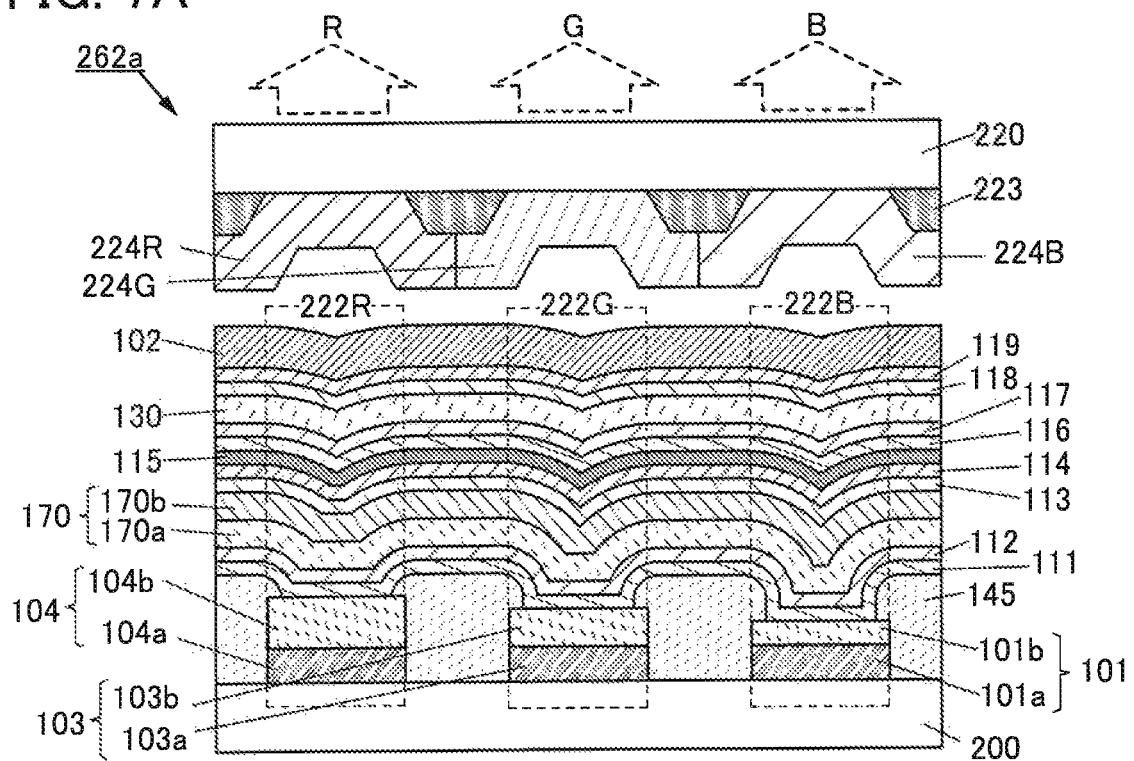
FIGS. 7A and 7B are each a schematic cross-sectional view of a light-emitting element of one embodiment of the present invention.
Figure 7B:
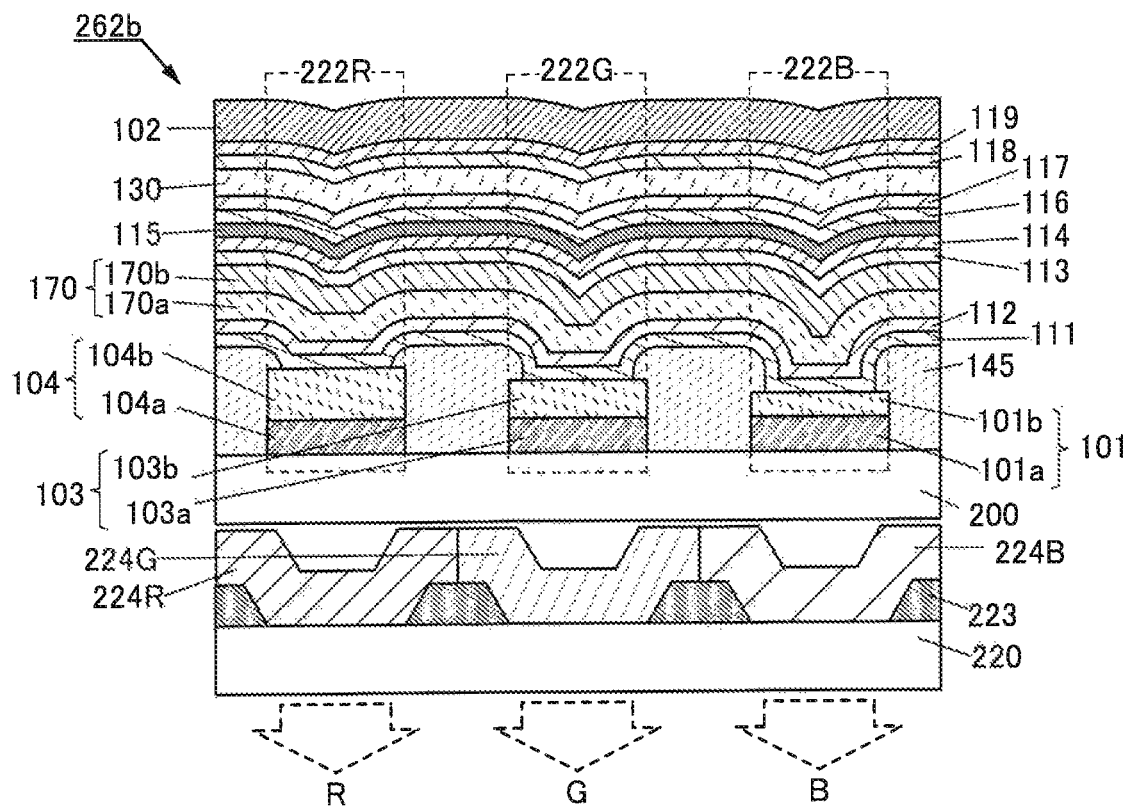

FIGS. 7A and 7B are cross-sectional views each illustrating a light-emitting element of one embodiment of the present invention. In FIGS. 7A and 7B, a portion having a function similar to that in FIG. 6 is represented by the same hatch pattern as that in FIG. 6 and not especially denoted by a reference numeral in some cases. In addition, common reference numerals are used for portions having similar functions, and a detailed description of the portions is omitted in some cases.

FIGS. 7A and 7B illustrate structure examples of a light-emitting element including the light-emitting layer between a pair of electrodes. A light-emitting element 262a illustrated in FIG. 7A has a top-emission structure in which light is extracted in a direction opposite to the substrate 200, and a light-emitting element 262b illustrated in FIG. 7B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 130 and the charge-generation layer 115 are provided between the electrode 101 and the electrode 102, between the electrode 102 and the electrode 103, and between the electrode 102 and the electrode 104. The hole-injection layer 111, the hole-transport layer 112, a light-emitting layer 170, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 7A and the light-emitting element 262b illustrated in FIG. 7B each include the partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be divided into island shapes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through the corresponding optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B.

Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot can increase color reproducibility of the display device.

A plurality of optical elements may also be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 7A and 7B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

For the substrate 200 and the substrate 220 provided with the optical elements, the substrate in Embodiment 1 may be referred to.

Furthermore, the light-emitting elements 262a and 262b have a microcavity structure.

<<Microcavity Structure>>

Light emitted from the light-emitting layer 130 and the light-emitting layer 170 resonates between a pair of electrodes (e.g., the electrode 101 and the electrode 102). The light-emitting layer 130 and the light-emitting layer 170 are formed at such a position as to intensify light of a desired wavelength among light to be emitted. For example, by adjusting the optical length from a reflective region of the electrode 101 to a light-emitting region of the light-emitting layer 130 and the optical length from a reflective region of the electrode 102 to the light-emitting region of the light-emitting layer 130, the light of a desired wavelength among light emitted from the light-emitting layer 130 can be intensified. Furthermore, by adjusting the optical length from a reflective region of the electrode 101 to a light-emitting region of the light-emitting layer 170 and the optical length from a reflective region of the electrode 102 to the light-emitting region of the light-emitting layer 170, the light of a desired wavelength among light emitted from the light-emitting layer 170 can be intensified. In the case of a light-emitting element in which a plurality of light-emitting layers (here, the light-emitting layers 130 and 170) are stacked, the optical lengths of the light-emitting layers 130 and 170 are preferably optimized.

In each of the light-emitting elements 262a and 262b, by adjusting the thicknesses of the conductive layers (the conductive layer 101b, the conductive layer 103b, and the conductive layer 104b) in each region, the light of a desired wavelength among light emitted from the light-emitting layers 130 and 170 can be intensified. Note that the thickness of at least one of the hole-injection layer 111 and the hole-transport layer 112 may differ between the regions to intensify the light emitted from the light-emitting layers 130 and 170.

For example, in the case where the refractive index of the conductive material having a function of reflecting light in the electrodes 101 to 104 is lower than the refractive index of the light-emitting layer 130 or the light-emitting layer 170, the thickness of the conductive layer 101b of the electrode 101 is adjusted so that the optical length between the electrode 101 and the electrode 102 is $m_B \lambda_B/2$ ($m_B$ is a natural number and $\lambda_B$ is the wavelength of light intensified in the region 222B). Similarly, the thickness of the conductive layer 103b of the electrode 103 is adjusted so that the optical length between the electrode 103 and the electrode 102 is $m_G \lambda_G/2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R \lambda_R/2$ ($m_R$ is a natural number and $\lambda_R$ is the wavelength of light intensified in the region 222R).

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive layers 101b, 103b, and 104b preferably have a function of transmitting light. The materials of the conductive layers 101b, 103b, and 104b may be the same or different. Each of the conductive layers 101b, 103b, and 104b may have a stacked structure of two or more layers.

Since the light-emitting element 262a illustrated in FIG. 7A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 7B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262a and 262b can be reduced. Note that each of the conductive layers 101a, 103a, and 104a may have a stacked structure including two or more layers.

Furthermore, the light-emitting layer 130 in the light-emitting element 262a and the light-emitting element 262b preferably has the structure described in Embodiment 1. In this way, the light-emitting elements can have high emission efficiency.

Either or both of the light-emitting layers 130 and 170 may have a stacked structure of two layers like the light-emitting layers 170a and 170b, for example. The two light-emitting layers including two kinds of light-emitting materials (a first light-emitting material and a second light-emitting material) for emitting different colors of light enable light emission of a plurality of colors. It is particularly preferable to select the light-emitting materials of the light-emitting layers so that white light can be obtained by combining light emissions from the light-emitting layer 130 and the light-emitting layer 170.

Either or both of the light-emitting layers 130 and 170 may have a stacked structure of three or more layers, in which a layer not including a light-emitting material may be included.

In the above-described manner, by using the light-emitting element 262a or 262b including the light-emitting layer having any one of the structure described in Embodiment 1 in a pixel in a display device, a display device with high emission efficiency can be fabricated. Accordingly, the display device including the light-emitting element 262a or 262b can have low power consumption.

For the other components of the light-emitting elements 262a and 262b, the components of the light-emitting element 260 or the light-emitting elements described in Embodiments 1 and 2 may be referred to.

Note that a structure described in this embodiment can be used in appropriate combination with any of the structures described in the other embodiments.

Embodiment 4

In this embodiment, a display device including a light-emitting element of one embodiment of the present invention will be described with reference to FIGS. 8A and 8B, FIGS. 9A and 9B, and FIGS. 10A and 10B.

<Structure Example 1 of Display Device>

Figure 8A:
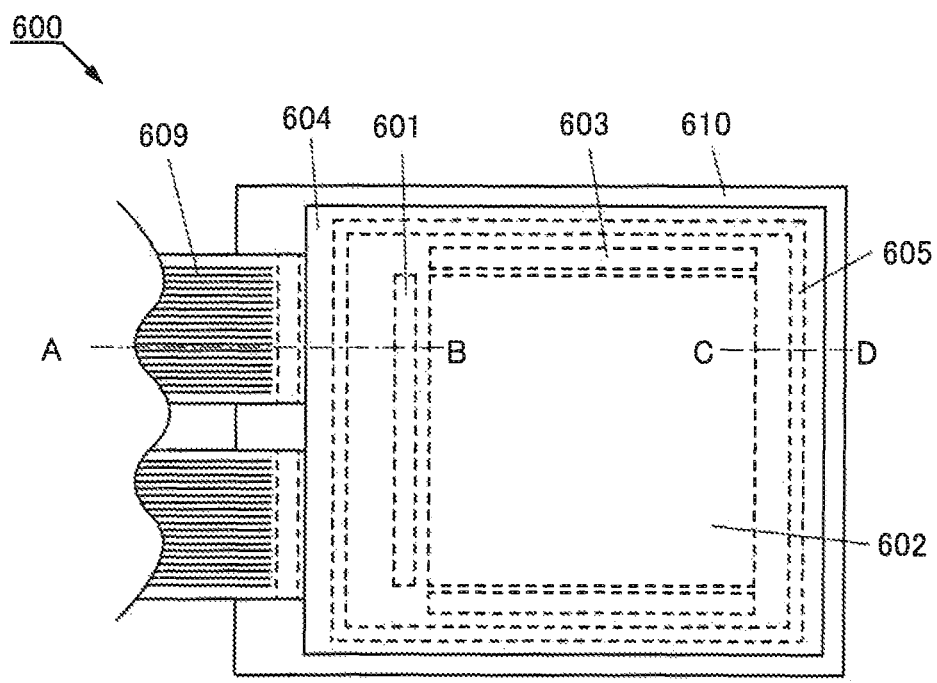
FIGS. 8A and 8B are a top view and a schematic cross-sectional view illustrating a display device of one embodiment of the present invention.
Figure 8B:
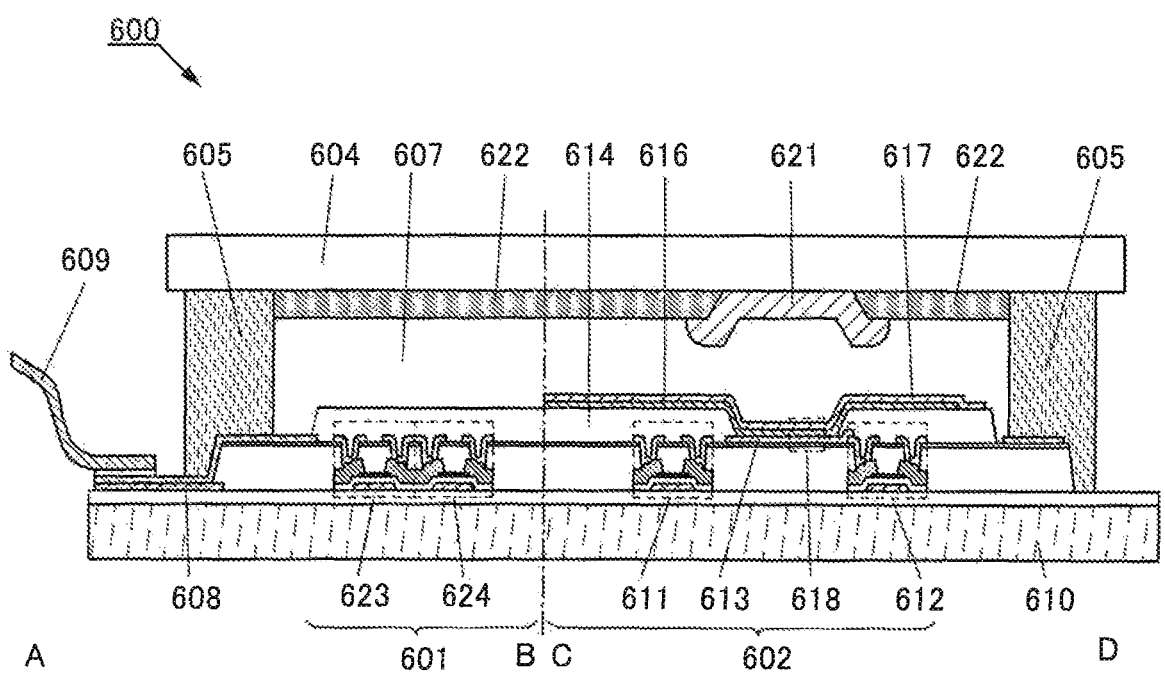

FIG. 8A is a top view illustrating a display device 600 and FIG. 8B is a cross-sectional view taken along the dashed-dotted line A-B and the dashed-dotted line C-D in FIG. 8A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 µm to 3 µm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for the transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more, and more preferably 3 eV or more, for the transistors, so that the off-state current of the transistors can be reduced. Examples of the oxide semiconductor include an In—Ga oxide, an In-M-Zn oxide (M is aluminum (Al), gallium (Ga), yttrium (Y), zirconium (Zr), lanthanum (La), cerium (Ce), tin (Sn), hafnium (Hf), or neodymium (Nd)), and the like.

An EL layer 616 and an upper electrode 617 are formed over the lower electrode 613. Here, the lower electrode 613 functions as an anode and the upper electrode 617 functions as a cathode.

In addition, the EL layer 616 is formed by any of various methods including an evaporation method (including a vacuum evaporation method) with an evaporation mask, a droplet discharge method (also referred to as an ink-jet method), a coating method such as a spin coating method, and a gravure printing method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, a display device including any of the light-emitting elements and the optical elements which are described in Embodiments 1 to 3 can be obtained.

<Structure Example 2 of Display Device>

Next, another example of the display device will be described with reference to FIGS. 9A and 9B. Note that FIGS. 9A and 9B are each a cross-sectional view of a display device of one embodiment of the present invention.

In FIG. 9A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 9A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 9A, red light, green light, and blue light transmit the coloring layers, and thus an image can be displayed with the use of pixels of three colors.

FIG. 9B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

As examples of the optical elements, the coloring layers (the red coloring layer 1034R, the green coloring layer 1034G, and the blue coloring layer 1034B) are provided between the first interlayer insulating film 1020 and the second interlayer insulating film 1021.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 10A:
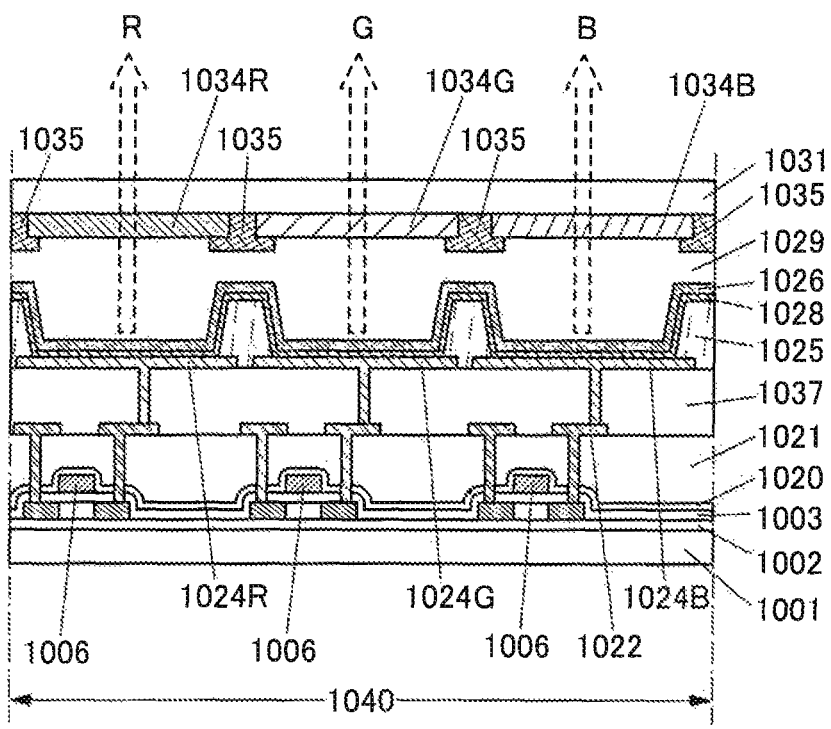
FIGS. 10A and 10B are schematic cross-sectional views each illustrating a display device of one embodiment of the present invention.
Figure 10B:
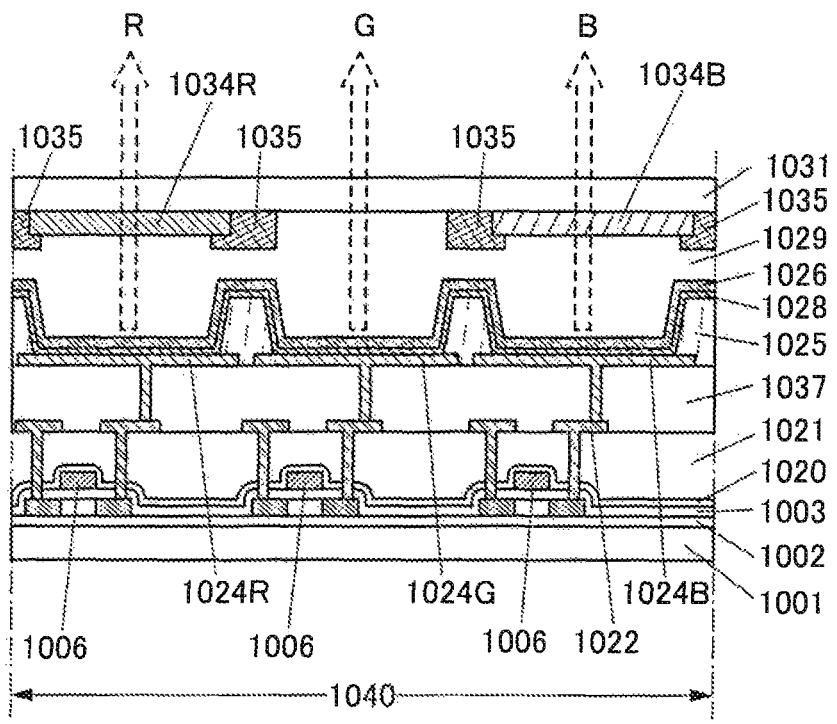

FIGS. 10A and 10B are each an example of a cross-sectional view of a display device having a top-emission structure. Note that FIGS. 10A and 10B are each a cross-sectional view illustrating the display device of one embodiment of the present invention, and the driver circuit portion 1041, the peripheral portion 1042, and the like, which are illustrated in FIGS. 9A and 9B, are not illustrated therein.

In that case, a substrate which does not transmit light can be used as the substrate 1001. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using various other materials.

The lower electrodes 1024R, 1024G, and 1024B of the light-emitting elements each function as an anode here, but may function as a cathode. Further, in the case of a display device having a top-emission structure as illustrated in FIGS. 10A and 10B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 10A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 10A illustrates the structure provided with the light-emitting elements and the coloring layers for the light-emitting elements as an example; however, the structure is not limited thereto. For example, as shown in FIG. 10B, a structure including the red coloring layer 1034R and the blue coloring layer 1034B but not including a green coloring layer may be employed to achieve full color display with the three colors of red, green, and blue. The structure as illustrated in FIG. 10A where the light-emitting elements are provided with the coloring layers is effective to suppress reflection of external light. In contrast, the structure as illustrated in FIG. 10B where the light-emitting elements are provided with the red coloring layer and the blue coloring layer but not with the green coloring layer is effective in reducing power consumption because of small energy loss of light emitted from the green-light-emitting element.

Although a display device including sub-pixels of three colors (red, green, and blue) is described above, the number of colors of sub-pixels may be four (red, green, blue, and yellow, or red, green, blue, and white). In this case, a coloring layer can be used which has a function of transmitting yellow light or a function of transmitting light of a plurality of colors selected from blue, green, yellow, and red. When the coloring layer can transmit light of a plurality of colors selected from blue, green, yellow, and red, light passing through the coloring layer may be white light. Since the light-emitting element which exhibits yellow or white light has high emission efficiency, the display device having such a structure can have lower power consumption.

Furthermore, in the display device 600 shown in FIGS. 8A and 8B, a sealing layer may be formed in the region 607 which is surrounded by the element substrate 610, the sealing substrate 604, and the sealant 605. For the sealing layer, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer in the region 607 can prevent deterioration of the light-emitting element 618 due to impurities such as water, which is preferable. Note that in the case where the sealing layer is formed, the sealant 605 is not necessarily provided.

When the sealing layer has a multilayer structure, the impurities such as water can be effectively prevented from entering the light-emitting element 618 which is inside the display device from the outside of the display device 600. In the case where the sealing layer has a multilayer structure, a resin and an inorganic material are preferably stacked.

The structures described in this embodiment can be combined as appropriate with any of the other structures in this embodiment and the other embodiments.

Embodiment 5

In this embodiment, electronic devices, a light-emitting device, and lighting devices each including the light-emitting element of one embodiment of the present invention are described with reference to FIGS. 11A to 11G, FIGS. 12A to 12C, and FIG. 13.

<Electronic Device>

FIGS. 11A to 11G show electronic devices. These electronic devices can each include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 11A to 11G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the electronic devices illustrated in FIGS. 11A to 11G can have a variety of functions without limitation to the above functions. Although not illustrated in FIGS. 11A to 11G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 11A to 11G will be described in detail below.

Figure 11A:
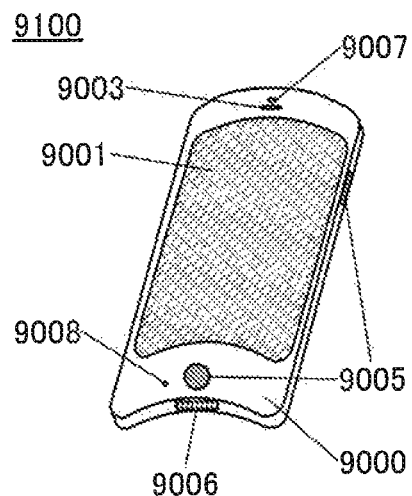
FIGS. 11A to 11G illustrate each an electronic device of one embodiment of the present invention.

FIG. 11A is a perspective view of a portable information terminal 9100. The display portion 9001 of the portable information terminal 9100 is flexible. Therefore, the display portion 9001 can be incorporated along a curved surface of a curved housing 9000. In addition, the display portion 9001 includes a touch sensor, and operation can be performed by touching the screen with a finger, a stylus, or the like. For example, when an icon displayed on the display portion 9001 is touched, an application can be started.

Figure 11D:
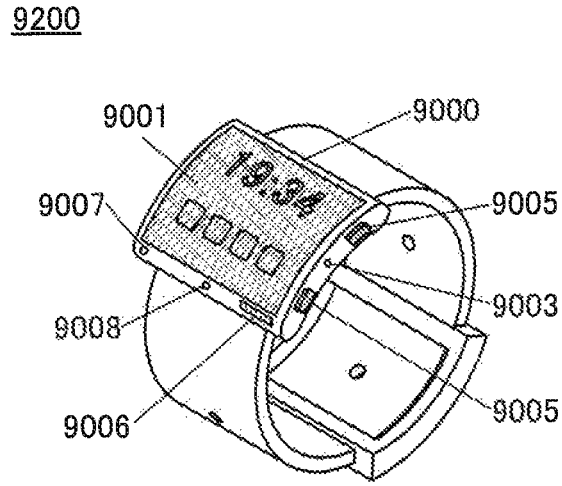
Figure 11B:
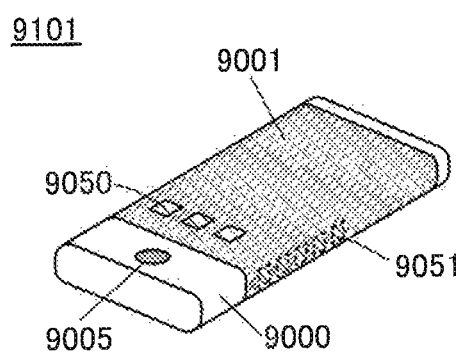

FIG. 11B is a perspective view illustrating a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in the drawing in FIG. 11A, can be positioned in the portable information terminal 9101 as in the portable information terminal 9100 illustrated in FIG. 11A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, plastic, or ceramic can be used. As a plastic, a reinforced plastic can also be used. A carbon fiber reinforced plastic (CFRP), which is a kind of reinforced plastic, has advantages of being lightweight and corrosion-free. Other examples of the reinforced plastic include one including glass fiber and one including aramid fiber. As the alloy, an aluminum alloy and a magnesium alloy can be given. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is put in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 11E:
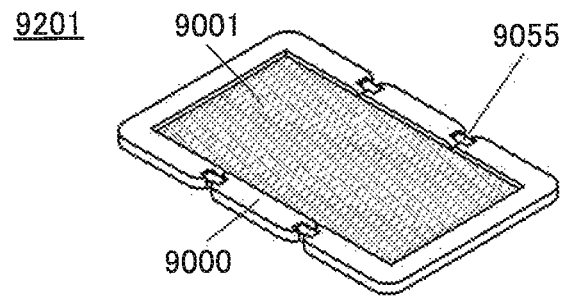
Figure 11C:
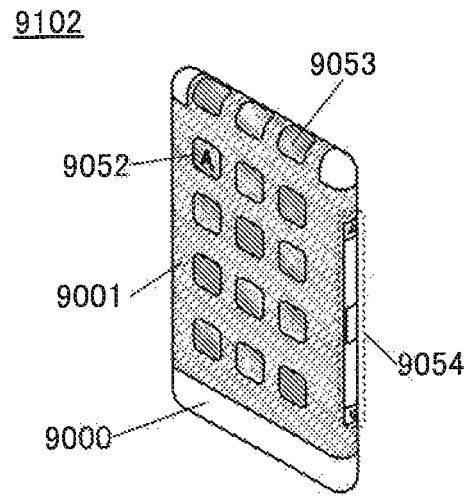

FIG. 11C is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 11D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 11F:
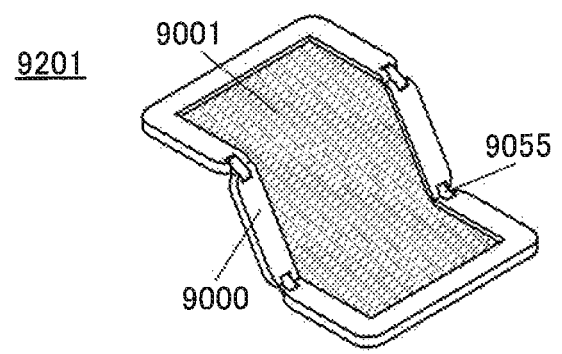
Figure 11G:
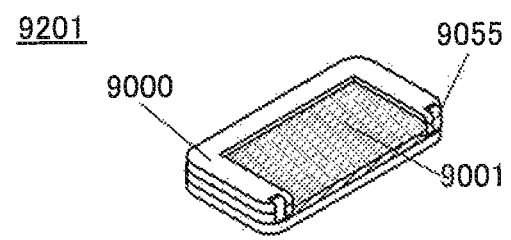

FIGS. 11E, 11F, and 11G are perspective views of a foldable portable information terminal 9201. FIG. 11E is a perspective view illustrating the portable information terminal 9201 that is opened. FIG. 11F is a perspective view illustrating the portable information terminal 9201 that is shifted from the opened state to the folded state or from the folded state to the opened state. FIG. 11G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

The electronic device or the lighting device of one embodiment of the present invention has flexibility and therefore can be incorporated along a curved inside/outside wall surface of a house or a building or a curved interior/exterior surface of a car. For example, the electronic device or the lighting device can be used for lighting for a dashboard, a windshield, a ceiling, and the like of a car.

<Light-Emitting Device>

Figure 12A:
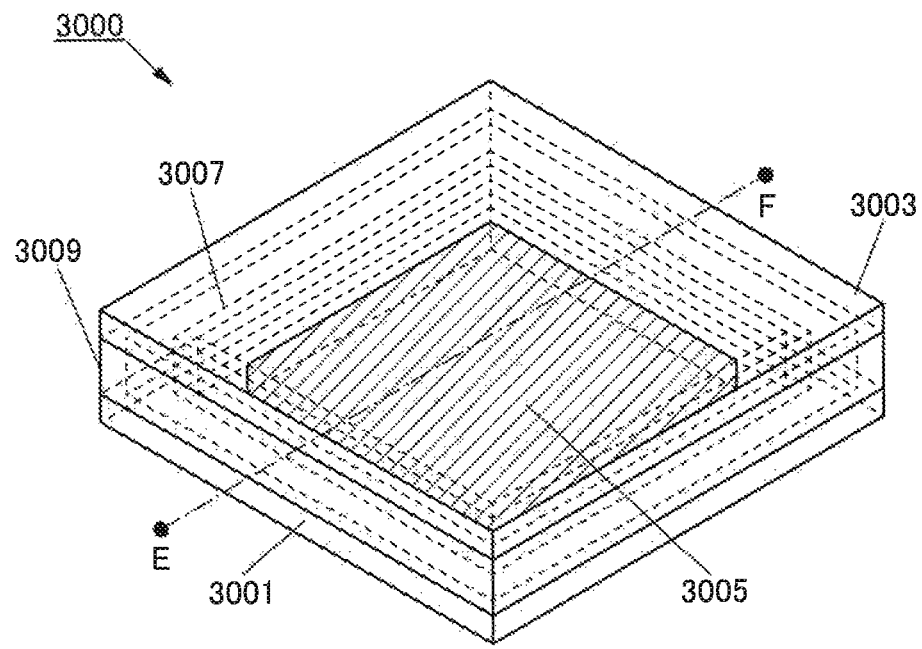
FIGS. 12A to 12C are perspective views illustrating a display device of one embodiment of the present invention.
Figure 12B:
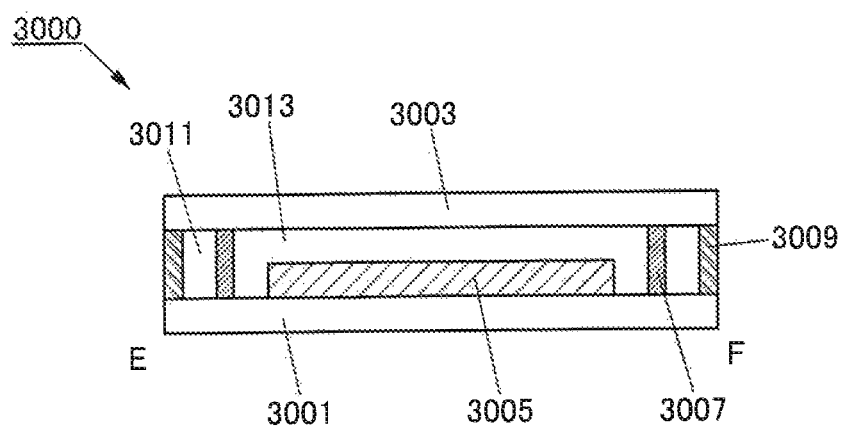

FIG. 12A is a perspective view of a light-emitting device 3000 shown in this embodiment, and FIG. 12B is a cross-sectional view along dashed-dotted line E-F in FIG. 12A. Note that in FIG. 12A, some components are illustrated by broken lines in order to avoid complexity of the drawing.

The light-emitting device 3000 illustrated in FIGS. 12A and 12B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 12A and 12B, a structure in which light is emitted from the light-emitting element 3005 to the lower side (the substrate 3001 side) is illustrated.

As illustrated in FIGS. 12A and 12B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 12B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited thereto, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 12B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 12C:
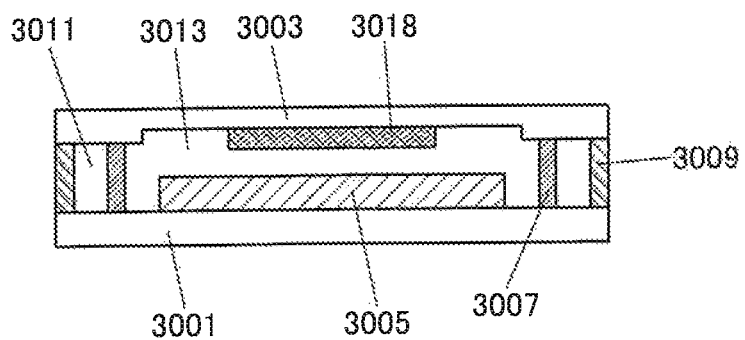

FIG. 12C illustrates a modification example of the structure in FIG. 12B. FIG. 12C is a cross-sectional view illustrating the modification example of the light-emitting device 3000.

FIG. 12C illustrates a structure in which a desiccant 3018 is provided in a recessed portion provided in part of the substrate 3003. The other components are the same as those of the structure illustrated in FIG. 12B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxides (e.g., calcium oxide, barium oxide, and the like), sulfate, metal halides, perchlorate, zeolite, silica gel, and the like.

<Lighting Device>

Figure 13:
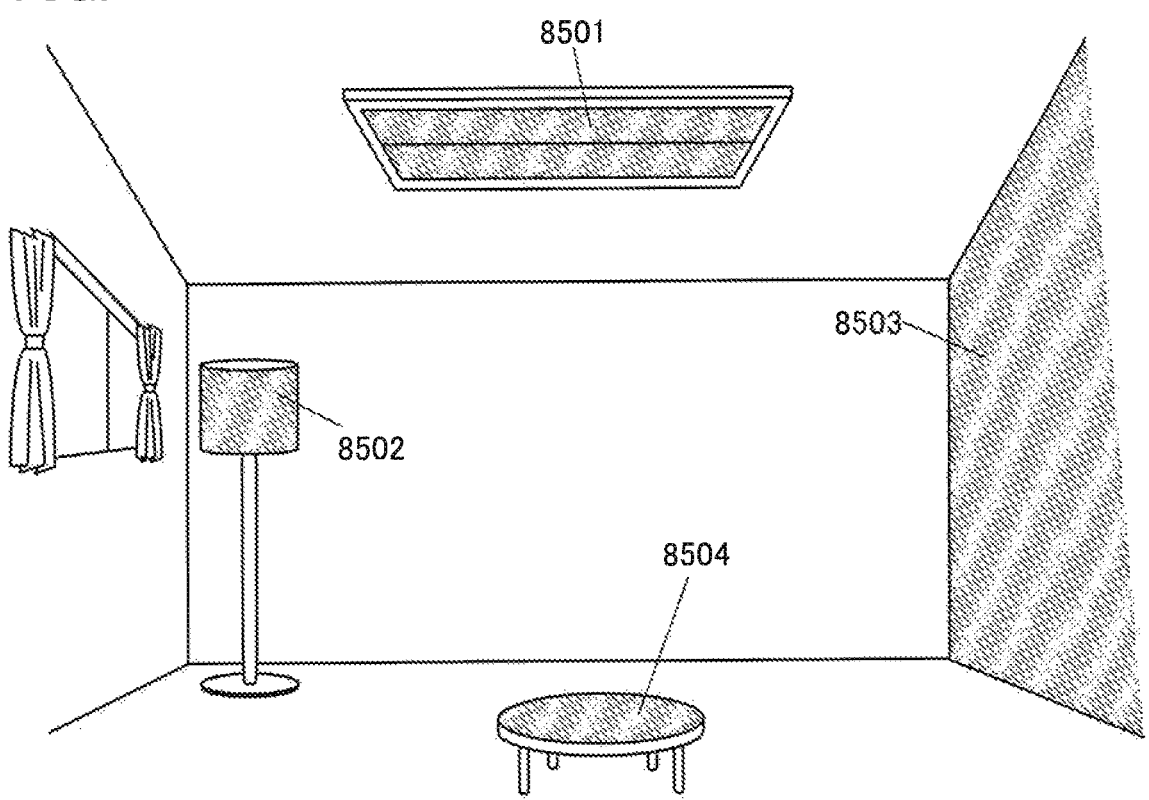
FIG. 13 illustrates a lighting device of one embodiment of the present invention.
Figure 14:
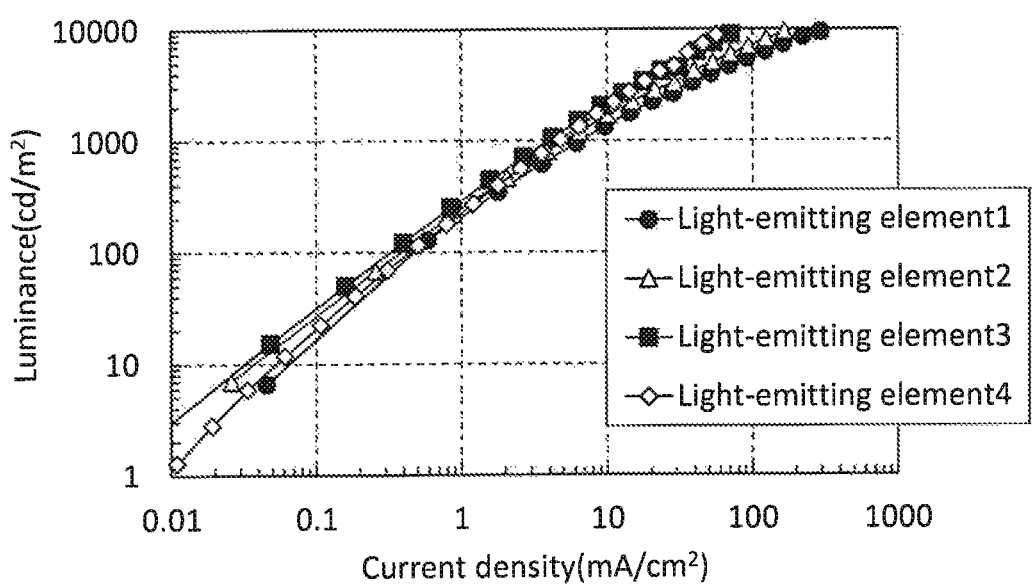
FIG. 14 shows luminance-current density characteristics of light-emitting elements of an example.
Figure 15:
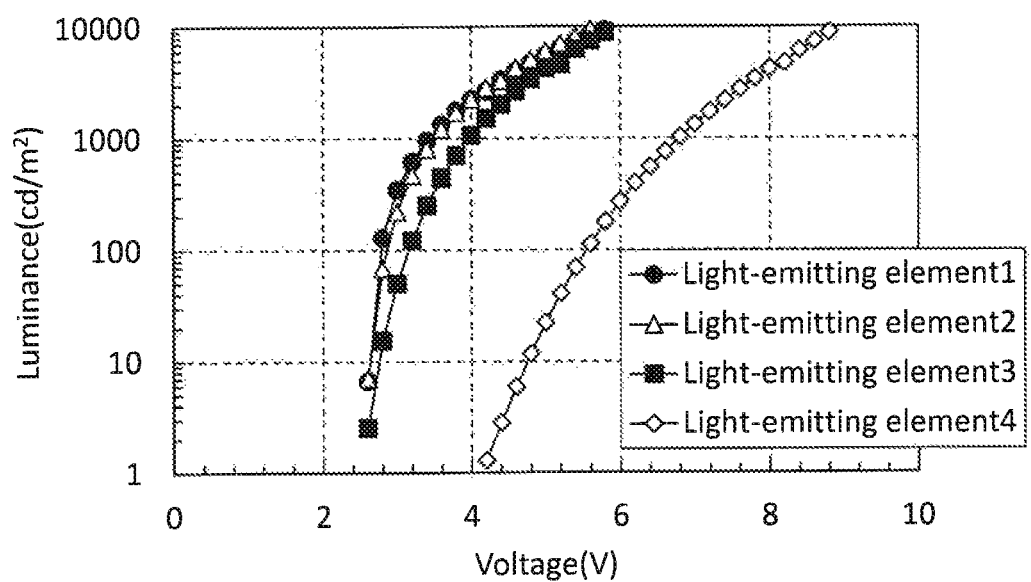
FIG. 15 shows luminance-voltage characteristics of light-emitting elements of an example.
Figure 16:
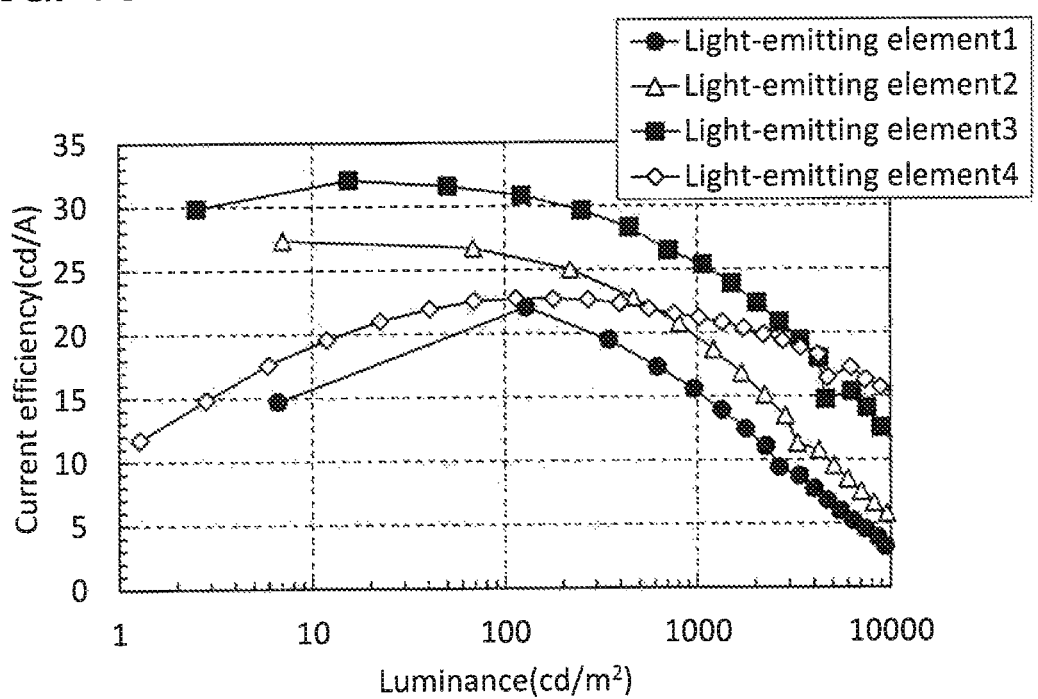
FIG. 16 shows current efficiency-luminance characteristics of light-emitting elements of an example.
Figure 17:
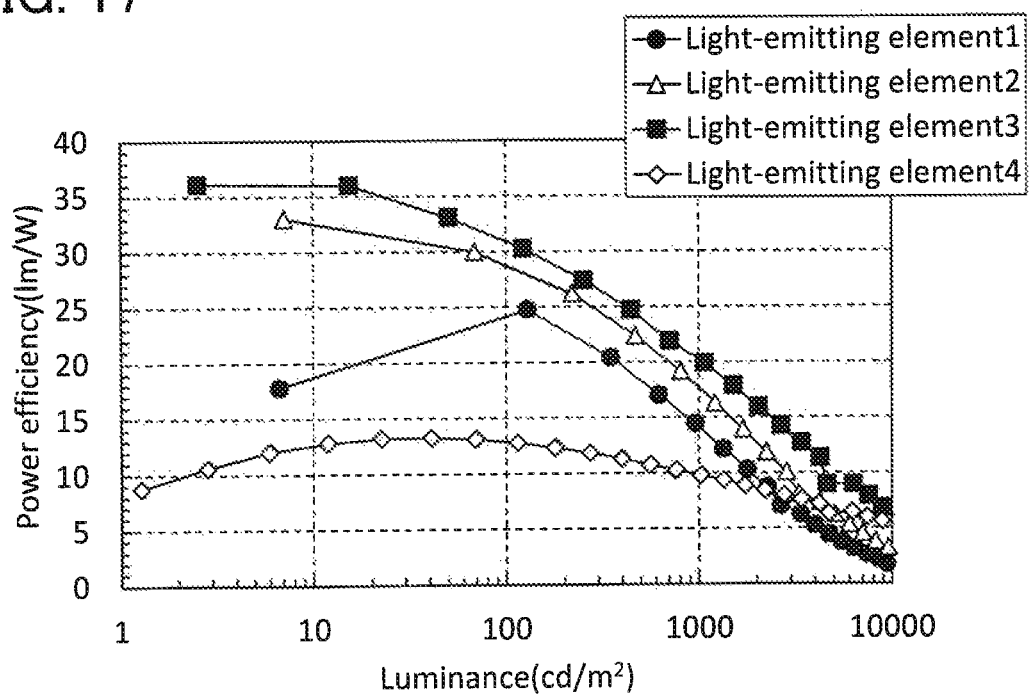
FIG. 17 shows power efficiency-luminance characteristics of light-emitting elements of an example.

FIG. 13 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. The light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, display modules, light-emitting devices, electronic devices, and lighting devices can be obtained by application of the light-emitting element of one embodiment of the present invention. Note that the light-emitting element can be used for electronic devices in a variety of fields without being limited to the lighting devices and the electronic devices described in this embodiment.

The structure described in this embodiment can be combined with any of the structures described in the other embodiments as appropriate.

EXAMPLE 1

In this example, examples of fabricating light-emitting elements of embodiments of the present invention and characteristics of the light-emitting elements are described. The structure of each of the light-emitting elements fabricated in this example is the same as that illustrated in FIG. 1. Table 1 and Table 2 show the detailed structures of the elements. In addition, structures and abbreviations of compounds used here are given below.

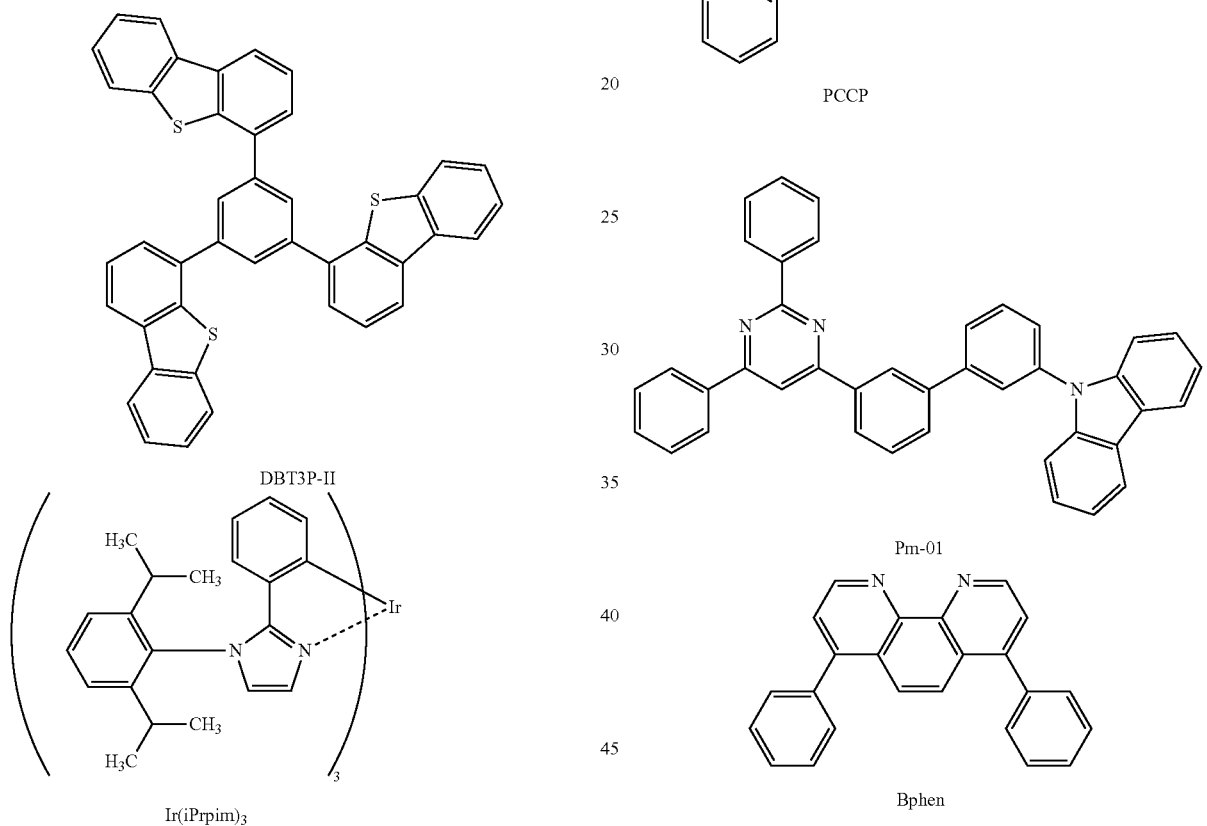

TABLE 1

| | Layer | Reference numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118 (2) | 15 | BPhen | — |
| | | 118 (1) | 10 | Pm-01 | — |
| | Light-emitting layer | 130 | 30 | Pm-01:Ir(iPrpim)$_3$ | 1:0.06 |
| | Hole-transport layer | 112 | 20 | PCCP | — |
| | Hole-injection layer | 111 | 60 | DBT3P-II:MoO$_3$ | 1:0.5 |
| | Electrode | 101 | 110 | ITSO | — |
| Light-emitting element 2 | Electrode | 102 | 200 | Al | — |
| | Electron-injection layer | 119 | 1 | LiF | — |
| | Electron-transport layer | 118 (2) | 15 | BPhen | — |
| | | 118 (1) | 10 | Pm-01 | — |

TABLE 1-continued

|  | Layer | Reference numeral | Thickness (nm) | Material | Weight ratio |
|---|---|---|---|---|---|
|  | Light-emitting layer | 130 | 30 | PCCP:Pm-01:Ir(iPrpim)$_3$ | 0.33:0.66:0.06 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |
| Light-emitting element 3 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Pm-01:Ir(iPrpim)$_3$ | 0.66:0.33:0.06 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |
| Light-emitting element 4 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Ir(iPrpim)$_3$ | 1:0.06 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |

TABLE 2

|  | Layer | Reference numeral | Thickness (nm) | Material | Weight ratio |
|---|---|---|---|---|---|
| Light-emitting element 5 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Pm-01:Ir(iPrpim)$_3$ | 0.3:0.6:0.05 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |
| Light-emitting element 6 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Pm-01:Ir(iPrpim)$_3$ | 0.3:0.6:0.1 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |
| Light-emitting element 7 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Pm-01:Ir(iPrpim)$_3$ | 0.3:0.6:0.2 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |
| Light-emitting element 8 | Electrode | 102 | 200 | Al | — |
|  | Electron-injection layer | 119 | 1 | LiF | — |
|  | Electron-transport layer | 118 (2) | 15 | BPhen | — |
|  |  | 118 (1) | 10 | Pm-01 | — |
|  | Light-emitting layer | 130 | 30 | PCCP:Pm-01:Ir(iPrpim)$_3$ | 0.3:0.6:0.3 |
|  | Hole-transport layer | 112 | 20 | PCCP | — |
|  | Hole-injection layer | 111 | 60 | DBT3P-II:MoO$_3$ | 1:0.5 |
|  | Electrode | 101 | 110 | ITSO | — |

<Fabrication of Light-Emitting Elements>

Methods for fabricating light-emitting elements of this example are described below.

<Fabrication of Light-Emitting Element 1>

As the electrode 101, an ITSO film was formed to a thickness of 110 nm over a glass substrate. The electrode area of the electrode 101 was set to 4 mm$^2$ (2 mm×2 mm).

As the hole-injection layer 111, DBT3P-II and molybdenum oxide (MoO$_3$) were deposited over the electrode 101 by co-evaporation in a weight ratio of DBT3P-II:MoO$_3$=1:0.5 to a thickness of 60 nm.

Next, as the hole-transport layer 112, PCCP was deposited over the hole-injection layer 111 by evaporation to a thickness of 20 nm.

Next, as the light-emitting layer 130, 4-[3'-(9H-carbazol-9-yl)-1,1'-biphenyl-3-yl]-2,6-diphenylpyrimidine (abbreviation: Pm-01) and tris{2-[1-(2,6-diisopropylphenyl)-1H-imidazol-2-yl-κN$^3$]phenyl-κC}iridium(III) (abbreviation: Ir(iPrpim)$_3$) were deposited over the hole-transport layer 112 by co-evaporation in a weight ratio of Pm-01:Ir(iPrpim)$_3$=1:0.06 to a thickness of 30 nm. In the light-emitting layer 130, Ir(iPrpim)$_3$ is the guest material (first organic compound), and Pm-01 is the host material (second organic compound).

As the electron-transport layer 118, Pm-01 and BPhen were sequentially deposited over the light-emitting layer 130 by evaporation to thicknesses of 10 nm and 15 nm, respectively. Then, as the electron-injection layer 119, LiF was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 1 was sealed by fixing a glass substrate for sealing to a glass substrate on which the organic materials were deposited using a sealant for an organic EL device. Specifically, after the sealant was applied to surround the organic materials deposited on the glass substrate and these glass substrates were bonded to each other, irradiation with ultraviolet light having a wavelength of 365 nm at 6 J/cm$^2$ and heat treatment at 80° C. for one hour were performed. Through the process, the light-emitting element 1 was obtained.

<Fabrication of Light-Emitting Elements 2 to 8>

The light-emitting elements 2 to 8 were fabricated through the same steps as those for the light-emitting element 1 except for the step of forming the light-emitting layer 130.

As the light-emitting layer 130 of the light-emitting element 2, PCCP, Pm-01, and Ir(iPrpim)$_3$ were deposited by co-evaporation in a weight ratio of PCCP:Pm-01:Ir(iPrpim)$_3$=0.33:0.66:0.06 to a thickness of 30 nm.

As the light-emitting layer 130 of the light-emitting element 3, PCCP, Pm-01, and Ir(iPrpim)$_3$ were deposited by co-evaporation in a weight ratio of PCCP:Pm-01:Ir(iPrpim)$_3$=0.66:0.33:0.06 to a thickness of 30 nm.

As the light-emitting layer 130 of the light-emitting element 4, PCCP and Ir(iPrpim)$_3$ were deposited by co-evaporation in a weight ratio of PCCP:Ir(iPrpim)$_3$=1:0.06 to a thickness of 30 nm. Note that the light-emitting element 4 is a comparative light-emitting element in which the light-emitting layer does not include the second organic compound Pm-01.

As the light-emitting layer 130 of the light-emitting element 5, PCCP, Pm-01, and Ir(iPrpim)$_3$ were deposited by co-evaporation in a weight ratio of PCCP:Pm-01:Ir(iPrpim)$_3$=0.3:0.6:0.05 to a thickness of 30 nm.

As the light-emitting layer 130 of the light-emitting element 6, PCCP, Pm-01, and Ir(iPrpim)$_3$ were deposited by co-evaporation in a weight ratio of PCCP:Pm-01:Ir(iPrpim)$_3$=0.3:0.6:0.1 to a thickness of 30 nm.

As the light-emitting layer 130 of the light-emitting element 7, PCCP, Pm-01, and Ir(iPrpim)$_3$ were deposited by co-evaporation in a weight ratio of PCCP:Pm-01:Ir(iPrpim)$_3$=0.3:0.6:0.2 to a thickness of 30 nm.

As the light-emitting layer 130 of the light-emitting element 8, PCCP, Pm-01, and Ir(iPrpim)$_3$ were deposited by co-evaporation in a weight ratio of PCCP:Pm-01:Ir(iPrpim)$_3$=0.3:0.6:0.3 to a thickness of 30 nm.

<Characteristics of Light-Emitting Elements>

Next, the characteristics of the fabricated light-emitting elements 1 to 8 were measured. For measuring the luminance and the CIE chromaticity, a luminance colorimeter (BM-5A produced by Topcon Technohouse Corporation) was used. For measuring the electroluminescence spectrum, a multi-channel spectrometer (PMA-11 produced by Hamamatsu Photonics K.K.) was used.

FIGS. 14, 15, 16, and 17 show luminance-current density characteristics, luminance-voltage characteristics, current efficiency-luminance characteristics, and power efficiency-luminance characteristics, respectively, of the light-emitting elements 1 to 4. FIGS. 20, 21, 22, and 23 show luminance-current density characteristics, luminance-voltage characteristics, current efficiency-luminance characteristics, and power efficiency-luminance characteristics, respectively, of the light-emitting elements 5 to 8. The measurements of the light-emitting elements were performed at room temperature (in an atmosphere kept at 23° C.).

Tables 3 and 4 show element characteristics of the light-emitting elements 1 to 8 at around 1000 cd/m$^2$.

TABLE 3

|  | Voltage (V) | Current density (mA/cm$^2$) | CIE-chromaticity (x, y) | Luminance (cd/m$^2$) | Current efficiency (cd/A) | Power efficiency (lm/W) |
|---|---|---|---|---|---|---|
| Light-emitting element 1 | 3.40 | 6.14 | (0.278, 0.431) | 960 | 15.6 | 14.4 |
| Light-emitting element 2 | 3.40 | 3.87 | (0.261, 0.414) | 800 | 20.7 | 19.2 |
| Light-emitting element 3 | 4.00 | 4.20 | (0.225, 0.371) | 1070 | 25.3 | 19.9 |
| Light-emitting element 4 | 6.80 | 4.82 | (0.185, 0.313) | 1020 | 21.2 | 9.8 |

TABLE 4

|  | Voltage (V) | Current density (mA/cm$^2$) | CIE-chromaticity (x, y) | Luminance (cd/m$^2$) | Current efficiency (cd/A) | Power efficiency (lm/W) |
|---|---|---|---|---|---|---|
| Light-emitting element 5 | 4.00 | 4.60 | (0.227, 0.376) | 1090 | 23.8 | 18.7 |

TABLE 4-continued

| | Voltage (V) | Current density (mA/cm$^2$) | CIE-chromaticity (x, y) | Luminance (cd/m$^2$) | Current efficiency (cd/A) | Power efficiency (lm/W) |
|---|---|---|---|---|---|---|
| Light-emitting element 6 | 4.00 | 3.83 | (0.241, 0.392) | 930 | 24.4 | 19.2 |
| Light-emitting element 7 | 4.00 | 4.21 | (0.293, 0.438) | 850 | 20.2 | 15.9 |
| Light-emitting element 8 | 4.00 | 4.89 | (0.321, 0.456) | 890 | 18.1 | 14.2 |

Figure 18:
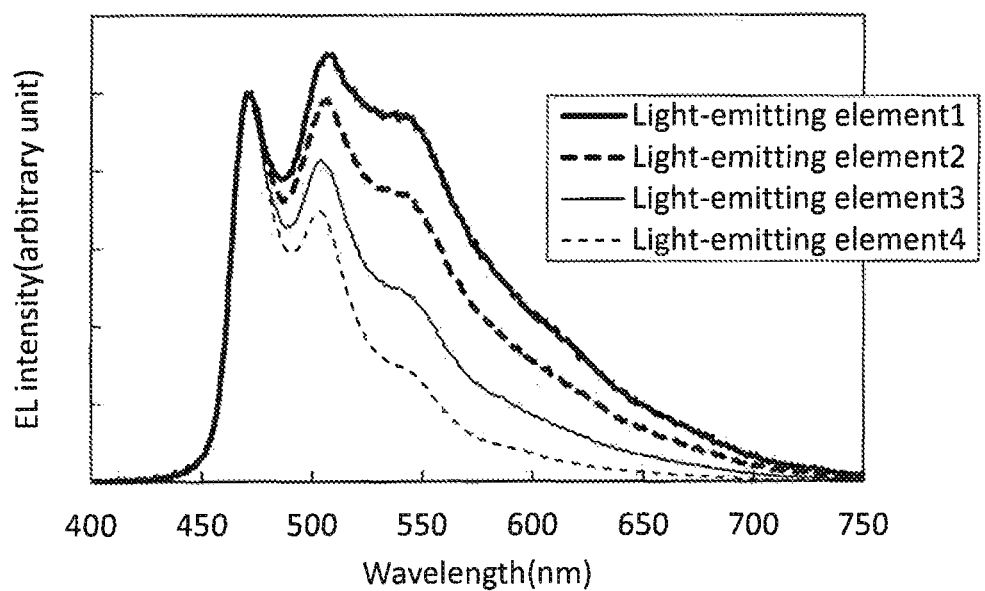
FIG. 18 shows electroluminescence spectra of light-emitting elements of an example.
Figure 24:
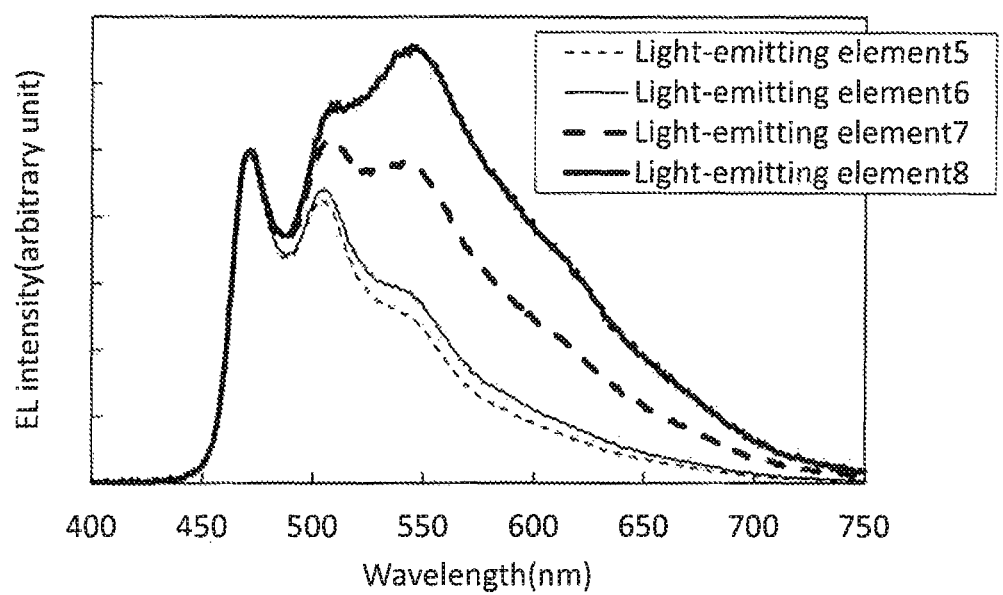
FIG. 24 shows electroluminescence spectra of light-emitting elements of an example.

FIGS. 18 and 24 show electroluminescence spectra when a current with a current density of 2.5 mA/cm$^2$ flows through the light-emitting elements 1 to 4 and the light-emitting elements 5 to 8.

As shown in FIG. 18 and FIG. 24, the electroluminescence spectrum of the light-emitting element 4 has a peak at a wavelength of 470 nm and indicates mainly blue light emission. Meanwhile, the electroluminescence spectra of the light-emitting elements 1 to 3 and the light-emitting elements 5 to 8 not only have a peak at a wavelength of 470 nm and indicate blue light emission but also indicate broad light emission in a wavelength range of green to yellow. In the light-emitting elements 1 to 8, the full widths at half maximum of the electroluminescence spectra are 119 nm, 106 nm, 75 nm, 54 nm, 83 nm, 92 nm, 134 nm, and 153 nm, respectively. The electroluminescence spectra of the light-emitting elements 1 to 3 and the light-emitting elements 5 to 8 have a broader spectrum shape than the electroluminescence spectrum of the light-emitting element 4. Meanwhile, the electroluminescence spectrum of the light-emitting element 4 has a narrow spectrum shape, and thus indicates mainly light emitted from the guest material Ir(iPrpim)$_3$.

Figure 19:
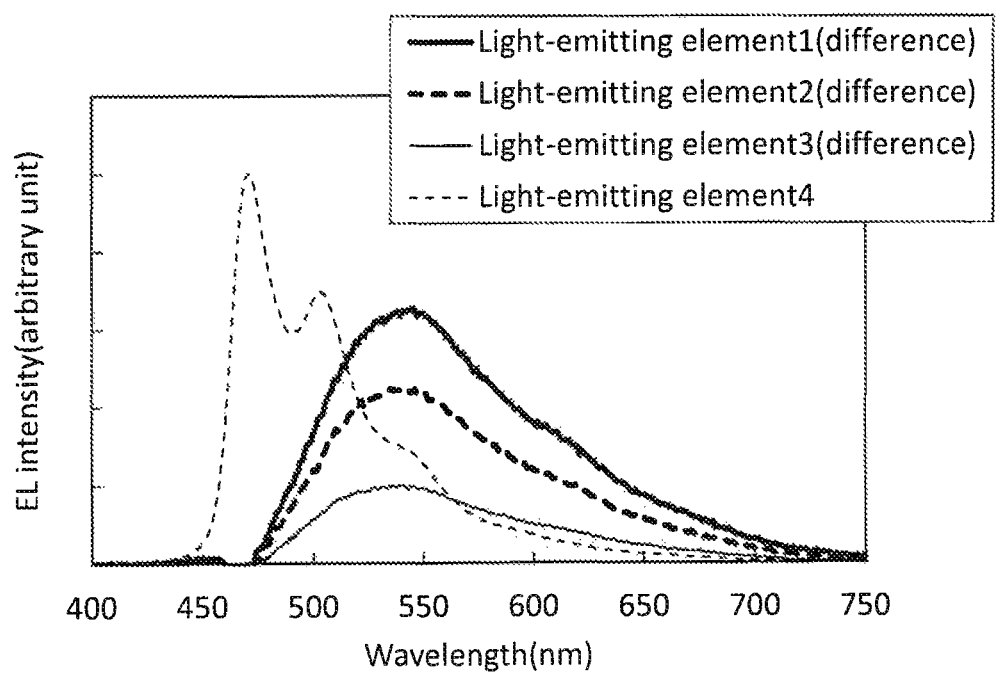
FIG. 19 shows electroluminescence spectra of light-emitting elements of an example.
Figure 20:
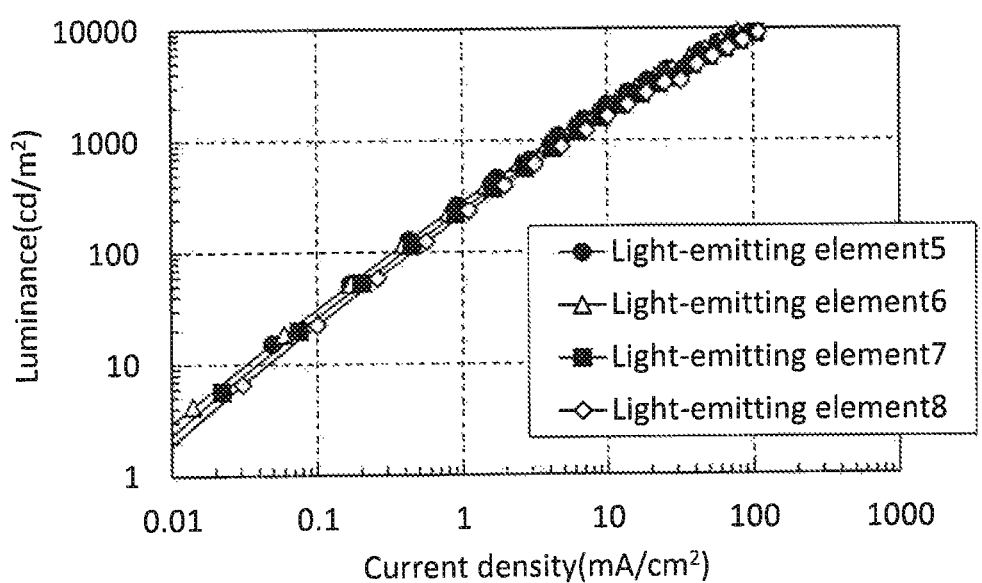
FIG. 20 shows luminance-current density characteristics of light-emitting elements of an example.
Figure 21:
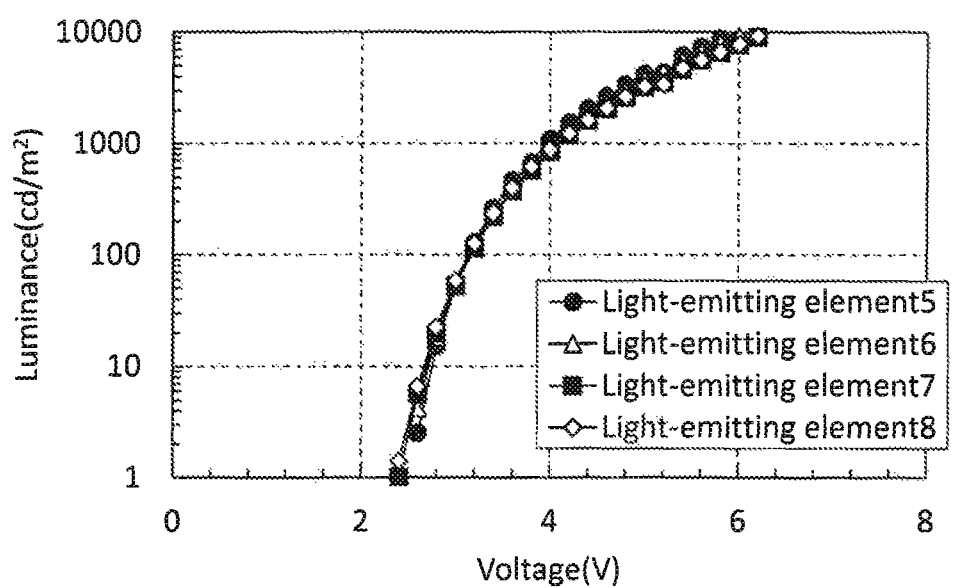
FIG. 21 shows luminance-voltage characteristics of light-emitting elements of an example.
Figure 22:
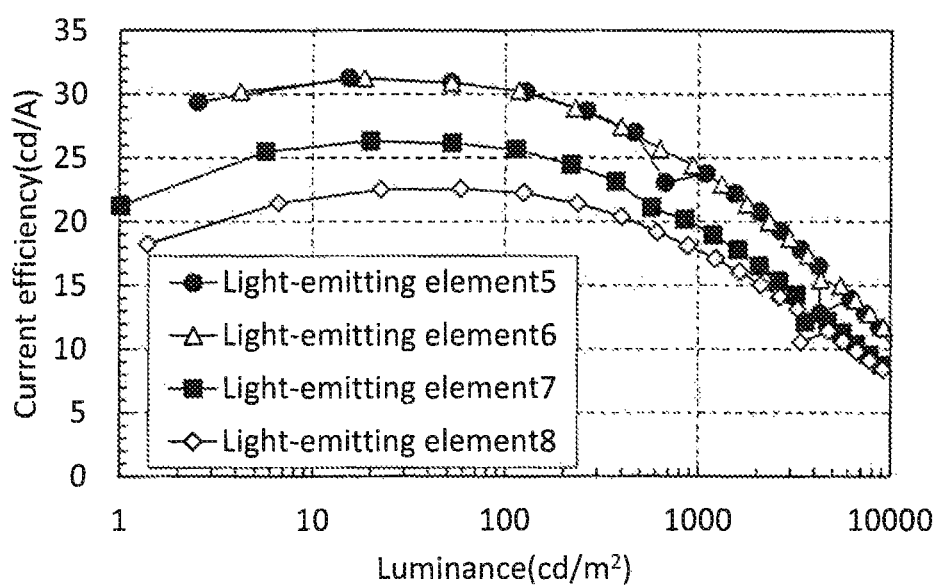
FIG. 22 shows current efficiency-luminance characteristics of light-emitting elements of an example.
Figure 23:
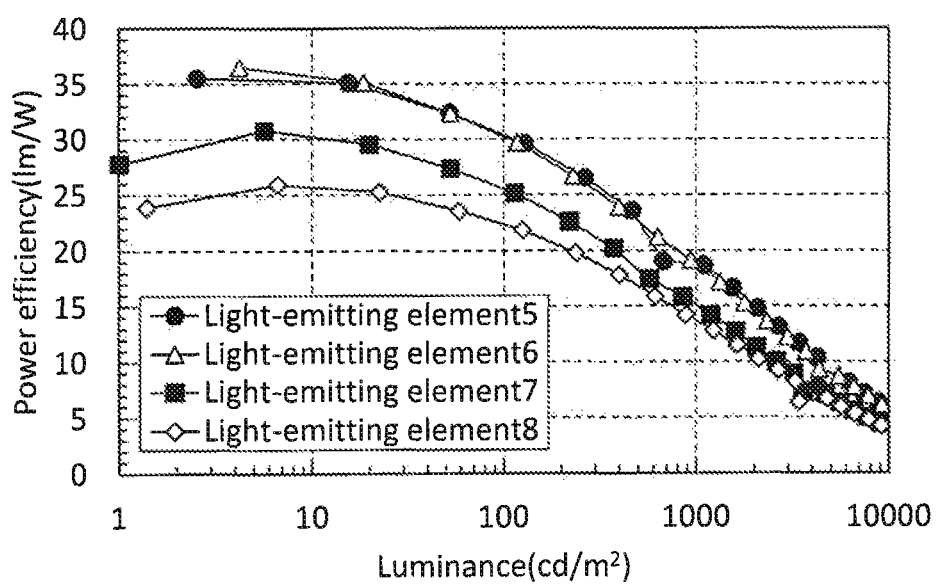
FIG. 23 shows power efficiency-luminance characteristics of light-emitting elements of an example.
Figure 25:
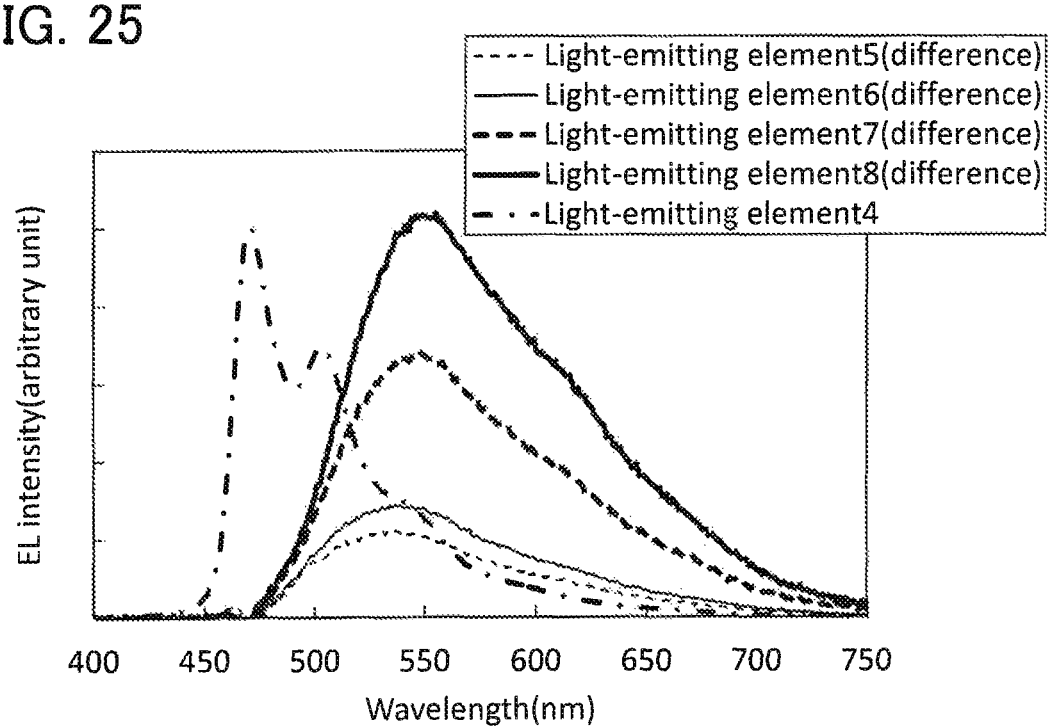
FIG. 25 shows electroluminescence spectra of light-emitting elements of an example.

Next, difference spectra obtained by subtracting the electroluminescence spectrum of the light-emitting element 4 from each of the electroluminescence spectra of the light-emitting elements 1 to 3 and the light-emitting elements 5 to 8 normalized by the intensity of the peak wavelength of the light-emitting element 4 are shown in FIG. 19 and FIG. 25. As can be seen from FIG. 19 and FIG. 25, the light-emitting elements 1 to 3 and the light-emitting elements 5 to 8 exhibit broad light emission in the yellow wavelength range in addition to the light emission of the guest material indicated by the electroluminescence spectrum of the light-emitting element 4. Furthermore, the peak wavelengths of the broad light emission approximately range from 540 nm to 550 nm. Furthermore, the intensity ratios of the light emission of the guest material to the broad light emission in the light-emitting element 1, the light-emitting element 2, the light-emitting element 3, the light-emitting element 5, the light-emitting element 6, the light-emitting element 7, and the light-emitting element 8 are 1:0.65, 1:0.45, 1:0.20, 1:0.22, 1:0.29, 1:0.68, and 1:1.04, respectively.

As will be described later, the combination of Pm-01 and Ir(iPrpim)$_3$ used in the light-emitting layers of the light-emitting elements 1 to 3 and the light-emitting elements 5 to 8 forms an exciplex. Thus, it can be said that the reason behind the broad spectrum shapes of the light-emitting elements 1 to 3 and the light-emitting elements 5 to 8 lies in the fact that light emission is obtained from the exciplex which is formed by Pm-01 and Ir(iPrpim)$_3$.

The light-emitting element 2 and the light-emitting element 3 include PCCP (third organic compound) in an addition to Pm-01 (second organic compound) and Ir(iPrpim)$_3$ (first organic compound). The light-emitting element 1 does not include PCCP (third organic compound). The light-emitting element 4 does not include Pm-01 (second organic compound). The light-emitting element 3 has a higher proportion of PCCP than the light-emitting element 2. Thus, it is found that the proportion of the broad light emission originating from the exciplex formed by Pm-01 (second organic compound) and Ir(iPrpim)$_3$ (first organic compound) differs between the light-emitting elements 1 to 4. In this manner, by changing the proportion of PCCP (third organic compound) in the light-emitting layer, the interaction between Pm-01 (second organic compound) and Ir(iPrpim)$_3$ (first organic compound) can be controlled; and thus, the generation ratio of the exciplex formed by Pm-01 (second organic compound) and Ir(iPrpim)$_3$ (first organic compound) can be controlled. As a result, the emission color of a light-emitting element can be controlled.

Furthermore, the proportion of Ir(iPrpim)$_3$ (first organic compound) in the light-emitting layers steadily increases from the light-emitting element 5 to the light-emitting element 8. It is found that owing to this, the proportion of the broad light emission originating from the exciplex formed by Pm-01 (second organic compound) and Ir(iPrpim)$_3$ (first organic compound) differs between the light-emitting elements 5 to 8. In this manner, by changing the proportion of Ir(iPrpim)$_3$ (first organic compound) in the light-emitting layer, the interaction between Pm-01 (second organic compound) and Ir(iPrpim)$_3$ (first organic compound) can be controlled; and thus, the generation ratio of the exciplex formed by Pm-01 (second organic compound) and Ir(iPrpim)$_3$ (first organic compound) can be controlled. As a result, the emission color of a light-emitting element can be controlled.

As can be seen from FIGS. 14 to 17, FIGS. 20 to 23, and Tables 3 and 4, the light-emitting elements 1 to 3 and the light-emitting elements 5 to 8 are driven at a lower voltage than the light-emitting element 4. Furthermore, the power efficiency of each of the light-emitting elements 1 to 3 and the light-emitting elements 5 to 8 is higher than that of the light-emitting element 4, that is, higher than or equal to 10 lm/W. Accordingly, the light-emitting element of one embodiment of the present invention including the first organic compound (Ir(iPrpim)$_3$) and the second organic compound (Pm-01) can be driven at a low voltage and has a low power consumption.

Furthermore, it is found that the light-emitting element 2, the light-emitting element 3, and the light-emitting elements 5 to 8 have a current efficiency of higher than or equal to 20 cd/A. In other words, a light-emitting element having a structure in which a light-emitting layer includes another material (PCCP) in addition to the first organic compound (Ir(iPrpim)$_3$) and the second organic compound (Pm-01) has a high current efficiency.

<Results of CV Measurement>

The electrochemical characteristics (oxidation reaction characteristics and reduction reaction characteristics) of the above compounds were measured by cyclic voltammetry (CV) measurement. Note that for the measurement, an electrochemical analyzer (ALS model 600A or 600C, produced by BAS Inc.) was used, and measurement was performed on a solution obtained by dissolving each compound in N,N-dimethylformamide (abbreviation: DMF). In the measurements, the potential of a working electrode with respect to the reference electrode was changed within an appropriate range, so that the oxidation peak potential and the reduction peak potential were each obtained. In addition, the HOMO and LUMO levels of each compound were calculated from the estimated redox potential of the reference electrode of −4.94 eV and the obtained peak potentials.

According to the CV measurement results, the oxidation potential and the reduction potential of Pm-01 were 0.95 V and −2.17 V, respectively. In addition, the HOMO level and the LUMO level of Pm-01, which were calculated from the CV measurement, were −5.89 eV and −2.78 eV, respectively. Thus, the LUMO level of Pm-01 was found to be low. Furthermore, the oxidation potential of Ir(iPrpim)$_3$ was 0.11 V. The HOMO level of Ir(iPrpim)$_3$, which was calculated from the CV measurement, was -31 5.05 eV. Thus, the HOMO level of Ir(iPrpim)$_3$ was found to be high. Note that the LUMO level of Ir(iPrpim)$_3$ was probably high because the reduction potential of Ir(iPrpim)$_3$ was low and a clear reduction peak was not observed. Furthermore, the oxidation potential and the reduction potential of PCCP were 0.685 V and −2.98 V, respectively. In addition, the HOMO level and the LUMO level of PCCP, which were calculated from the CV measurement, were −5.63 eV and −1.96 eV, respectively.

As described above, the LUMO level of Pm-01 is lower than the LUMO level of PCCP and the LUMO level of Ir(iPrpim)$_3$, and the HOMO level of Ir(iPrpim)$_3$ is higher than the HOMO level of PCCP and the HOMO level of Pm-01. Thus, in the case where the compounds are used in a light-emitting layer as in the light-emitting elements 1 to 3 and the light-emitting elements 5 to 8, electrons and holes serving as carriers are efficiently injected from a pair of electrodes into Pm-01 and Ir(iPrpim)$_3$, so that Pm-01 and Ir(iPrpim)$_3$ can form an exciplex.

The exciplex formed by Pm-01 and Ir(iPrpim)$_3$ has the LUMO level in Pm-01 and the HOMO level in Ir(iPrpim)$_3$. The energy difference between the LUMO level of Pm-01 and the HOMO level of Ir(iPrpim)$_3$ is 2.28 eV. This value is substantially equal to the light emission energy calculated from the peak wavelength of the electroluminescence spectrum of the light-emitting element 8 in FIG. 24 (2.28 eV). Furthermore, this value is also substantially equal to the light emission energy in a broad wavelength range of the electroluminescence spectra of the light-emitting elements 1 to 3 (FIG. 18) and the light-emitting element 5 to 7 (FIG. 24). These results imply that the electroluminescence spectra of the light-emitting elements 1 to 3 and the light-emitting elements 5 to 8 indicate light emission from the exciplex formed by Pm-01 and Ir(iPrpim)$_3$ and light emission from Ir(iPrpim)$_3$. Note that since the difference between the S1 level and the T1 level of the exciplex is small, the light emission energy can be regarded as the energy of the T1 level of the exciplex (2.28 eV).

<Measurement of T1 Level>

Next, in order to obtain the T1 levels of the compounds used in the light-emitting layer 130, thin films of Pm-01 and PCCP were each fabricated over a quartz substrate by a vacuum evaporation method, and then the emission spectra of these thin films were measured at a low temperature (10 K).

The measurement was performed at a measurement temperature of 10 K with a PL microscope, LabRAM HR-PL, produced by HORIBA, Ltd., a He-Cd laser having a wavelength of 325 nm as excitation light, and a CCD detector.

Figure 26:
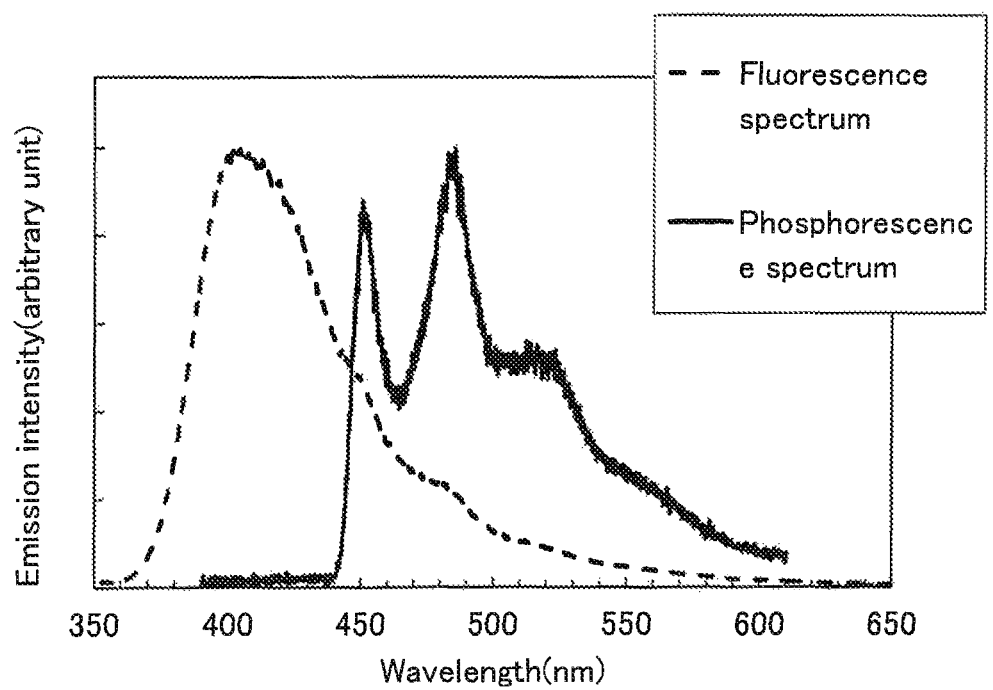
FIG. 26 shows emission spectra of a thin film of an example.
Figure 27:
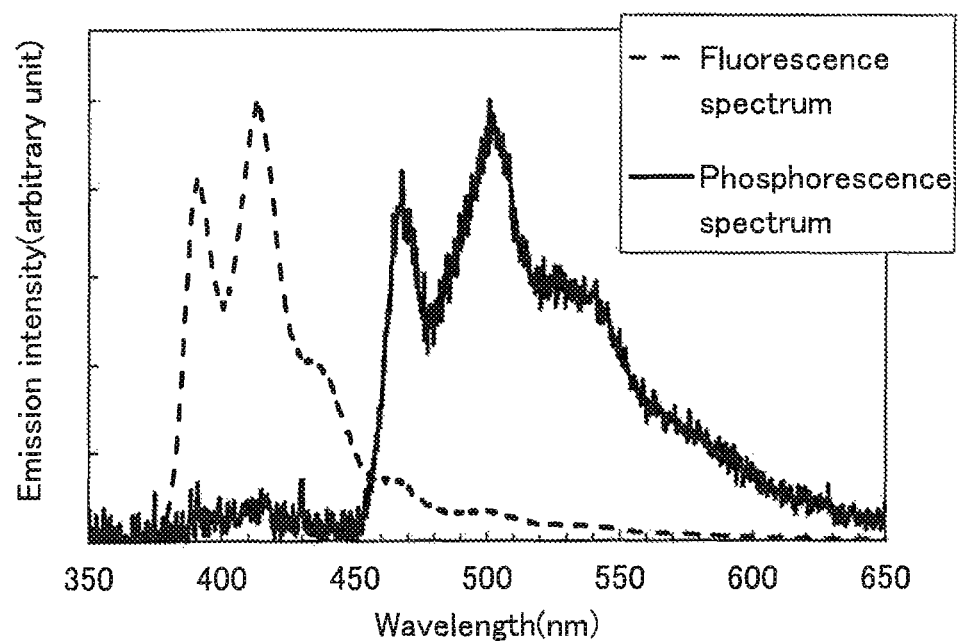
FIG. 27 shows emission spectra of a thin film of an example.

In the measurement of the emission spectra, in addition to the normal measurement of emission spectra, the measurement of time-resolved emission spectra in which light emission with a long lifetime is focused on was also performed. Since the measurement temperature was set to a low temperature (10 K) in this measurement of emission spectra, in the normal measurement of emission spectra, in addition to fluorescence, which is the main emission component, phosphorescence was observed. Furthermore, in the measurement of time-resolved emission spectra in which light emission with a long lifetime is focused on, phosphorescence was mainly observed. The time-resolved emission spectra of Pm-01 and PCCP measured at a low temperature are shown in FIG. 26 and FIG. 27, respectively.

As shown in the measurement results of the emission spectra, the emission spectrum of Pm-01 has a peak (including a shoulder) of the phosphorescent component on the shortest wavelength side at 451 nm, and the emission spectrum of PCCP has a peak (including a shoulder) of the phosphorescent component on the shortest wavelength side at 467 nm.

Thus, from the peak wavelengths, the T1 level of Pm-01 and the T1 level of PCCP were calculated to be 2.75 eV and 2.66 eV, respectively.

<Absorption Spectra of Guest Materials>

Figure 28:
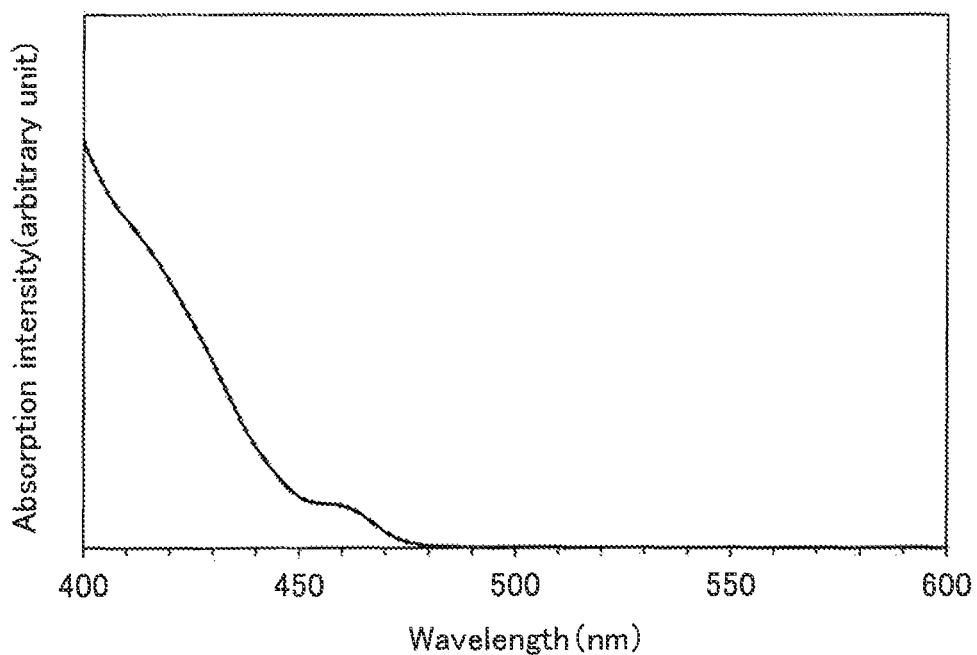
FIG. 28 shows an absorption spectrum of a guest material of an example.
Figure 29:
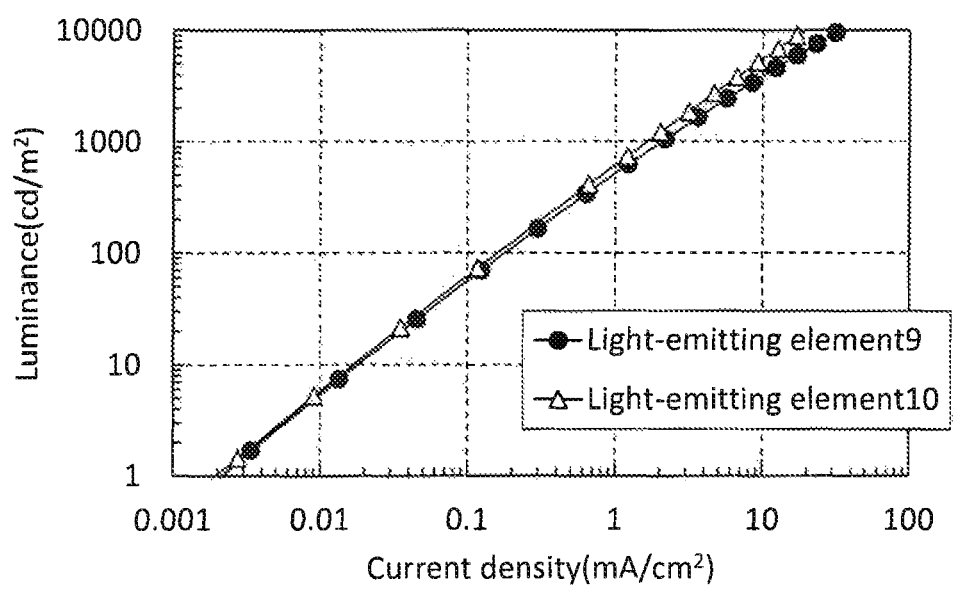
FIG. 29 shows luminance-current density characteristics of light-emitting elements of an example.
Figure 30:
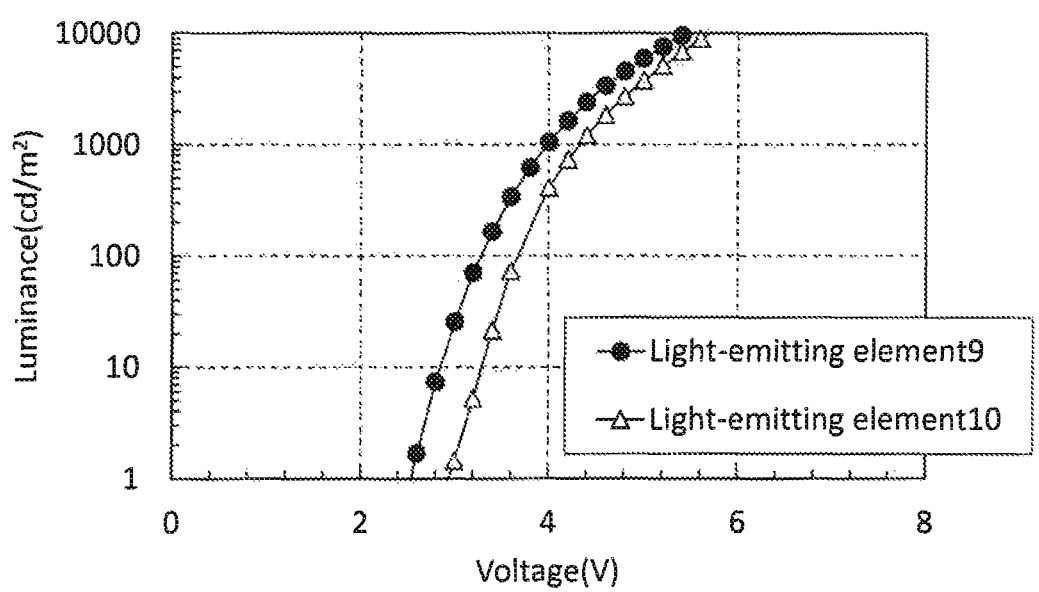
FIG. 30 shows luminance-voltage characteristics of light-emitting elements of an example.
Figure 31:
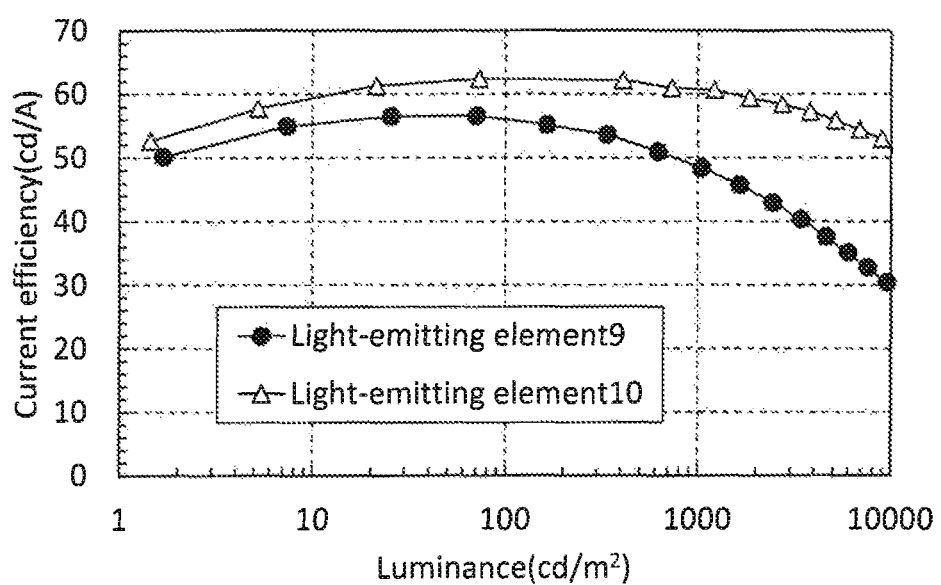
FIG. 31 shows current efficiency-luminance characteristics of light-emitting elements of an example.
Figure 32:
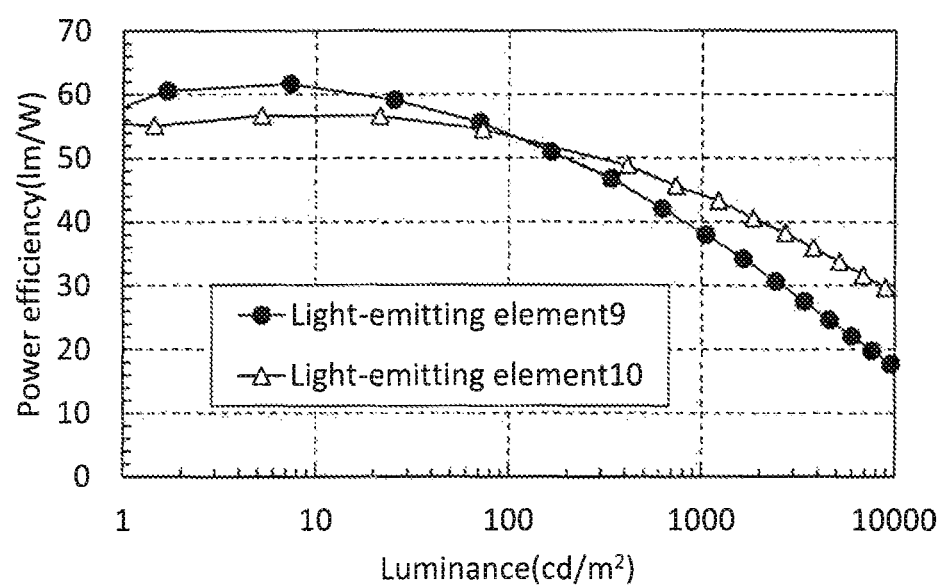
FIG. 32 shows power efficiency-luminance characteristics of light-emitting elements of an example.

FIG. 28 shows the measurement result of the absorption spectrum of Ir(iPrpim)$_3$ that is a guest material used in the above light-emitting elements.

For the absorption spectrum measurement, a dichloromethane solution in which Ir(iPrpim)$_3$ was dissolved was prepared, and a quartz cell was used. The absorption spectrum was measured using an ultraviolet-visible spectrophotometer (V-550, produced by JASCO Corporation). Then, the absorption spectra of a quartz cell and a solvent were subtracted from the measured spectrum of the sample. The measurement was performed at room temperature (in an atmosphere kept at 23° C.).

As shown in FIG. 28, the absorption edge on the lowest energy side (the longest wavelength side) of the absorption spectrum of Ir(iPrpim)$_3$ is at around 460 nm. The absorption edge was calculated from data of the absorption spectrum, and transition energy was estimated on the assumption of direct transition, whereby it was found that the absorption edge of Ir(iPrpim)$_3$ was at 474 nm and the transition energy thereof was 2.61 eV. Since Ir(iPrpim)$_3$ is a phosphorescent compound, the absorption edge on the lowest energy side is an absorption band based on triplet MLCT transition. Accordingly, the T1 level of Ir(iPrpim)$_3$ was calculated to be 2.61 eV from the absorption edge.

According to the above measurement results, the T1 level of PCCP and the T1 level of Pm-01 are higher than the T1 level of Ir(iPrpim)$_3$, and the T1 level of Ir(iPrpim)$_3$ is higher than the energy level of the exciplex formed by Pm-01 and Ir(iPrpim)$_3$ (2.28 eV), in other words, higher than the T1 level of the exciplex. Thus, both light emission of the exciplex formed by Ir(iPrpim)₃ and Pm-01 and light emission of Ir(iPrpim)₃ can be efficiently obtained.

The energy level of the exciplex is lower than the energy difference (3.67 eV) between the LUMO level and the HOMO level of PCCP and lower than the energy difference (3.11 eV) between the LUMO level and the HOMO level of Pm-01. Thus, by forming the exciplex, a light-emitting element with low driving voltage can be obtained.

With one embodiment of the present invention, a light-emitting element with high emission efficiency can be provided. With one embodiment of the present invention, a light-emitting element emitting light in a broad emission spectrum can be provided. In addition, with one embodiment of the present invention, a light-emitting element with low driving voltage and reduced power consumption can be provided.

EXAMPLE 2

In this example, examples of fabricating light-emitting elements of embodiments of the present invention and characteristics of the light-emitting elements are described.

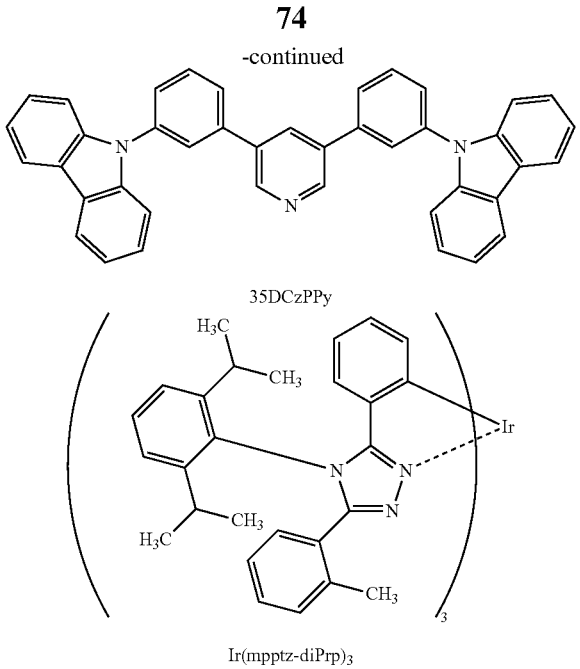

35DCzPPy

Ir(mpptz-diPrp)₃

TABLE 5

| | Layer | Reference numeral | Thickness (nm) | Material | Weight ratio |
|---|---|---|---|---|---|
| Light-emitting element 9 | Electrode | 102 | 200 | Al | — |
| | Electron-injection layer | 119 | 1 | LiF | — |
| | Electron-transport layer | 118 (2) | 15 | BPhen | — |
| | | 118 (1) | 10 | 4,6mCzP2Pm | — |
| | Light-emitting layer | 130 (2) | 10 | 4,6mCzP2Pm:Ir(mpptz-diPrp)₃ | 1:0.06 |
| | | 130 (1) | 30 | PCCP:4,6mCzP2Pm:Ir(mpptz-diPrp)₃ | 1:0.3:0.06 |
| | Hole-transport layer | 112 | 20 | PCCP | — |
| | Hole-injection layer | 111 | 15 | DBT3P-II:MoO₃ | 1:0.5 |
| | Electrode | 101 | 70 | ITSO | — |
| Light-emitting element 10 | Electrode | 102 | 200 | Al | — |
| | Electron-injection layer | 119 | 1 | LiF | — |
| | Electron-transport layer | 118 (2) | 15 | BPhen | — |
| | | 118 (1) | 10 | 35DCzPPy | — |
| | Light-emitting layer | 130 (2) | 10 | 35DCzPPy:Ir(mpptz-diPrp)₃ | 1:0.06 |
| | | 130 (1) | 30 | PCCP:35DCzPPy:Ir(mpptz-diPrp)₃ | 1:0.3:0.06 |
| | Hole-transport layer | 112 | 20 | PCCP | — |
| | Hole-injection layer | 111 | 15 | DBT3P-II:MoO₃ | 1:0.5 |
| | Electrode | 101 | 70 | ITSO | — |

The structure of each of the light-emitting elements fabricated in this example is the same as that illustrated in FIG. 1. Table 5 shows details of the element structure. In addition, structures and abbreviations of compounds used here are given below.

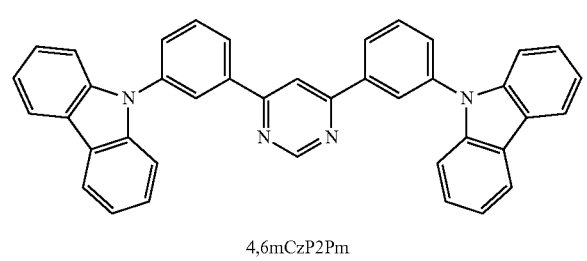

4,6mCzP2Pm

<Fabrication of Light-Emitting Elements>

Methods for fabricating light-emitting elements of this example are described below.

(Fabrication of Light-Emitting Element 9)

As the electrode 101, an ITSO film was formed to a thickness of 70 nm over a glass substrate. The electrode area of the electrode 101 was set to 4 mm² (2 mm×2 mm).

As the hole-injection layer 111, DBT3P-II and molybdenum oxide (MoO₃) were deposited over the electrode 101 by co-evaporation in a weight ratio of DBT3P-II:MoO₃=1:0.5 to a thickness of 15 nm.

Next, as the hole-transport layer 112, PCCP was deposited over the hole-injection layer 111 by evaporation to a thickness of 20 nm.

Next, as the light-emitting layer 130, PCCP, 4,6mCzP2Pm, and tris{2-[5-(2-methylphenyl)-4-(2,6-diisopropylphenyl)-4H-1,2,4-triazol-3-yl-κN2]phenyl-κC}iridium(III) (abbreviation: Ir(mpptz-diPrp)₃) were deposited over the hole-transport layer 112 by co-evaporation in a weight ratio of PCCP:4,6mCzP2Pm:Ir(mpptz-diPrp)₃=1:0.3:0.06 to a thickness of 30 nm, and successively, 4,6mCzP2Pm and Ir(mpptz-diPrp)₃ were deposited by co-evaporation in a weight ratio of 4,6mCzP2Pm:Ir(mpptz-diPrp)$_3$=1:0.06 to a thickness of 10 nm. In the light-emitting layer 130, Ir(mpptz-diPrp)$_3$ is the guest material (first organic compound) and 4,6mCzP2Pm is the host material (second organic compound).

Next, as the electron-transport layer 118, 4,6mCzP2Pm and BPhen were sequentially deposited over the light-emitting layer 130 by evaporation to thicknesses of 10 nm and 15 nm, respectively. Then, as the electron-injection layer 119, LiF was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 9 was sealed by fixing a glass substrate for sealing to a glass substrate on which the organic materials were deposited using a sealant for an organic EL device. For the detailed method, description of the light-emitting element 1 can be referred to. Through the above steps, the light-emitting element 9 was obtained.

(Fabrication of Light-Emitting Element 10)

A light-emitting element 10 was fabricated through the same steps as those for the light-emitting element 9 except for the steps of forming the light-emitting layer 130 and the electron-transport layer 118.

As the light-emitting layer 130 of the light-emitting element 2, PCCP, 35DCzPPy, and Ir(mpptz-diPrp)$_3$ were deposited by co-evaporation in a weight ratio of PCCP:35DCzPPy:Ir(mpptz-diPrp)$_3$=1: 0.3:0.06 to a thickness of 30 nm, and successively, 35DCzPPy and Ir(mpptz-diPrp)$_3$ were deposited by co-evaporation in a weight ratio of 35DCzPPy:Ir(mpptz-diPrp)$_3$=1:0.06 to a thickness of 10 nm. In the light-emitting layer 130, Ir(mpptz-diPrp)$_3$ is the guest material (first organic compound) and 35DczPPy is the host material (second organic compound).

As the electron-transport layer 118, 35DCzPPy and BPhen were sequentially deposited over the light-emitting layer 130 by evaporation to thicknesses of 10 nm and 15 nm, respectively.

<Characteristics of Light-Emitting Elements>

FIGS. 29, 30, 31, and 32 show luminance-current density characteristics, luminance-voltage characteristics, current efficiency-luminance characteristics, and power efficiency-luminance characteristics, respectively, of the fabricated light-emitting elements 9 and 10. Note that the measurement for each light-emitting element was performed at room temperature (in an atmosphere kept at 23° C.) by a measurement method similar to that used in Example 1.

Table 6 shows element characteristics of the light-emitting elements 9 and 10 at around 1000 cd/m$^2$.

respectively, and the light-emitting element 9 has a broader electroluminescence spectrum than the light-emitting element 10. The electroluminescence spectrum of the light-emitting element 9 not only has a peak at a wavelength of 473 nm and indicates blue light emission but also indicates broad light emission in the wavelength range of green. Meanwhile, in the light-emitting element 10, light was mainly emitted from the guest material Ir(mpptz-diPrp)$_3$.

Figure 34:
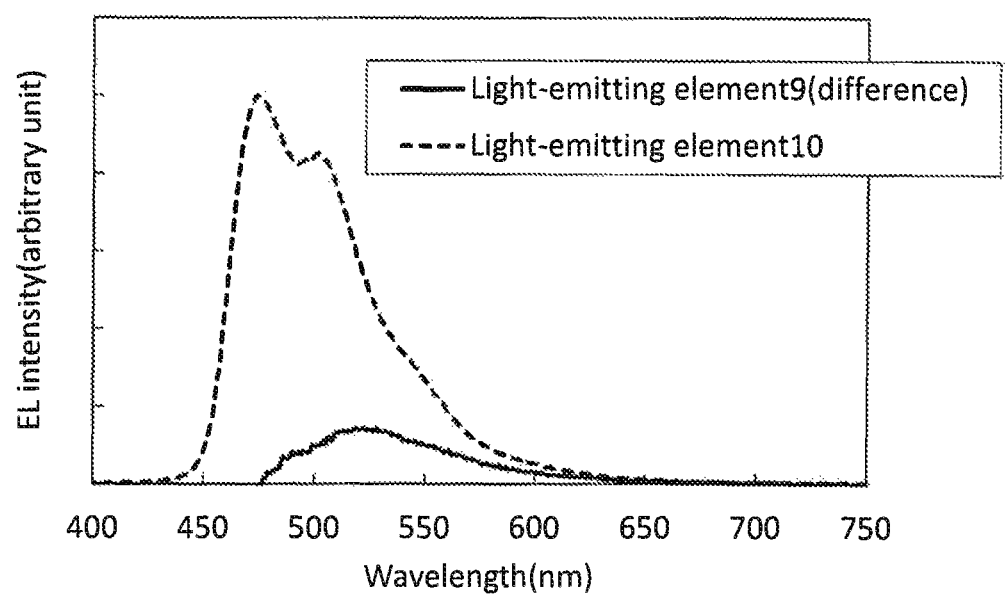
FIG. 34 shows electroluminescence spectra of light-emitting elements of an example.

Next, a difference spectrum obtained by subtracting the electroluminescence spectrum of the light-emitting element 10 from the electroluminescence spectrum of the light-emitting element 9 normalized by the intensity of the peak wavelength of the light-emitting element 10 is shown in FIG. 34. As can be seen from FIG. 34, the light-emitting 9 exhibits light emission on the long wavelength side in addition to the light emission of the guest material indicated by the electroluminescence spectrum of the light-emitting element 10. Furthermore, the peak wavelength on the long wavelength side is at around 520 nm. Furthermore, the intensity ratio of the light emission originating from the guest material to the light emission on the long wavelength side in the light-emitting element 9 is 1:0.15.

As will be described later, the combination of 4,6mCzP2Pm and Ir(mpptz-diPrp)$_3$ which were used in the light-emitting layer of the light-emitting element 9 forms an exciplex. Thus, it can be said that the reason behind the broad spectrum shape of the light-emitting element 9 lies in the fact that light emission is obtained from the exciplex which is formed by 4,6mCzP2Pm and Ir(mpptz-diPrp)$_3$.

As can be seen from FIGS. 29 to 32 and Table 6, the light-emitting element 9 is driven at a lower voltage than the light-emitting element 10. Furthermore, the power efficiency of the light-emitting element 9 is high. Accordingly, the light-emitting element of one embodiment of the present invention including the first organic compound (Ir(mpptz-diPrp)$_3$) and the second organic compound (4,6mCzP2Pm) can be driven at a low voltage and has a low power consumption.

<Results of CV Measurement>

The electrochemical characteristics (oxidation reaction characteristics and reduction reaction characteristics) of the above compounds were measured by cyclic voltammetry (CV) measurement. Note that the measurement method is similar to that used in Example 1. Furthermore, for the measurement results of PCCP, Example 1 can be referred to.

According to the CV measurement results, the oxidation potential and the reduction potential of 4,6mCzP2Pm were 0.95 V and −2.06 V, respectively. In addition, the HOMO level and the LUMO level of 4,6mCzP2Pm, which were calculated from the CV measurement, were −5.89 eV and

TABLE 6

| | Voltage (V) | Current density (mA/cm$^2$) | CIE-chromaticity (x, y) | Luminance (cd/m$^2$) | Current efficiency (cd/A) | Power efficiency (lm/W) |
| --- | --- | --- | --- | --- | --- | --- |
| Light-emitting element 9 | 4.00 | 2.17 | (0.189, 0.411) | 1050 | 48.4 | 38.0 |
| Light-emitting element 10 | 4.40 | 2.01 | (0.170, 0.371) | 1220 | 60.7 | 43.3 |

Figure 33:
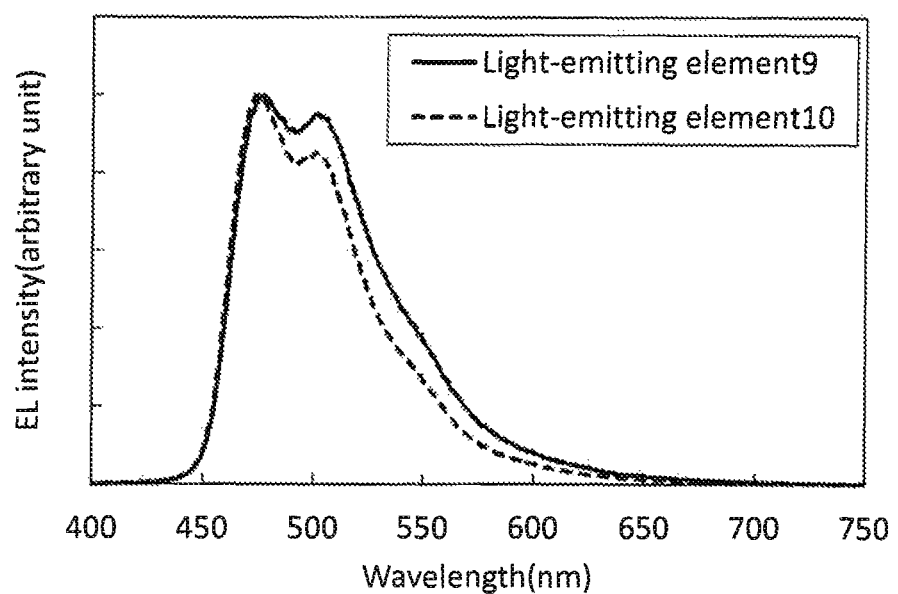
FIG. 33 shows electroluminescence spectra of light-emitting elements of an example.

FIG. 33 shows electroluminescence spectra when a current with a current density of 2.5 mA/cm$^2$ flows through the light-emitting elements 9 and 10.

As shown in FIG. 33, the electroluminescence spectra of the light-emitting element 9 and the light-emitting element 10 have full widths at half maximum of 74 nm and 64 nm, −2.88 eV, respectively. Thus, the LUMO level of 4,6mCzP2Pm was found to be low. Furthermore, the oxidation potential and the reduction potential of Ir(mpptz-diPrp)$_3$ were 0.34 V and −2.98 V, respectively. In addition, the HOMO level and the LUMO level of Ir(mpptz-diPrp)$_3$, which were obtained from the CV measurement, were −5.28 eV and −1.96 eV, respectively. Thus, the HOMO level of Ir(mpptz-diPrp)$_3$ was found to be high. Furthermore, the oxidation potential and the reduction potential of 35DCzPPy were 0.96 V and −2.56 V, respectively. In addition, the HOMO level and the LUMO level of 35DCzPPy, which were calculated from the CV measurement, were −5.90 eV and −2.39 eV, respectively.

As described above, the LUMO level of 4,6mCzP2Pm is lower than the LUMO level of PCCP and the LUMO level of Ir(mpptz-diPrp)$_3$, and the HOMO level of Ir(mpptz-diPrp)$_3$ is higher than the HOMO level of PCCP and the HOMO level of 4,6mCzP2Pm. Thus, in the case where the compounds are used in a light-emitting layer as in the light-emitting element 9, electrons and holes serving as carriers are efficiently injected from a pair of electrodes into 4,6mCzP2Pm and Ir(mpptz-diPrp)$_3$, so that 4,6mCzP2Pm and Ir(mpptz-diPrp)$_3$ can form an exciplex.

Furthermore, the exciplex formed by 4,6mCzP2Pm and Ir(mpptz-diPrp)$_3$ has the LUMO level in 4,6mCzP2Pm and the HOMO level in Ir(mpptz-diPrp)$_3$. The energy difference between the LUMO level of 4,6mCzP2Pm and the HOMO level of Ir(mpptz-diPrp)$_3$ is 2.40 eV. This value is substantially equal to the light emission energy in a broad wavelength range of the electroluminescence spectrum of the light-emitting element 9 shown in FIG. 33 (2.38 eV). These results imply that the electroluminescence spectrum of the light-emitting element 9 indicates light emission from the exciplex formed by 4,6mCzP2Pm and Ir(mpptz-diPrp)$_3$ and light emission from Ir(mpptz-diPrp)$_3$. Note that since the difference between the S1 level and the T1 level of the exciplex is small, the light emission energy can be regarded as the energy of the T1 level of the exciplex (2.38 eV).

Note that the LUMO level of 35DCzPPy is lower than the LUMO level of PCCP and the LUMO level of Ir(mpptz-diPrp)$_3$, and the HOMO level of Ir(mpptz-diPrp)$_3$ is higher than the HOMO level of PCCP and the HOMO level of 35DCzPPy. Thus, in the case where the compounds are used in a light-emitting layer as in the light-emitting element 10, electrons and holes serving as carriers are efficiently injected from a pair of electrodes into 35DCzPPy and Ir(mpptz-diPrp)$_3$.

However, the energy difference between the LUMO level of 35DCzPPy and the HOMO level of Ir(mpptz-diPrp)$_3$ is as large as 2.90 eV. Since this energy difference is larger than the light emission energy calculated from the peak wavelength of the electroluminescence spectrum of the light-emitting element 10 shown in FIG. 33 (2.61 eV), light emission from excited Ir(mpptz-diPrp)$_3$ is energetically more stable than formation of an exciplex by 35DCzPPy and Ir(mpptz-diPrp)$_3$. In other words, the combination of 35DCzPPy and Ir(mpptz-diPrp)$_3$ does not form an exciplex. Light emission from the exciplex formed by 35DCzPPy and Ir(mpptz-diPrp)$_3$ is not observed from the light-emitting element 10.

<Measurement of T1 Level>

Figure 35:
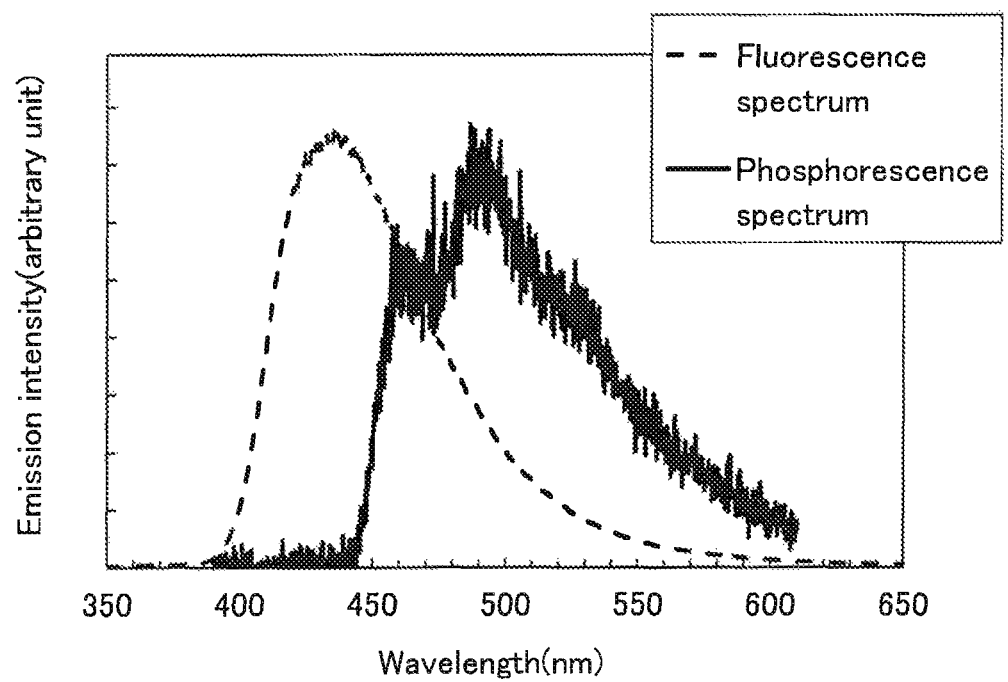
FIG. 35 shows emission spectra of a thin film of an example.
Figure 36:
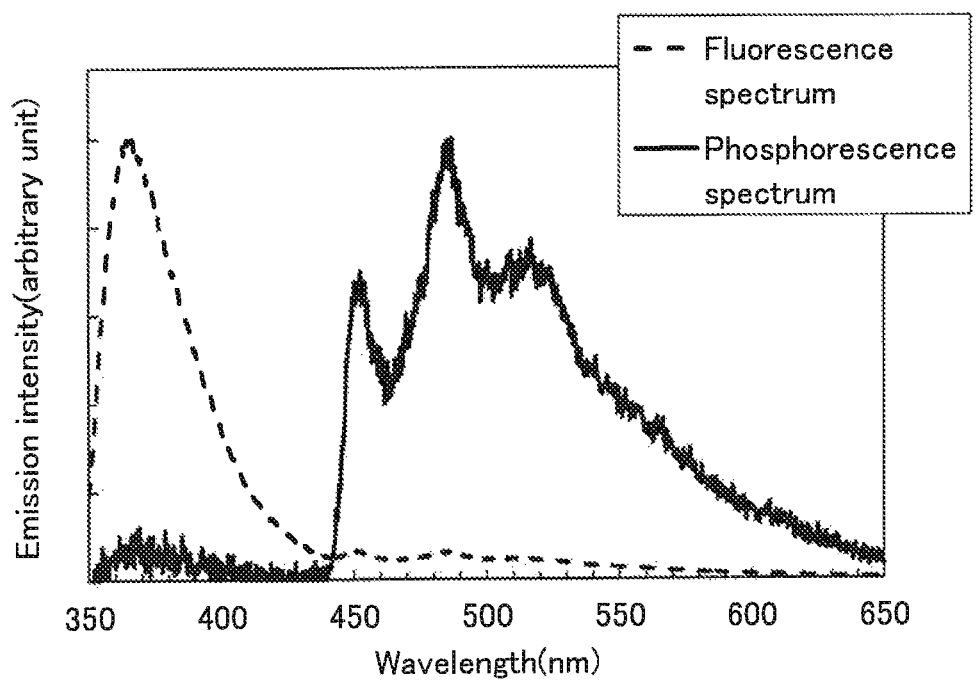
FIG. 36 shows emission spectra of a thin film of an example.

Next, in order to obtain the T1 levels of the compounds used in the light-emitting layer 130, the emission spectra of 4,6mCzP2Pm and 35DCzPPy were measured at a low temperature (10 K). Note that the measurement method was similar to that used in Example 1. Furthermore, for the measurement results of PCCP, Example 1 can be referred to. Time-resolved emission spectra of 4,6mCzP2Pm and 35DCzPPy measured at a low temperature are shown in FIG. 35 and FIG. 36, respectively.

As shown in the measurement results of the emission spectra, the emission spectrum of 4,6mCzP2Pm has a peak (including a shoulder) of the phosphorescent component on the shortest wavelength side at 459 nm, and the emission spectrum of 35DCzPPy has a peak (including a shoulder) of the phosphorescent component on the shortest wavelength side at 451 nm.

Thus, from the peak wavelengths, the T1 level of 4,6mCzP2Pm and the T1 level of 35DCzPPy were calculated to be 2.70 eV and 2.75 eV, respectively.

<Absorption Spectra of Guest Materials>

Figure 37:
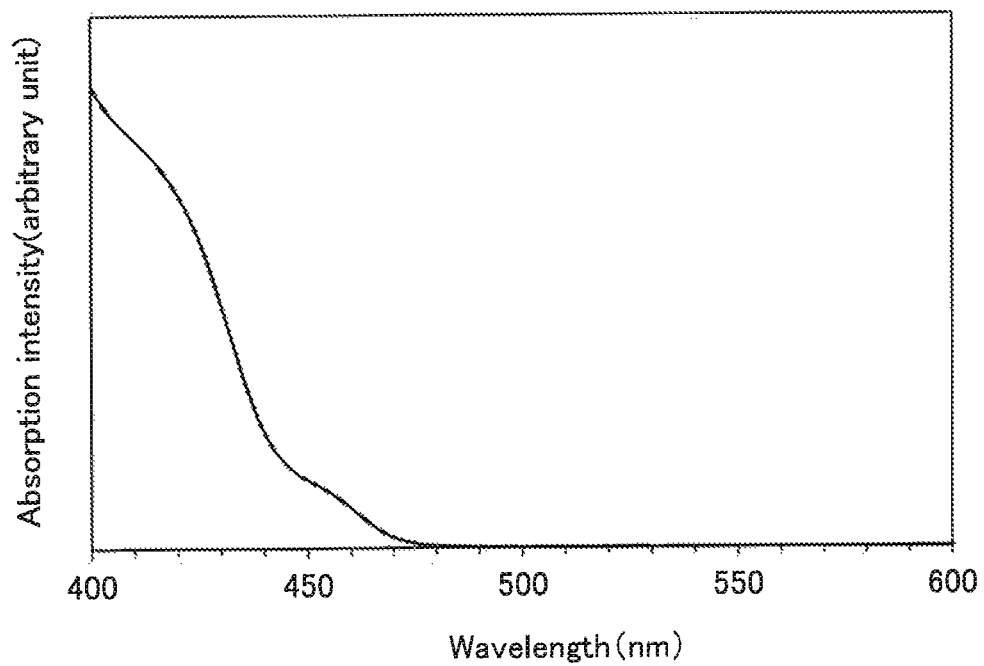
FIG. 37 shows an absorption spectrum of a guest material of an example.

FIG. 37 shows the measurement result of the absorption spectrum of Ir(mpptz-diPrp)$_3$ that is a guest material used in the light-emitting elements. Note that the measurement method was similar to that used in Example 1.

As shown in FIG. 37, the absorption edge on the lowest energy side (the longest wavelength side) of the absorption spectrum of Ir(mpptz-diPrp)$_3$ is at around 460 nm. The absorption edge was calculated from data of the absorption spectrum, and transition energy was estimated on the assumption of direct transition, whereby it was found that the absorption edge of Ir(mpptz-diPrp)$_3$ was at 472 nm and the transition energy thereof was 2.63 eV. Since Ir(mpptz-diPrp)$_3$ is a phosphorescent compound, the absorption edge on the lowest energy side is an absorption band based on triplet MLCT transition. Accordingly, the T1 level of Ir(mpptz-diPrp)$_3$ was calculated to be 2.63 eV from the absorption edge.

According to the above measurement results, the T1 level of PCCP and the T1 level of 4,6mCzP2Pm are higher than the T1 level of Ir(mpptz-diPrp)$_3$, and the T1 level of Ir(mpptz-diPrp)$_3$ is higher than the energy level of the exciplex formed by 4,6mCzP2Pm and Ir(mpptz-diPrp)$_3$ (2.38 eV), in other words, higher than the T1 level of the exciplex. Thus, both light emission of the exciplex formed by Ir(mpptz-diPrp)$_3$ and 4,6mCzP2Pm and light emission of Ir(mpptz-diPrp)$_3$ can be efficiently obtained.

The energy level of the exciplex is lower than the energy difference (3.67 eV) between the LUMO level and the HOMO level of PCCP and lower than the energy difference (3.01 eV) between the LUMO level and the HOMO level of 4,6mCzP2Pm. Thus, by forming the exciplex, a light-emitting element with low driving voltage can be obtained.

The T1 level of PCCP and the T1 level of 35DCzPPy are higher than the T1 level of Ir(mpptz-diPrp)$_3$, and the T1 level of Ir(mpptz-diPrp)$_3$ is lower than the energy difference (2.90 eV) between the LUMO level of 35DCzPPy and the HOMO level of Ir(mpptz-diPrp)$_3$. Thus, light emission from excited Ir(mpptz-diPrp)$_3$ is energetically more stable than formation of an exciplex by 35DCzPPy and Ir(mpptz-diPrp)$_3$. In other words, the combination of 35DCzPPy and Ir(mpptz-diPrp)$_3$ does not form an exciplex. Light emission from the exciplex formed by 35DCzPPy and Ir(mpptz-diPrp)$_3$ is not observed from the light-emitting element 10.

<Time-Resolved Emission Measurement>

Next, a thin film sample including the combination of compounds used in the above light-emitting layer was fabricated, and then the transient emission characteristics thereof were measured using time-resolved emission measurement.

As the thin film 1 4,6mCzP2Pm, and Ir(mpptz-diPrp)$_3$ were deposited over a quartz substrate by co-evaporation in a weight ratio of 4,6mCzP2Pm:Ir(mpptz-diPrp)$_3$=1:0.125 to a thickness of 50 nm.

As the thin film 2, 35DCzPPy and Ir(mpptz-diPrp)$_3$ were deposited over a quartz substrate by co-evaporation in a weight ratio of 35DCzPPy:Ir(mpptz-diPrp)$_3$=1:0.125 to a thickness of 50 nm.

A picosecond fluorescence lifetime measurement system (manufactured by Hamamatsu Photonics K.K.) was used for the measurement. In this measurement, the thin film was irradiated with pulsed laser, and light emission of the thin film which was attenuated from the laser irradiation underwent time-resolved measurement using a streak camera to measure the lifetime of light emission of the thin film. A nitrogen gas laser with a wavelength of 337 nm was used as the pulsed laser. The thin film was irradiated with pulsed laser with a pulse width of 500 ps at a repetition rate of 10 Hz. By integrating data obtained by the repeated measurement, data with a high S/N ratio was obtained. The measurement was performed at room temperature (in an atmosphere kept at 23° C.).

Figure 38:
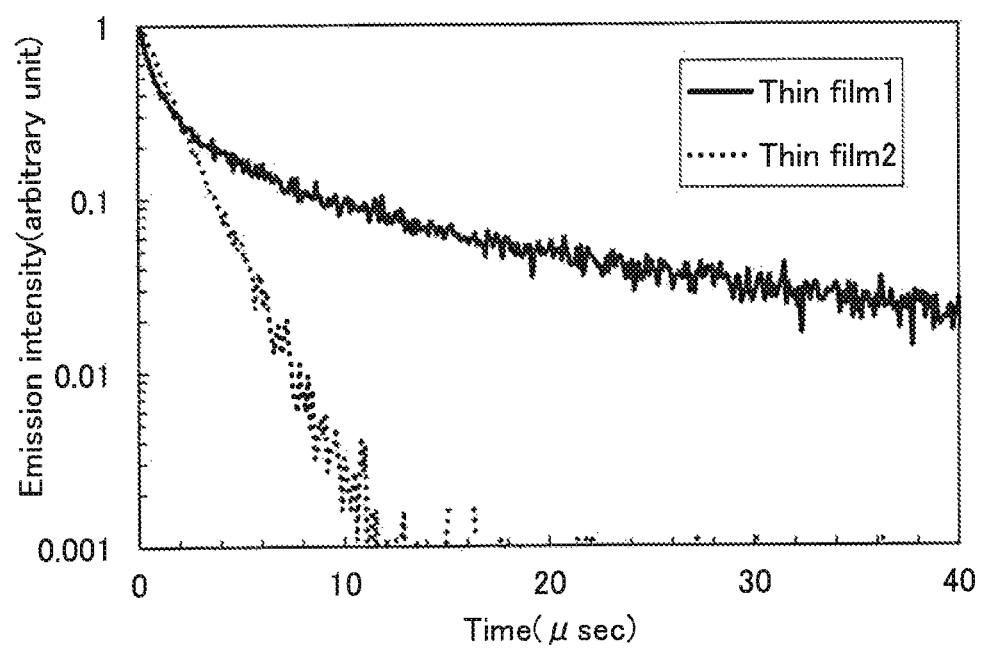
FIG. 38 shows transient emission characteristics of thin films of an example.

FIG. 38 shows the transient emission characteristics of the thin films 1 and 2 obtained by the measurements.

The transient emission characteristics of the thin film 2 show a first-order decay which fits well into a monoexponential function. Furthermore, it was found that the transient emission characteristics of the thin film 1 include a delayed emission component in addition to a prompt emission component. In other words, it was suggested that light emission of the thin film 1 includes light emission from at least two components.

Figure 39:
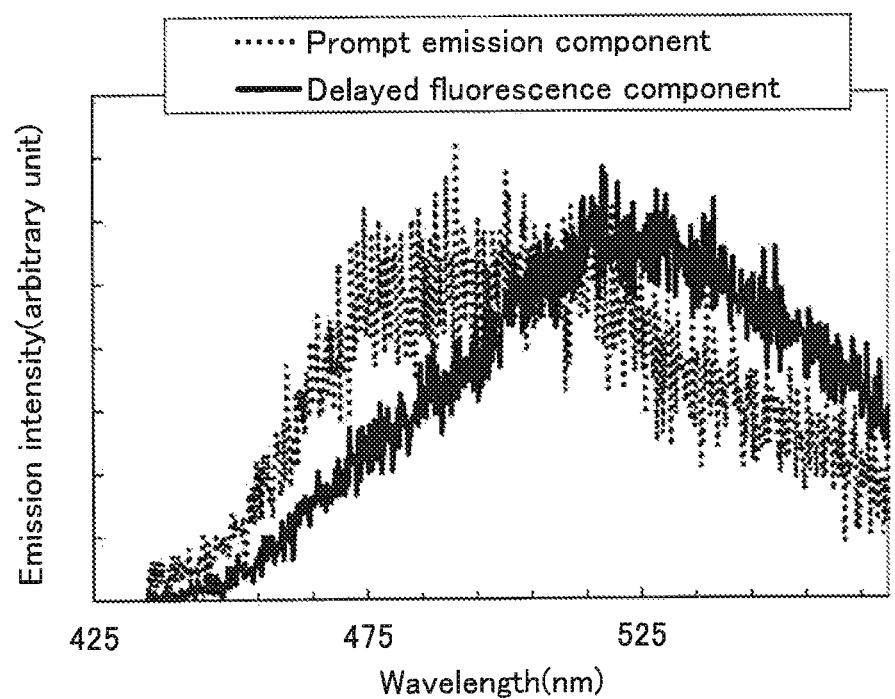
FIG. 39 shows a time-resolved emission spectrum of a thin film of an example.

Next, FIG. 39 shows the emission spectra of the prompt emission component and the delayed emission component of the thin film 1. The emission spectrum of the prompt emission component is a spectrum which was obtained by measuring the emission of the thin film 1 in a period from −0.8 μs to 0.9 μs and the emission spectrum of the delayed emission component is a spectrum which was obtained by measuring the emission of the thin film 1 in a period from 0.9 μs to 44 μs.

As shown in FIG. 39, the emission spectrum of the prompt emission component and the emission spectrum of the delayed emission component of the thin film 1 have different spectrum shapes. As shown in the emission spectra, the emission wavelength of the light emission of the delayed emission component is longer than the emission wavelength of the light emission of the prompt emission component.

Light emission energy (2.39 eV) calculated from the peak wavelength of the emission spectrum of the delayed emission component of the thin film 1 is substantially the same as the energy of the exciplex formed by 4,6mCzP2Pm and Ir(mpptz-diPrP)$_3$. Since the exciplex has a function of exhibiting thermally activated delayed fluorescence, it can be said that the delayed emission component of the thin film 1 exhibits light emission due to the exciplex formed by 4,6mCzP2Pm and Ir(mpptz-diPrP)$_3$.

As described above, the light-emitting element 9 fabricated in this example is a light-emitting element of one embodiment of the present invention including the first organic compound (Ir(mpptz-diPrP)$_3$) and the second organic compound (4,6mCzP2Pm) whose combination forms an exciplex.

With one embodiment of the present invention, a light-emitting element with high emission efficiency can be provided. With one embodiment of the present invention, a light-emitting element emitting light in a broad emission spectrum can be provided. In addition, with one embodiment of the present invention, a light-emitting element with low driving voltage and reduced power consumption can be provided.

EXAMPLE 3

In this example, emission characteristics of thin films that can be used in a light-emitting element of one embodiment of the present invention will be described. Structures and abbreviations of compounds used in this example are given below.

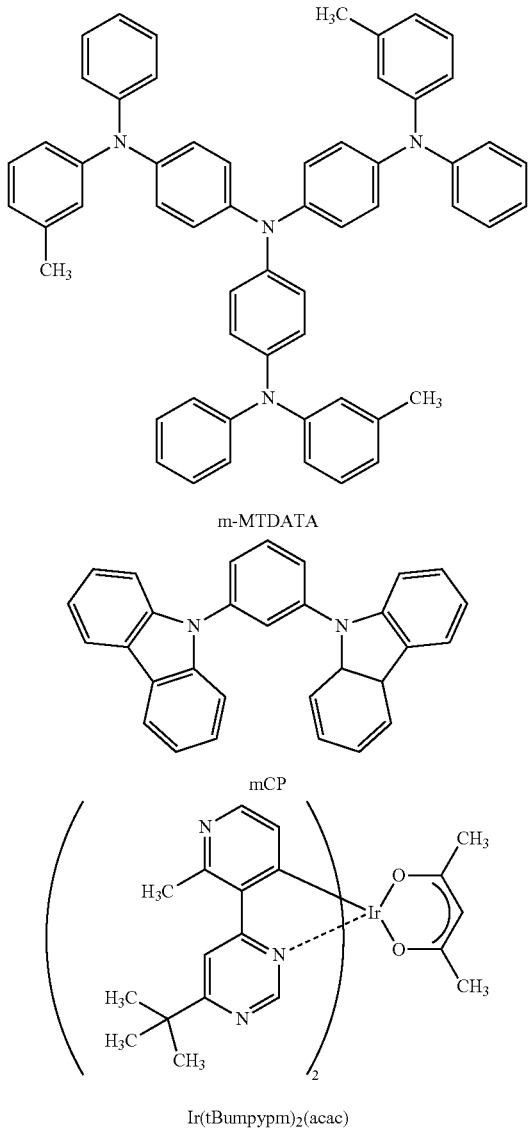

<Fabrication of thin Film Samples>

As the thin film 3, m-MTDATA and bis[2-methyl-3-(6-tert-butyl-4-pyrimidinyl-κN$^3$)pyridyl-κC](2,4-pentanedionato-κ$^2$O,O')iridium(III) (abbreviation: Ir(tBumpypm)$_2$(acac)) were deposited over a quartz substrate by co-evaporation in a weight ratio of m-MTDATA:Ir(tBumpypm)$_2$(acac)=1:0.01 to a thickness of 50 nm.

As the thin film 4, m-MTDATA and Ir(tBumpypm)$_2$(acac) were deposited by co-evaporation over a quartz substrate in a weight ratio of m-MTDATA:Ir(tBumpypm)$_2$(acac)=1:0.25 to a thickness of 50 nm.

As the thin film 5, mCP and Ir(tBumpypm)$_2$(acac) were deposited by co-evaporation over a quartz substrate in a weight ratio of mCP:Ir(tBumpypm)$_2$(acac) of 1:0.01 to a thickness of 50 nm.

As the thin film 6, mCP and Ir(tBumpypm)$_2$(acac) were deposited by co-evaporation over a quartz substrate in a weight ratio of mCP:Ir(tBumpypm)$_2$(acac)=1:0.25 to a thickness of 50 nm.

<Emission Spectrum>

Figure 40:
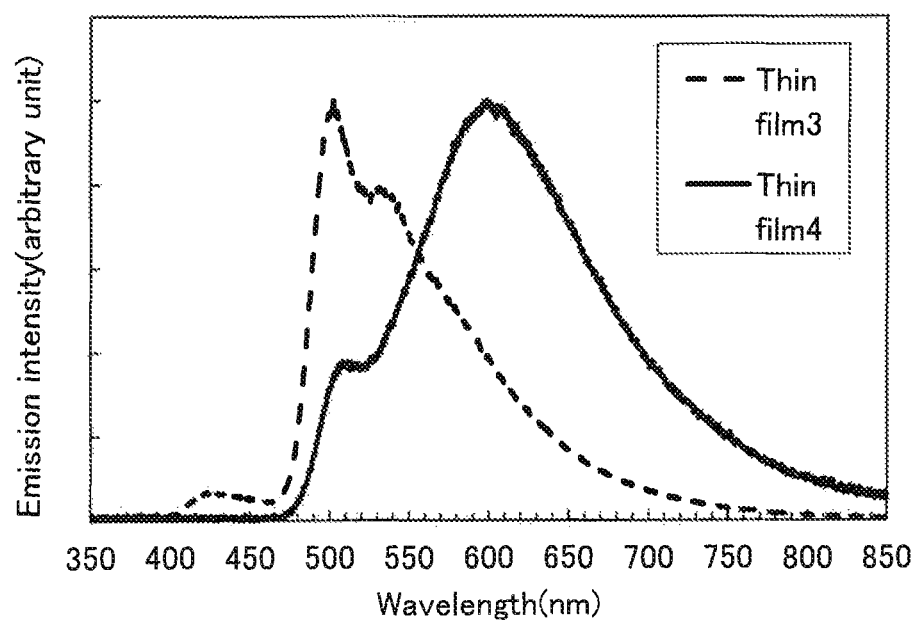
FIG. 40 shows emission spectra of thin films of an example.
Figure 41:
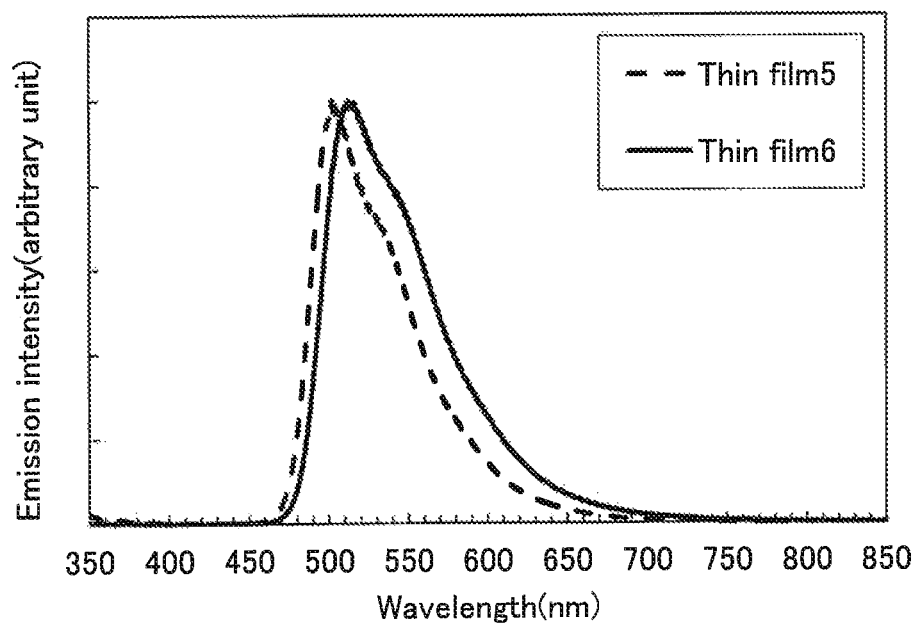
FIG. 41 shows emission spectra of thin films of an example.

The emission spectra of the above fabricated thin films 3 to 6 were measured. Note that the emission spectra were measured with a PL-EL measurement apparatus (manufactured by Hamamatsu Photonics K.K.). The measurement was performed at room temperature (in an atmosphere kept at 23° C.). Measurement results are shown in FIG. 40 and FIG. 41.

Green light emission exhibited from the phosphorescent compound Ir(tBumpypm)$_2$(acac) was observed from the thin film 5 and the thin film 6. Meanwhile, light emission having a broad spectrum shape covering the long wavelength side was observed from the thin film 3 and the thin film 4 in addition to the light emission from Ir(tBumpypm)$_2$(acac).

<Time-Resolved Emission Measurement>

Next, time-resolved emission measurement was conducted for the thin films 3 to 6. A picosecond fluorescence lifetime measurement system (manufactured by Hamamatsu Photonics K.K.) was used for the measurement. The measurement method was similar to that used in Example 2.

Figure 42:
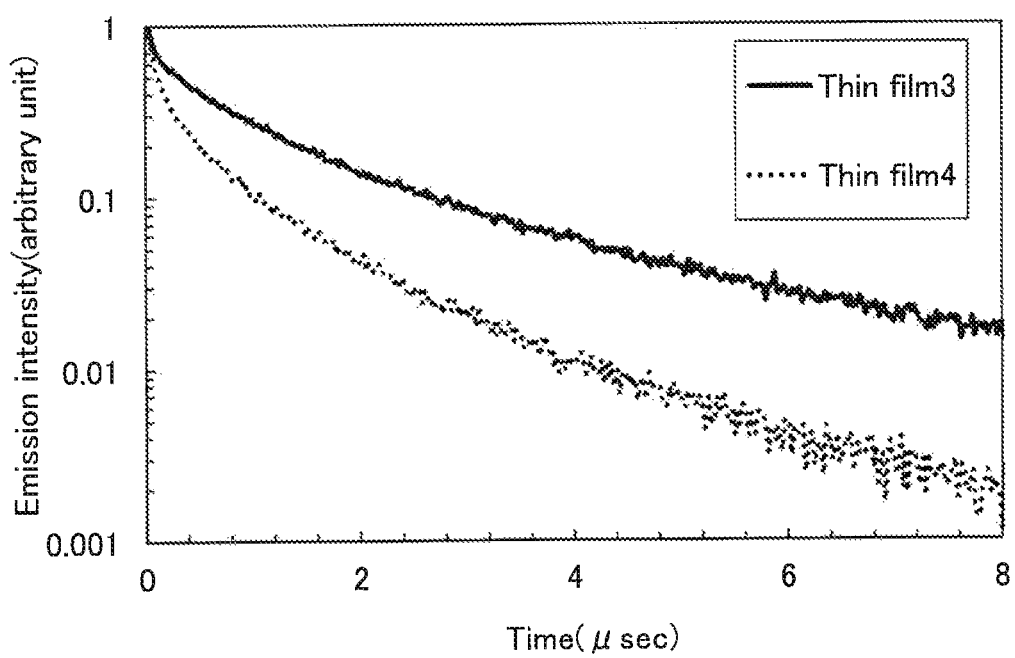
FIG. 42 shows transient emission characteristics of thin films of an example.
Figure 43:
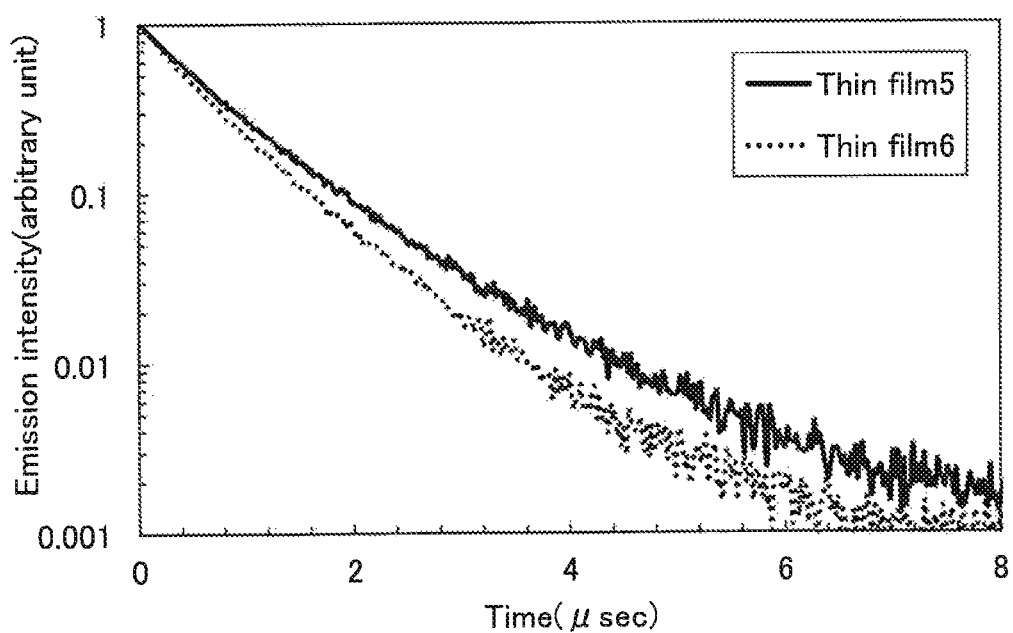
FIG. 43 shows transient emission characteristics of thin films of an example.

In FIGS. 42 and 43, the measured transient emission characteristics of the thin films 3 to 6 are shown.

The transient emission characteristics of the thin films 5 and 6 show attenuation curves close to a monoexponential function. Meanwhile, it was found that the transient emission characteristics of the thin films 3 and 4 include a delayed emission component in addition to a prompt emission component. In other words, it was suggested that light emission of the thin films 3 and 4 includes light emission from at least two components.

<Results of CV measurement>

The electrochemical characteristics (oxidation reaction characteristics and reduction reaction characteristics) of the above compounds were measured by cyclic voltammetry (CV) measurement. Note that the measurement method is similar to that used in Example 1.

According to the CV measurement results, the oxidation potential and the reduction potential of m-MTDATA were 0.04 V and −2.72 V, respectively. In addition, the HOMO level and the LUMO level of m-MTDATA, which were calculated from the CV measurement, were −4.98 eV and −2.22 eV, respectively. Thus, the HOMO level of m-MTDATA was found to be high. Furthermore, the oxidation potential and the reduction potential of Ir(tBumpypm)$_2$(acac) were 0.91 V and −2.04 V, respectively. Furthermore, the HOMO level and the LUMO level of Ir(tBumpypm)$_2$(acac), which were calculated from the CV measurement, were −5.85 eV and −2.90 eV, respectively. Thus, the LUMO level of Ir(tBumpypm)$_2$(acac) was found to be low. The oxidation potential of mCP was 0.97 V. The HOMO level of mCP calculated from the CV measurement was −5.91 eV. Note that the LUMO level of mCP was probably high because the reduction potential of mCP was low and a clear reduction peak was not observed.

As described above, the LUMO level of Ir(tBumpypm)$_2$(acac) is lower than the LUMO level of m-MTDATA, and the HOMO level of Ir(tBumpypm)$_2$(acac) is lower than the HOMO level of m-MTDATA. Thus, the combination of Ir(tBumpypm)$_2$(acac) and m-MTDATA can form an exciplex.

The exciplex formed by Ir(tBumpypm)$_2$(acac) and m-MTDATA has the LUMO level in Ir(tBumpypm)$_2$(acac) and the HOMO level in m-MTDATA. Furthermore, the energy difference between the LUMO level of Ir(tBumpypm)$_2$(acac) and the HOMO level of m-MTDATA is 2.08 eV. This value is substantially equal to the light emission energy (2.06 eV) calculated from the peak wavelength of the emission spectrum of the thin film 4 shown in FIG. 40. These results imply that the emission spectra of the thin films 3 and 4 indicate light emission from the exciplex formed by Ir(tBumpypm)$_2$(acac) and m-MTDATA and light emission from Ir(tBumpypm)$_2$(acac). Note that since the difference between the S1 level and the T1 level of the exciplex is small, the light emission energy can be regarded as the energy of the T1 level of the exciplex (2.06 eV).

Note that the HOMO level of mCP is lower than the HOMO level of Ir(tBumpypm)$_2$(acac). Thus, the combination of mCP and Ir(tBumpypm)$_2$(acac) does not form an exciplex. Light emission from the exciplex formed by mCP and Ir(tBumpypm)$_2$(acac) is not observed from the thin films 5 and 6.

<Measurement of T1 Level>

Figure 44:
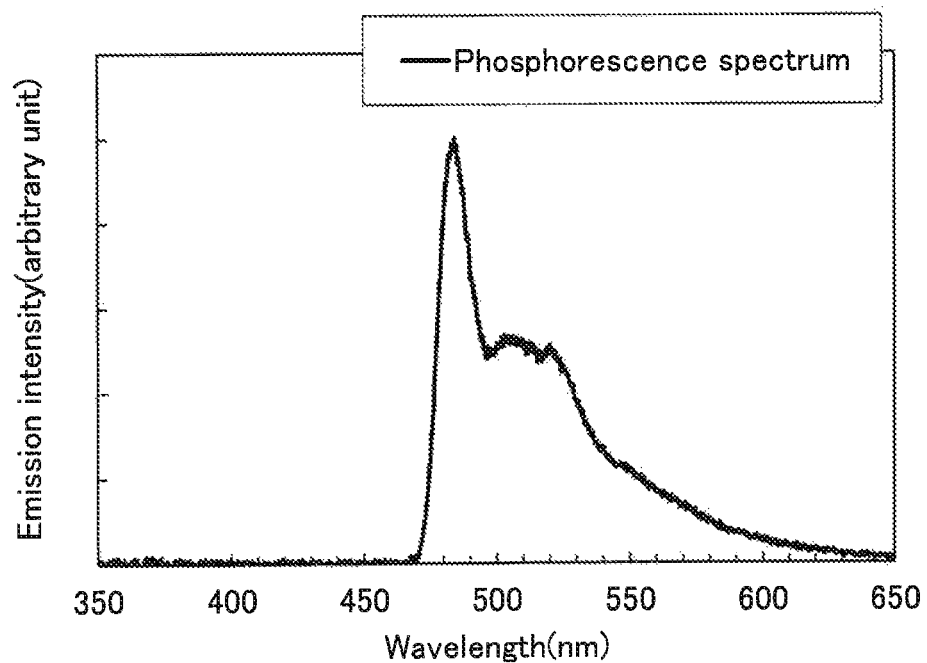
FIG. 44 shows an emission spectrum of a thin film of an example.

Next, in order to obtain the T1 levels of the compounds used in the thin films 3 and 4, the emission spectrum of m-MTDATA was measured at a low temperature (10 K). Note that the measurement method was similar to that used in Example 1. A time-resolved emission spectrum of m-MTDATA measured at a low temperature is shown in FIG. 44.

As shown in the measurement results of the emission spectrum, the emission spectrum of m-MTDATA has a peak (including a shoulder) of the phosphorescent component on the shortest wavelength side at 484 nm. Thus, from the peak wavelength, the T1 level of m-MTDATA was calculated to be 2.56 eV.

<Absorption Spectra of Guest Materials>

Figure 45:
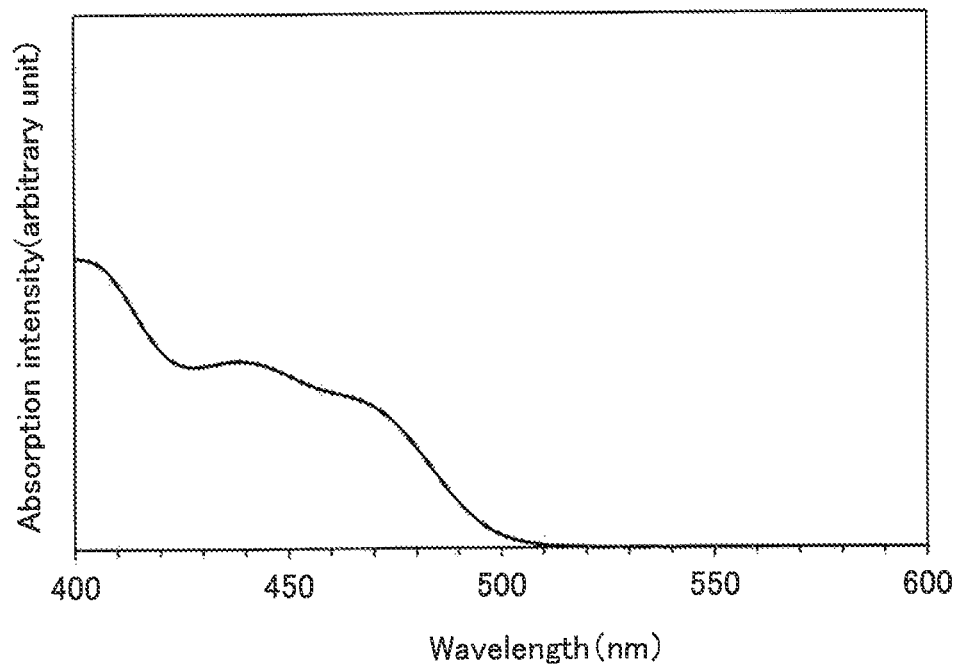
FIG. 45 shows an absorption spectrum of a guest material of an example.

FIG. 45 shows the measurement results of the absorption spectrum of Ir(tBumpypm)$_2$(acac) that is the guest material in the thin films 3 and 4. Note that the measurement method was similar to that used in Example 1.

As shown in FIG. 45, the absorption edge on the lowest energy side (the longest wavelength side) of the absorption spectrum of Ir(tBumpypm)$_2$(acac) is at around 490 nm. The absorption edge was calculated from data of the absorption spectrum, and transition energy was estimated on the assumption of direct transition, whereby it was found that the absorption edge of Ir(mpptz-diPrp)$_3$ was at 496 nm and the transition energy thereof was 2.50 eV. Since Ir(tBumpypm)$_2$(acac) is a phosphorescent compound, the absorption edge on the lowest energy side is an absorption band based on triplet MLCT transition. Accordingly, the T1 level of Ir(tBumpypm)$_2$(acac) was calculated to be 2.50 eV from the absorption edge.

According to the above measurement results, the T1 level of m-MTDATA is higher than the T1 level of Ir(tBumpypm)$_2$ (acac), and the T1 level of Ir(tBumpypm)$_2$ (acac) is higher than the energy difference (2.08 eV) between the LUMO level of Ir(tBumpypm)$_2$(acac) and the HOMO level of m-MTDATA or higher than the light emission energy of the exciplex formed by Ir(tBumpypm)$_2$(acac) and m-MTDATA (2.06 eV), in other words, higher than the T1 level of the exciplex. Thus, both light emission of the exciplex formed by Ir(tBumpypm)$_2$(acac) and m-MTDATA and light emission of Ir(tBumpypm)$_2$(acac) can be efficiently obtained.

As described above, the thin films 3 and 4 fabricated in this example are thin films including the first organic compound (Ir(tBumpypm)$_2$(acac)) and the second organic compound (m-MTDATA) whose combination forms an exciplex, and the films can be favorably applied to a light-emitting element of one embodiment of the present invention.

With one embodiment of the present invention, a light-emitting element emitting light in a broad emission spectrum can be provided.

This application is based on Japanese Patent Application serial no. 2016-086542 filed with Japan Patent Office on Apr. 22, 2016, the entire contents of which are hereby incorporated by reference.

What is claimed is:

1. A light-emitting element comprising:
a light-emitting layer comprising a first organic compound and a second organic compound,
wherein the second organic compound is configured to transport an electron,
wherein a LUMO level of the first organic compound is higher than or equal to a LUMO level of the second organic compound,
wherein a HOMO level of the first organic compound is higher than or equal to a HOMO level of the second organic compound,
wherein a combination of the first organic compound and the second organic compound forms an exciplex,
wherein a lowest triplet excitation level of the second organic compound is higher than or equal to a lowest triplet excitation level of the first organic compound,
wherein the lowest triplet excitation level of the first organic compound is higher than or equal to a lowest triplet excitation level of the exciplex, and
wherein light emission from the light-emitting layer comprises light emission from the first organic compound and light emission from the exciplex.

2. The light-emitting element according to claim 1, wherein an intensity ratio of the light emission from the exciplex to the light emission from the first organic compound ranges from 1:9 to 9:1.

3. The light-emitting element according to claim 1, wherein the light emission from the exciplex has a higher intensity than the light emission from the first organic compound.

4. The light-emitting element according to claim 1, wherein the first organic compound comprises iridium.

5. The light-emitting element according to claim 1,
wherein the first organic compound comprises a ligand coordinated to iridium, and
wherein the ligand comprises a nitrogen-containing five-membered heterocyclic skeleton.

6. The light-emitting element according to claim 1, wherein the second organic compound comprises a π-electron deficient heteroaromatic skeleton.

7. The light-emitting element according to claim 1,
wherein the light-emitting layer further comprises a third organic compound, and
wherein a HOMO level of the third organic compound is higher than or equal to the HOMO level of the second organic compound.

8. The light-emitting element according to claim 1,
wherein the light-emitting layer further comprises a third organic compound,
wherein a HOMO level of the third organic compound is higher than or equal to the HOMO level of the second organic compound, and
wherein the third organic compound is configured to transport a hole.

9. The light-emitting element according to claim 1,
wherein the light-emitting layer further comprises a third organic compound, and
wherein the third organic compound comprises at least one of a π-electron rich heteroaromatic skeleton and an aromatic amine skeleton.

10. The light-emitting element according to claim 1, wherein a weight ratio of the first organic compound to the second organic compound is greater than or equal to 0.01 and less than or equal to 0.5.

11. A light-emitting element comprising:
a light-emitting layer comprising a guest material and a host material,
wherein the host material is configured to transport an electron,
wherein the guest material is configured to transport a hole,
wherein a LUMO level of the guest material is higher than or equal to a LUMO level of the host material,
wherein a HOMO level of the guest material is higher than or equal to a HOMO level of the host material,
wherein a combination of the guest material and the host material forms an exciplex,
wherein a lowest triplet excitation level of the host material is higher than or equal to a lowest triplet excitation level of the guest material,
wherein the lowest triplet excitation level of the guest material is higher than or equal to a lowest triplet excitation level of the exciplex, and
wherein light emission from the light-emitting layer comprises light emission from the guest material and light emission from the exciplex.

12. The light-emitting element according to claim 11, wherein an intensity ratio of the light emission from the exciplex to the light emission from the guest material ranges from 1:9 to 9:1.

13. The light-emitting element according to claim 11, wherein the light emission from the exciplex has a higher intensity than the light emission from the guest material.

14. The light-emitting element according to claim 11, wherein the guest material comprises iridium.

15. The light-emitting element according to claim 11,
wherein the guest material comprises a ligand coordinated to iridium, and
wherein the ligand comprises a nitrogen-containing five-membered heterocyclic skeleton.

16. The light-emitting element according to claim 11, wherein the host material comprises a π-electron deficient heteroaromatic skeleton.

17. The light-emitting element according to claim 11,
wherein the light-emitting layer further comprises an organic compound, and
wherein a HOMO level of the organic compound is higher than or equal to the HOMO level of the host material.

18. The light-emitting element according to claim 11,
wherein the light-emitting layer further comprises an organic compound,
wherein a HOMO level of the organic compound is higher than or equal to the HOMO level of the host material, and
wherein the organic compound is configured to transport a hole.

19. The light-emitting element according to claim 11,
wherein the light-emitting layer further comprises an organic compound, and
wherein the organic compound comprises at least one of a π-electron rich heteroaromatic skeleton and an aromatic amine skeleton.

20. The light-emitting element according to claim 11, wherein a weight ratio of the guest material to the host material is greater than or equal to 0.01 and less than or equal to 0.5.

* * * * *